(12) United States Patent
Tran et al.

(10) Patent No.: US 12,237,011 B2
(45) Date of Patent: Feb. 25, 2025

(54) READ AND PROGRAMMING DECODING SYSTEM FOR ANALOG NEURAL MEMORY

(71) Applicant: Silicon Storage Technology, Inc., San Jose, CA (US)

(72) Inventors: Hieu Van Tran, San Jose, CA (US); Thuan Vu, San Jose, CA (US); Stanley Hong, San Jose, CA (US); Stephen Trinh, San Jose, CA (US); Anh Ly, San Jose, CA (US); Han Tran, Ho Chi Minh (VN); Kha Nguyen, Ho Chi Minh (VN); Hien Pham, Ho Chi Minh (VN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/853,315

(22) Filed: Jun. 29, 2022

(65) Prior Publication Data
US 2023/0018166 A1  Jan. 19, 2023

Related U.S. Application Data

(62) Division of application No. 16/503,355, filed on Jul. 3, 2019, now Pat. No. 11,423,979.
(Continued)

(51) Int. Cl.
*G11C 11/56* (2006.01)
*G06F 17/16* (2006.01)
(Continued)

(52) U.S. Cl.
CPC .......... *G11C 11/5642* (2013.01); *G06F 17/16* (2013.01); *G06N 3/06* (2013.01);
(Continued)

(58) Field of Classification Search
CPC .. G11C 11/5642; G11C 11/1657; G06F 17/16
(Continued)

(56) References Cited

U.S. PATENT DOCUMENTS 4,810,910 A   3/1989  Schoellikopf et al.
4,904,881 A   2/1990  Castro
(Continued)

FOREIGN PATENT DOCUMENTS

CN   102567784   7/2012
CN   102906767   1/2013
(Continued)

OTHER PUBLICATIONS

Japanese Office Action mailed on Nov. 15, 2022 corresponding to the related Japanese Patent Application No. 2021-564319.
(Continued)

*Primary Examiner* — Anthan Tran
(74) *Attorney, Agent, or Firm* — DLA PIPER LLP US

(57) ABSTRACT

Various examples of decoders and physical layout designs for non-volatile flash memory arrays in an analog neural system are disclosed. In one example, a system comprises a plurality of vector-by-matrix multiplication arrays in an analog neural memory system, each vector-by-matrix multiplication array comprising an array of non-volatile memory cells organized into rows and columns, wherein each memory cell comprises a word line terminal; a plurality of read row decoders, each read row decoder coupled to one of the plurality of vector-by-matrix multiplication arrays for applying a voltage to one or more selected rows during a read operation; and a shared program row decoder coupled to all of the plurality of vector-by-matrix multiplication arrays for applying a voltage to one or more selected rows in one or more of the vector-by-matrix multiplication arrays during a program operation.

6 Claims, 45 Drawing Sheets

Related U.S. Application Data

(60) Provisional application No. 62/840,318, filed on Apr. 29, 2019.

(51) Int. Cl.
  *G06N 3/06* (2006.01)
  *G11C 11/16* (2006.01)
  *G11C 11/4074* (2006.01)

(52) U.S. Cl.
  CPC ...... *G11C 11/1655* (2013.01); *G11C 11/1657* (2013.01); *G11C 11/4074* (2013.01)

(58) Field of Classification Search
  USPC .................................................. 365/185.03
  See application file for complete search history.

(56) References Cited

U.S. PATENT DOCUMENTS

| | | |
|---|---|---|
| 4,950,917 A | 8/1990 | Holler |
| 4,961,002 A | 10/1990 | Tam et al. |
| 5,028,810 A | 7/1991 | Castro |
| 5,029,130 A | 7/1991 | Yeh |
| 5,055,897 A | 10/1991 | Canepa |
| 5,097,441 A | 3/1992 | Soo-In et al. |
| 5,138,576 A | 8/1992 | Madurawe |
| 5,146,602 A | 9/1992 | Holler |
| 5,150,450 A | 9/1992 | Swenson |
| 5,242,848 A | 9/1993 | Yeh |
| 5,256,911 A | 10/1993 | Holler |
| 5,264,734 A | 11/1993 | Holler |
| 5,298,796 A | 3/1994 | Tawel |
| 5,336,936 A | 8/1994 | Allen et al. |
| 5,386,132 A | 1/1995 | Wong |
| 5,469,397 A | 11/1995 | Hoshino |
| 5,509,106 A | 4/1996 | Pechanek |
| 5,554,874 A | 9/1996 | Doluca |
| 5,621,336 A | 4/1997 | Shibata et al. |
| 5,643,814 A | 7/1997 | Chung |
| 5,721,702 A | 2/1998 | Briner |
| 5,748,534 A | 5/1998 | Dunlap |
| 5,914,894 A | 6/1999 | Diorio |
| 5,966,332 A | 10/1999 | Takano |
| 5,990,512 A | 11/1999 | Diorio |
| 6,222,777 B1 | 4/2001 | Khieu |
| 6,232,180 B1 | 5/2001 | Chen |
| 6,282,119 B1 | 8/2001 | Tsen |
| 6,389,404 B1 | 5/2002 | Carson |
| 6,683,645 B1 | 1/2004 | Collins et al. |
| 6,747,310 B2 | 6/2004 | Fan |
| 6,829,598 B2 | 12/2004 | Milev |
| 7,315,056 B2 | 1/2008 | Klinger et al. |
| 7,868,375 B2 | 1/2011 | Liu et al. |
| 10,217,512 B1 | 2/2019 | Leobandung |
| 10,388,389 B2 | 8/2019 | Guo |
| 10,720,217 B1 | 7/2020 | Tran |
| 10,741,611 B1 | 8/2020 | Leobandung |
| 10,803,943 B2 | 10/2020 | Tran |
| 11,023,559 B2 | 6/2021 | McCollum |
| 11,061,646 B2 * | 7/2021 | Sumbul .................. G11C 8/08 |
| 11,087,207 B2 | 8/2021 | Tran |
| 11,270,763 B2 | 3/2022 | Tran |
| 11,270,771 B2 | 3/2022 | Tran |
| 2002/0089014 A1 | 7/2002 | Chern |
| 2003/0034510 A1 | 2/2003 | Liu |
| 2003/0052360 A1 | 3/2003 | Guterman |
| 2003/0183871 A1 | 10/2003 | Dugger et al. |
| 2004/0095809 A1 | 5/2004 | Sakamoto |
| 2004/0125655 A1 | 7/2004 | Tsai |
| 2004/0150032 A1 | 8/2004 | Wu |
| 2004/0155234 A1 | 8/2004 | Ishimaru |
| 2004/0156241 A1 | 8/2004 | Mokhlesi |
| 2004/0251949 A1 | 12/2004 | Shi |
| 2005/0087892 A1 | 4/2005 | Hsu |
| 2005/0122238 A1 | 6/2005 | Nomura |
| 2006/0104120 A1 | 5/2006 | Hemink |
| 2006/0170038 A1 | 8/2006 | Wong |
| 2007/0171756 A1 | 7/2007 | Lambrache |
| 2008/0304345 A1 | 12/2008 | Kwean |
| 2009/0103361 A1 | 4/2009 | Wang |
| 2009/0109760 A1 | 4/2009 | Nazarian |
| 2009/0154246 A1 | 6/2009 | Liu |
| 2009/0192958 A1 | 7/2009 | Todorokihara |
| 2010/0046299 A1 | 2/2010 | Roohparvar |
| 2010/0290292 A1 | 11/2010 | Tanizaki |
| 2011/0161625 A1 | 6/2011 | Pechanek |
| 2011/0235419 A1 | 9/2011 | Ishimaru |
| 2012/0068872 A1 | 3/2012 | Baker |
| 2012/0087188 A1 | 4/2012 | Hsieh |
| 2012/0136913 A1 | 5/2012 | Duong |
| 2013/0044544 A1 | 2/2013 | Shiino |
| 2013/0100756 A1 | 4/2013 | Liao |
| 2014/0054667 A1 | 2/2014 | Tkachev |
| 2014/0104965 A1 * | 4/2014 | Tran .................. G11C 16/10 365/189.011 |
| 2014/0140132 A1 | 5/2014 | Gu |
| 2014/0269062 A1 | 9/2014 | Do |
| 2014/0310220 A1 | 10/2014 | Chang |
| 2015/0106315 A1 | 4/2015 | Birdwell |
| 2015/0138183 A1 | 5/2015 | Kishi |
| 2015/0178619 A1 | 6/2015 | Nishitani |
| 2015/0199963 A1 | 7/2015 | Maaninen |
| 2015/0213898 A1 | 7/2015 | Do |
| 2015/0262055 A1 | 9/2015 | Akopyan |
| 2015/0324691 A1 | 11/2015 | Dropps |
| 2016/0042790 A1 | 2/2016 | Tran |
| 2016/0048755 A1 | 2/2016 | Freyman |
| 2016/0133639 A1 | 5/2016 | Tran |
| 2016/0180945 A1 | 6/2016 | Ng |
| 2016/0254269 A1 | 9/2016 | Kim et al. |
| 2017/0330070 A1 | 11/2017 | Sengupta |
| 2017/0337466 A1 * | 11/2017 | Bayat .................. G06F 3/0688 |
| 2017/0337971 A1 | 11/2017 | Tran et al. |
| 2017/0337980 A1 | 11/2017 | Guo et al. |
| 2018/0004708 A1 | 1/2018 | Muralimanohar |
| 2018/0095930 A1 | 4/2018 | Lu |
| 2018/0165573 A1 | 6/2018 | Hsu |
| 2018/0174034 A1 | 6/2018 | Obradovic |
| 2018/0268912 A1 | 9/2018 | Guo et al. |
| 2018/0293487 A1 | 10/2018 | Copel et al. |
| 2019/0019538 A1 | 1/2019 | Li |
| 2019/0019564 A1 | 1/2019 | Li |
| 2019/0042199 A1 | 2/2019 | Sumbul |
| 2019/0088325 A1 | 3/2019 | Tiwari et al. |
| 2019/0088329 A1 | 3/2019 | Tiwari |
| 2019/0095779 A1 | 3/2019 | Leobandung |
| 2019/0164617 A1 | 5/2019 | Tran |
| 2019/0205729 A1 | 7/2019 | Tran |
| 2019/0213234 A1 | 7/2019 | Bayat |
| 2019/0237136 A1 | 8/2019 | Tran et al. |
| 2019/0237470 A1 * | 8/2019 | Mine .................. H10B 51/30 |
| 2019/0278675 A1 | 9/2019 | Bolkhovitin |
| 2019/0294416 A1 | 9/2019 | Hu |
| 2020/0020393 A1 | 1/2020 | Al-Shamma |
| 2020/0151543 A1 | 5/2020 | Bayat |
| 2020/0201751 A1 | 6/2020 | Wei |
| 2020/0233482 A1 | 7/2020 | Tran |
| 2020/0234111 A1 | 7/2020 | Tran |
| 2021/0232893 A1 | 7/2021 | Bayat |

FOREIGN PATENT DOCUMENTS

| | | |
|---|---|---|
| CN | 104615909 | 5/2015 |
| EP | 0566739 A1 | 10/1993 |
| EP | 0562737 B1 | 6/1998 |
| JP | 63-261784 | 10/1988 |
| JP | H03-018985 | 1/1991 |
| JP | 2003-151290 | 5/2003 |
| JP | 2018 520454 A | 7/2018 |
| KR | 2007 0110835 | 11/2007 |
| KR | 2018 0014076 | 2/2018 |
| KR | 20180061333 A | 6/2018 |
| TW | 200414549 | 8/2004 |
| TW | I 625843 | 6/2018 |

(56) References Cited

FOREIGN PATENT DOCUMENTS

| TW | 201837759 | 10/2018 |
|---|---|---|
| TW | 201901285 | 1/2019 |
| WO | 2017 131653 | 8/2017 |

OTHER PUBLICATIONS

European Examiner's Report dated Nov. 25, 2021 for the related European Patent Application No. 17 799 921.6.
Chinese Office Action dated Oct. 9, 2021 corresponding to Chinese Patent Application No. 201780030390.9.
Bayat, "Memory Technologies for Neural Networks," IEEE, 2015.
Guo, et al., "Temperature-insensitive Analog Vector-by-Matrix Multiplier Based on 55 nm NOR Flash Memory Cells," IEEE Custom Integrated Circuits Conference, Apr. 30, 2017, pp. 1-14.
Lin, et al., "A Novel Voltage-Accumulation Vector-Matrix Multiplication Architecture Using Resistor-shunted Floating Gate Flash Memory Device for Low-power and High-density Neural Network Applications," IEEE International Electron Devices Meeting, Dec. 1, 2018, pp. 2.4.1-2.4.4.
Bavandpour, et al., "Energy-Efficient Time-Domain Vector-by-Matrix Multiplier for Neurocomputing and Beyond," retrieved from the Internet: url:https://arxiv.org/pdf/1711.10673.pdf, pp. 1-6.
Mehrotra, "Elements of Artificial Neural Networks," MIT Press, 1997.
U.S. Appl. No. 62/797,158, titled "Apparatus and Method for Combining Analog Neural Net With FPGA Routing in a Monolithic Integrated Circuit," filed Jan. 25, 2019.
Jenn-Chyou Bor, et al., "Realization of the CMOS Pulsewidth-Modulation (PWM) Neural Network with On-Chip Learning," IEEE Transactions on Circuits and Systems, Jan. 1998.
Alister Hamilton, et al., "Integrated Pulse Stream Neural Networks: Results, Issues, and Pointers," IEEE Transactions on Neural Networks, May 1992.
Shafiee et al, "Isaac: A Convolutional Neural Network Accelerator With In-Situ Analog Arithmetic in Crossbars;" 2016 ACM/IEEE 43rd Annual International Symposium on Computer Architecture, Seoul, Oct. 2016. [URL:https://www.cs.utah.edu/-rajeev/pubs/isca16.pdf; pp. 1-4.].
S. Korean Office Action mailed on Mar. 22, 2023 corresponding to the related S. Korean Patent Application No. 10-2021-7035375.
Notice of Reasons for Rejection mailed on Nov. 14, 2023 corresponding to the related Japanese Patent Application No. 2021-564319.
Japanese Notice of Refusal mailed on Jun. 19, 2024 corresponding to the related Japanese Patent Application No. 2023-111962. (Copy of the Google English Machine Translations and original copy of the Japanese Office Action.).
S. Korean Notice of Allowance issued on Feb. 7, 2024 corresponding to the related S. Korean Patent Application No. 10-2021-7035375.
Japanese Decision of Refusal mailed on Oct. 15, 2024 corresponding to the related Japanese Patent Application No. 2023-111962.

\* cited by examiner

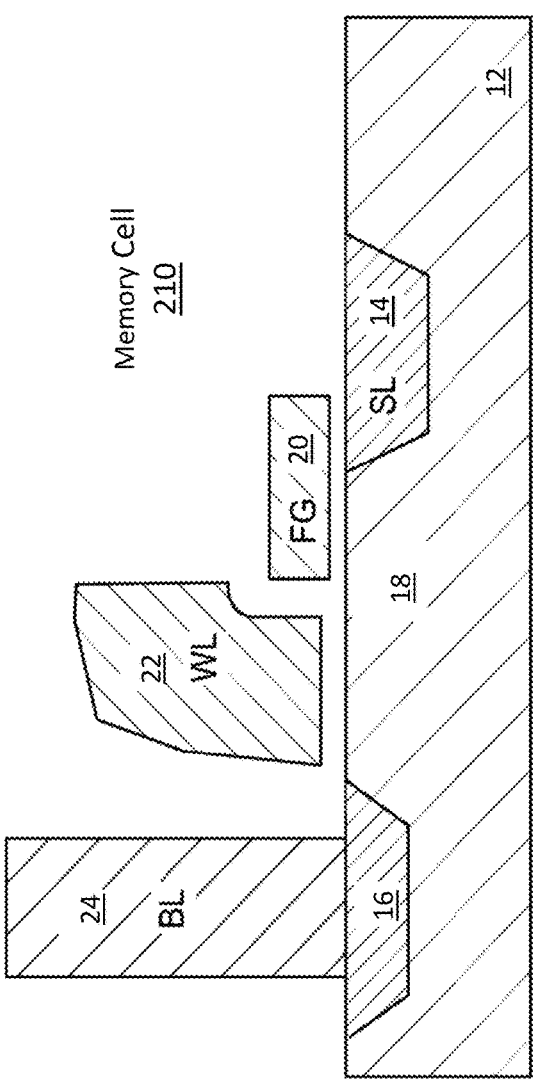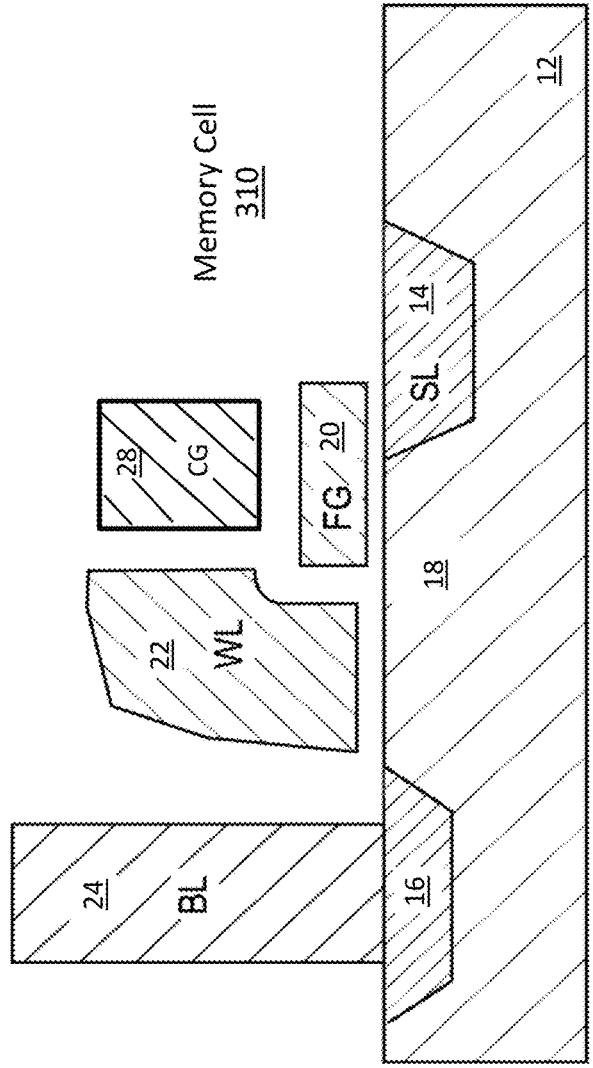
FIGURE 2
(PRIOR ART)
FIGURE 3
(PRIOR ART)

2800

3100 vertical WLs

READ AND PROGRAMMING DECODING SYSTEM FOR ANALOG NEURAL MEMORY

PRIORITY CLAIM

This application is a divisional of U.S. patent application Ser. No. 16/503,355, filed on Jul. 3, 2019, and titled, "Decoding System and Physical Layout for Analog Neural Memory in Deep Learning Artificial Neural Network," which claims priority to U.S. Provisional Patent Application No. 62/840,318, filed on Apr. 29, 2019, and titled, "Decoding System and Physical Layout for Analog Neural Memory in Deep Learning Artificial Neural Network," which are incorporated by reference herein.

FIELD OF THE INVENTION

Improved decoding systems are disclosed for analog neural memory systems that utilize non-volatile memory cells.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses required.

Applicant previously disclosed an artificial (analog) neural network that utilizes one or more non-volatile memory arrays as the synapses in U.S. patent application Ser. No. 15/594,439, published as US Patent Publication No. 2017/0337466, which is incorporated by reference. The non-volatile memory arrays operate as an analog neural memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neural memory system must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

One challenge in vector by matrix multiplication (VMM) systems is the ability to select a specific cell or groups of cells, or in some cases an entire array of cells, for erase, programming, and read operations. A related challenge is to improve, the use of physical space within a semiconductor die without losing functionality.

What is needed are improved decoding systems and physical layouts for analog neural memory systems that utilize non-volatile memory cells.

SUMMARY OF THE INVENTION

Improved decoding systems and physical layouts are disclosed for analog neural memory systems that utilize non-volatile memory cells.

BRIEF DESCRIPTION OF THE DRAWINGS

FIG. 2 depicts a prior art split gate flash memory cell

FIG. 3 depicts another prior art split gate flash memory cell

DETAILED DESCRIPTION OF THE INVENTION

Figure 1:
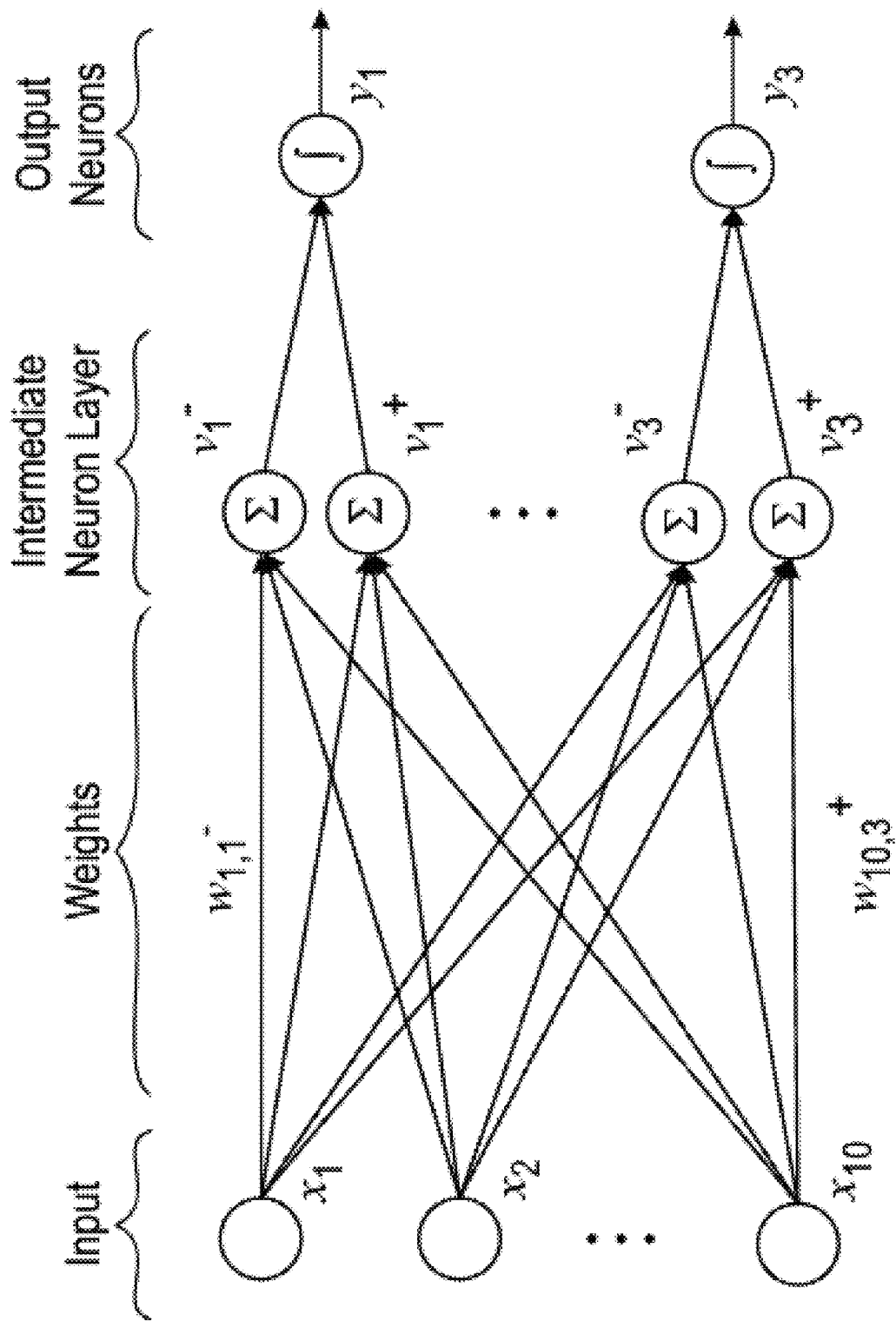
FIG. 1 is a diagram that illustrates a prior art artificial neural network.

The artificial neural networks of the present invention utilize a combination of CMOS technology and non-volatile memory arrays.

Non-Volatile Memory Cells

Digital non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 (source line terminal) towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

Operation of Flash Memory Cell 210 of FIG. 2

|        | WL       | BL      | SL       |
|--------|----------|---------|----------|
| Read 1 | 0.5-3 V  | 0.1-2 V | 0 V      |
| Read 2 | 0.5-3 V  | 0-2 V   | 2-0.1 V  |
| Erase  | ~11-13 V | 0 V     | 0 V      |
| Program| 1-2 V    | 1-3 μA  | 9-10 V   |

"Read 1" is a read mode in which the cell current is output on the bit line. "Read 2" is a read mode in which the cell current is output on the source line terminal.

FIG. 3 shows memory cell 310, which is similar to memory cell 210 of FIG. 2 with the addition of control gate (CG) terminal 28. Control gate terminal 28 is biased at a high voltage, e.g., 10V, in programming, low or negative in erase, e.g., 0 v/−8V, low or mid range in read, e.g., 0 v/2.5V. Other terminals are biased similarly to that of FIG. 2.

Figure 4:
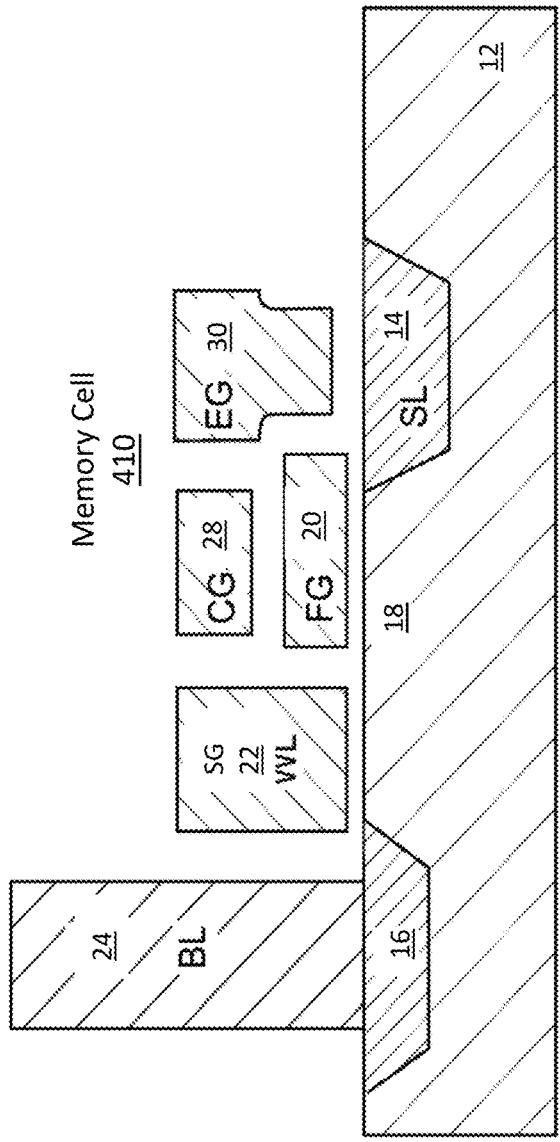
FIG. 4 depicts another prior art split gate flash memory cell.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 310 for performing read, erase, and program operations:

TABLE NO. 2

Operation of Flash Memory Cell 410 of FIG. 4

|         | WL/SG     | BL      | CG       | EG       | SL       |
|---------|-----------|---------|----------|----------|----------|
| Read 1  | 0.5-2 V   | 0.1-2 V | 0-2.6 V  | 0-2.6 V  | 0 V      |
| Read 2  | 0.5-2 V   | 0-2 V   | 0-2.6 V  | 0-2.6 V  | 2-0.1 V  |
| Erase   | −0.5 V/0 V| 0 V     | 0 V/−8 V | 8-12 V   | 0 V      |
| Program | IV        | IgA     | 8-11 V   | 4.5-9 V  | 4.5-5 V  |

"Read 1" is a read mode in which the cell current is output on the bit line. "Read 2" is a read mode in which the cell current is output on the source line terminal.

Figure 5:
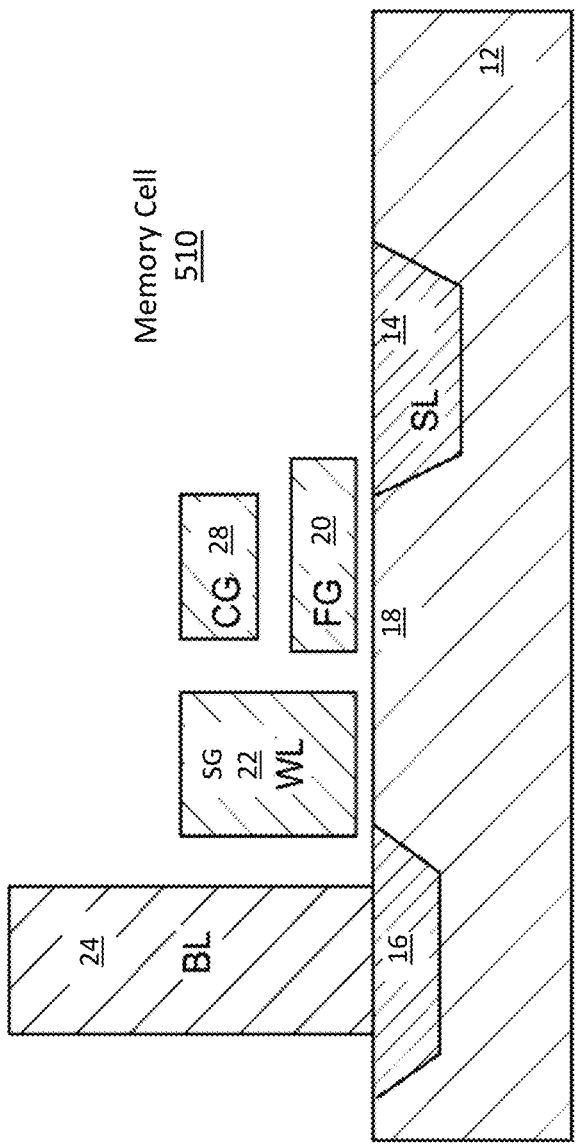
FIG. 5 depicts another prior art split gate flash memory cell

FIG. 5 shows memory cell 510, which is similar to memory cell 410 of FIG. 4 except that memory cell 510 does not contain an erase gate EG terminal. An erase is performed by biasing the substrate 18 to a high voltage and biasing the control gate CG terminal 28 to a low or negative voltage. Alternatively, an erase is performed by biasing word line terminal 22 to a positive voltage and biasing control gate terminal 28 to a negative voltage. Programming and reading is similar to that of FIG. 4.

Figure 6:
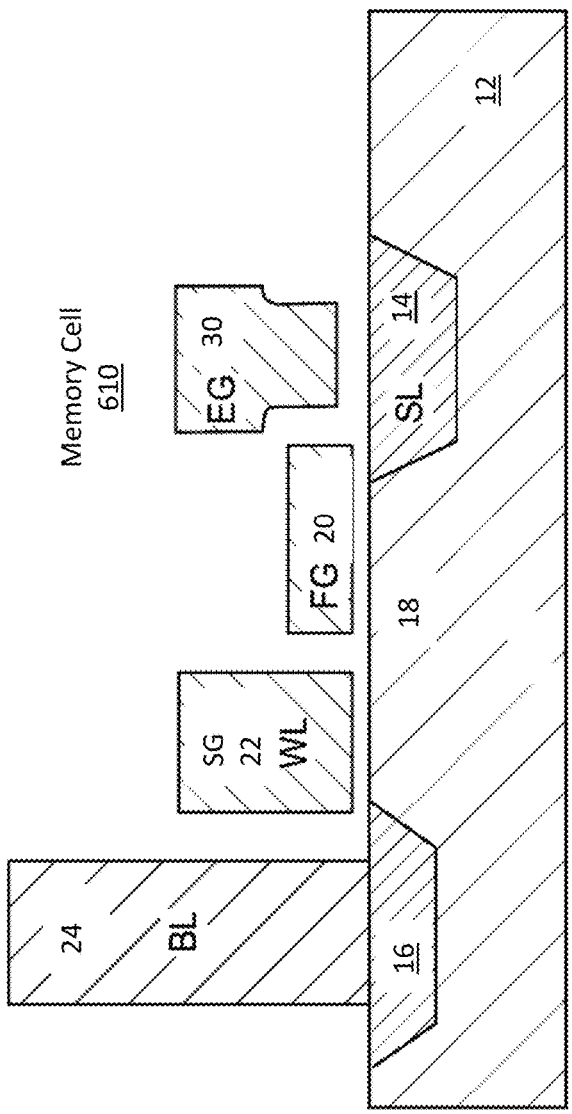
FIG. 6 depicts another prior art split gate flash memory cell.

FIG. 6 depicts a three-gate memory cell 610, which is another type of flash memory cell. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation also is done without the control gate bias, and as a result, a higher voltage must be applied on the source line terminal during a program operation to compensate for a lack of control gate bias.

Table No. 3 depicts typical voltage ranges that can be applied to the terminals of memory cell 610 for performing read, erase, and program operations:

TABLE NO. 3

Operation of Flash Memory Cell 610 of FIG. 6

|         | WL/SG     | BL      | EG       | SL       |
|---------|-----------|---------|----------|----------|
| Read 1  | 0.5-2.2 V | 0.1-2 V | 0-2.6 V  | 0 V      |
| Read 2  | 0.5-2.2 V | 0-2 V   | 0-2.6 V  | 2-0.1 V  |
| Erase   | −0.5 V/0 V| 0 V     | 11.5 V   | 0 V      |
| Program | IV        | 2-3 μA  | 4.5 V    | 7-9 V    |

"Read 1" is a read mode in which the cell current is output on the bit line. "Read 2" is a read mode in which the cell current is output on the source line terminal.

Figure 7:
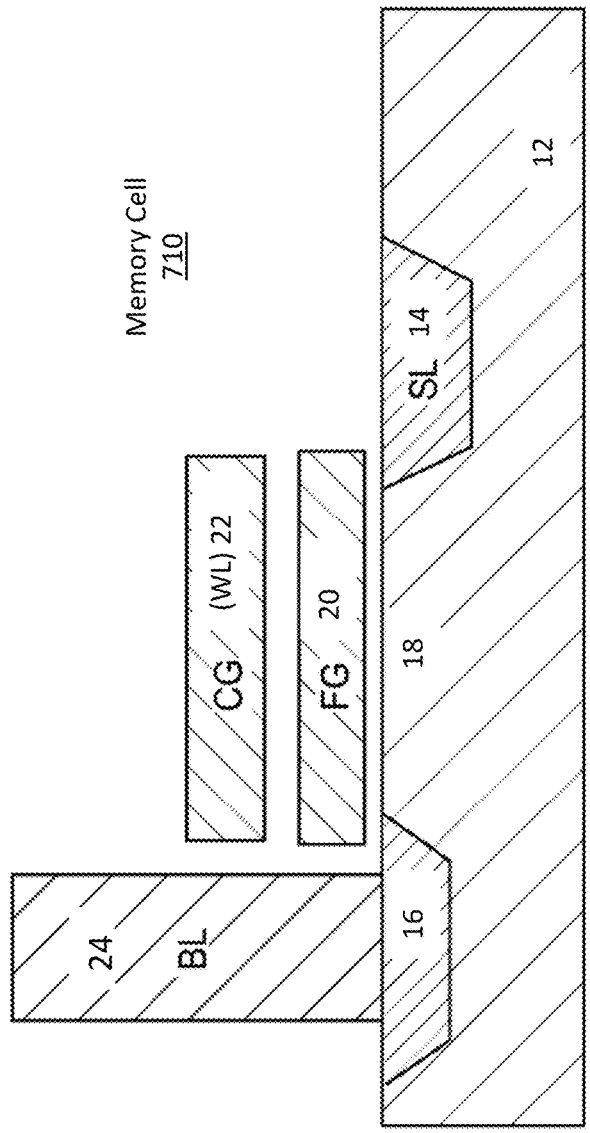
FIG. 7 depicts a prior art stacked gate flash memory cell.

FIG. 7 depicts stacked gate memory cell 710, which is another type of flash memory cell. Memory cell 710 is similar to memory cell 210 of FIG. 2, except that floating gate 20 extends over the entire channel region 18, and control gate terminal 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

Operation of Flash Memory Cell 710 of FIG. 7

|         | CG          | BL        | SL        | Substrate    |
|---------|-------------|-----------|-----------|--------------|
| Read 1  | 0-5 V       | 0.1-2 V   | 0-2 V     | 0 V          |
| Read 2  | 0.5-2 V     | 0-2 V     | 2-0.1 V   | 0 V          |
| Erase   | −8 to −10 V/0 V | FLT   | FLT       | 8-10 V/15-20 V |
| Program | 8-12 V      | 3-5 V/0 V | 0 V/3-5 V | 0 V          |

"Read 1" is a read mode in which the cell current is output on the bit line. "Read 2" is a read mode in which the cell current is output on the source line terminal. Optionally, in arrays comprising rows and columns of memory cells 210, 310, 410, 510, 610, or 710, source lines can be coupled to one row of memory cells or to two adjacent rows of memory cells. That is, source line terminals can be shared by adjacent rows of memory cells.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and volatile synapse cell, without limitation.

Neural Networks Employing Non-Volatile Memory Cell Arrays

Figure 8:
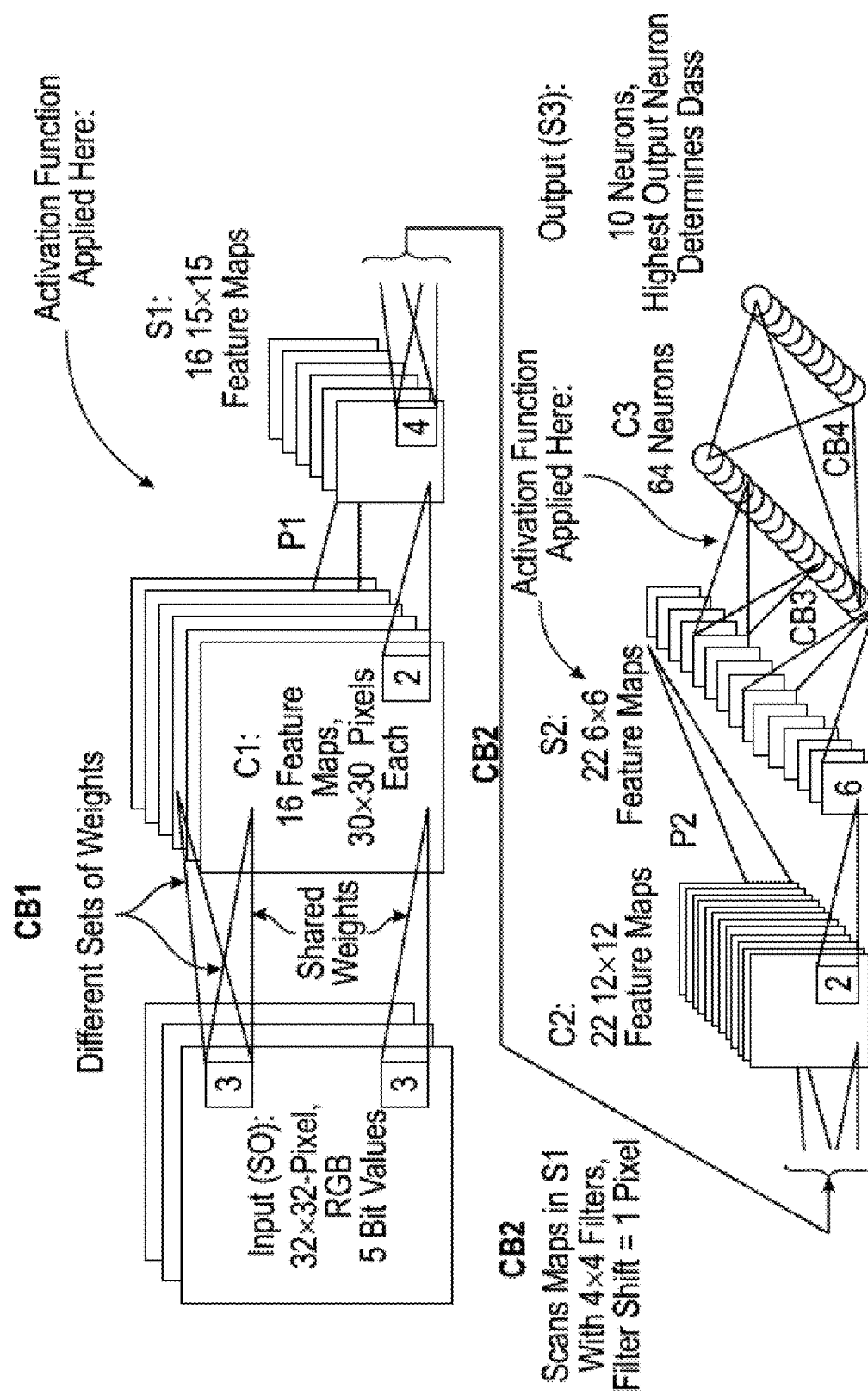
FIG. 8 is a diagram illustrating the different levels of an exemplary artificial neural network utilizing one or more non-volatile memory arrays.

FIG. 8 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 9:
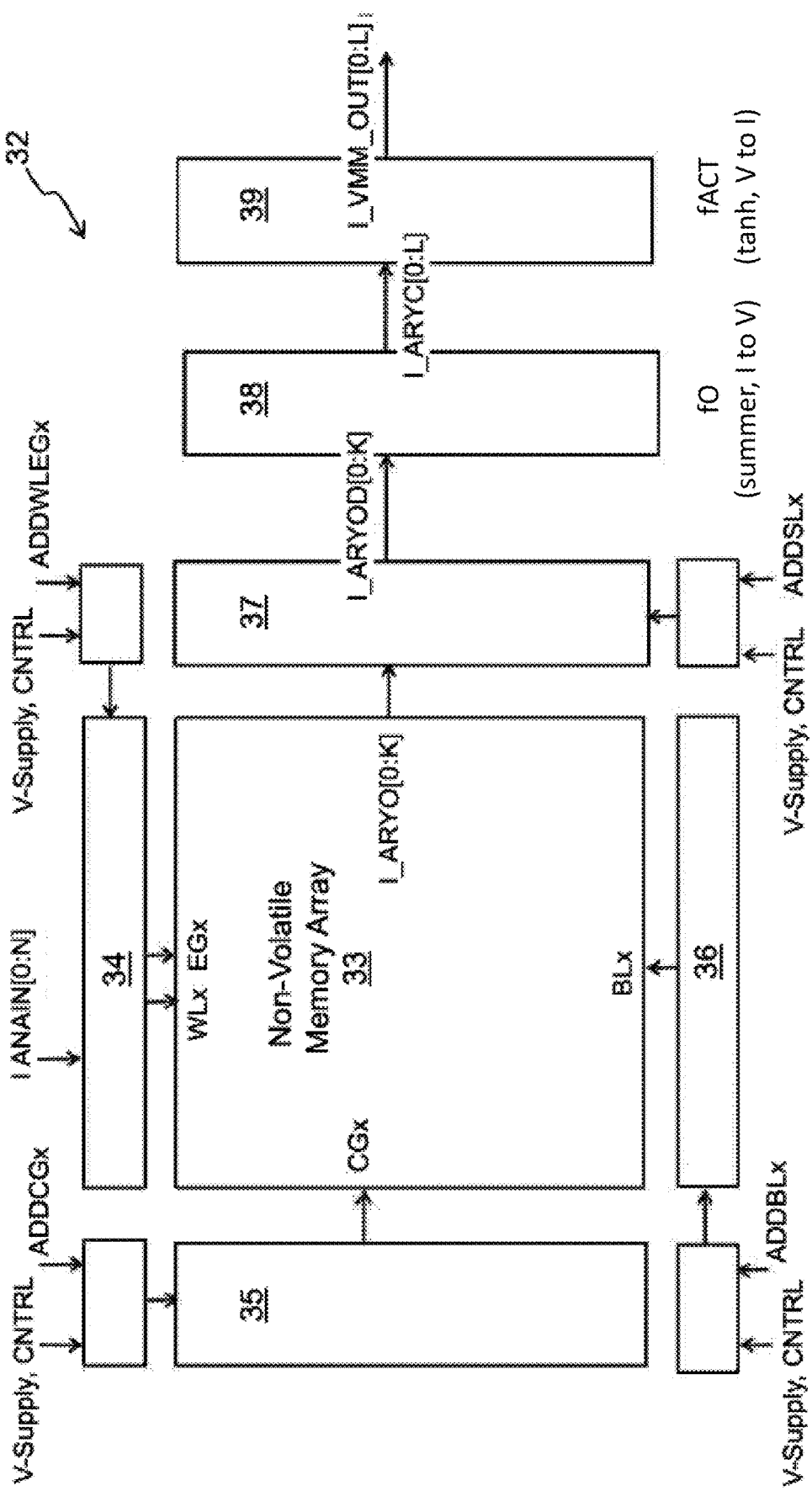
FIG. 9 is a block diagram illustrating a vector-by-matrix multiplication system.

FIG. 9 is a block diagram of a system that can be used for that purpose. Vector-by-matrix multiplication (VMM) system 32 includes non-volatile memory cells and is utilized as the synapses (such as CB1, CB2, CB3, and CB4 in FIG. 6) between one layer and the next layer. Specifically, VMM system 32 includes VMM array 33 comprising non-volatile memory cells arranged in rows and columns, erase gate and word line gate decoder 34, control gate decoder 35, bit line decoder 36 and source line decoder 37, which decode the respective inputs for the non-volatile memory cell array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

VMM array 33 serves two purposes. First, it stores the weights that will be used by the VMM system 32. Second, VMM array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation.

The output of VMM array 33 is supplied to a differential summer (such as a summing op-amp or a summing current mirror) 38, which sums up the outputs of VMM array 33 to create a single value for that convolution. The differential summer 38 is arranged to perform summation of both positive weight and negative weight inputs to output the single value.

The summed up output values of differential summer 38 are then supplied to an activation function circuit 39, which rectifies the output. The activation function circuit 39 may provide sigmoid, tan h, ReLU functions, or any other non-linear function. The rectified output values of activation function circuit 39 become an element of a feature map of the next layer (e.g. C1 in FIG. 8), and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 9 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level, binary level, digital pulses, or digital bits (in which case an output ADC is provided to convert output analog level into digital bits).

Figure 10:
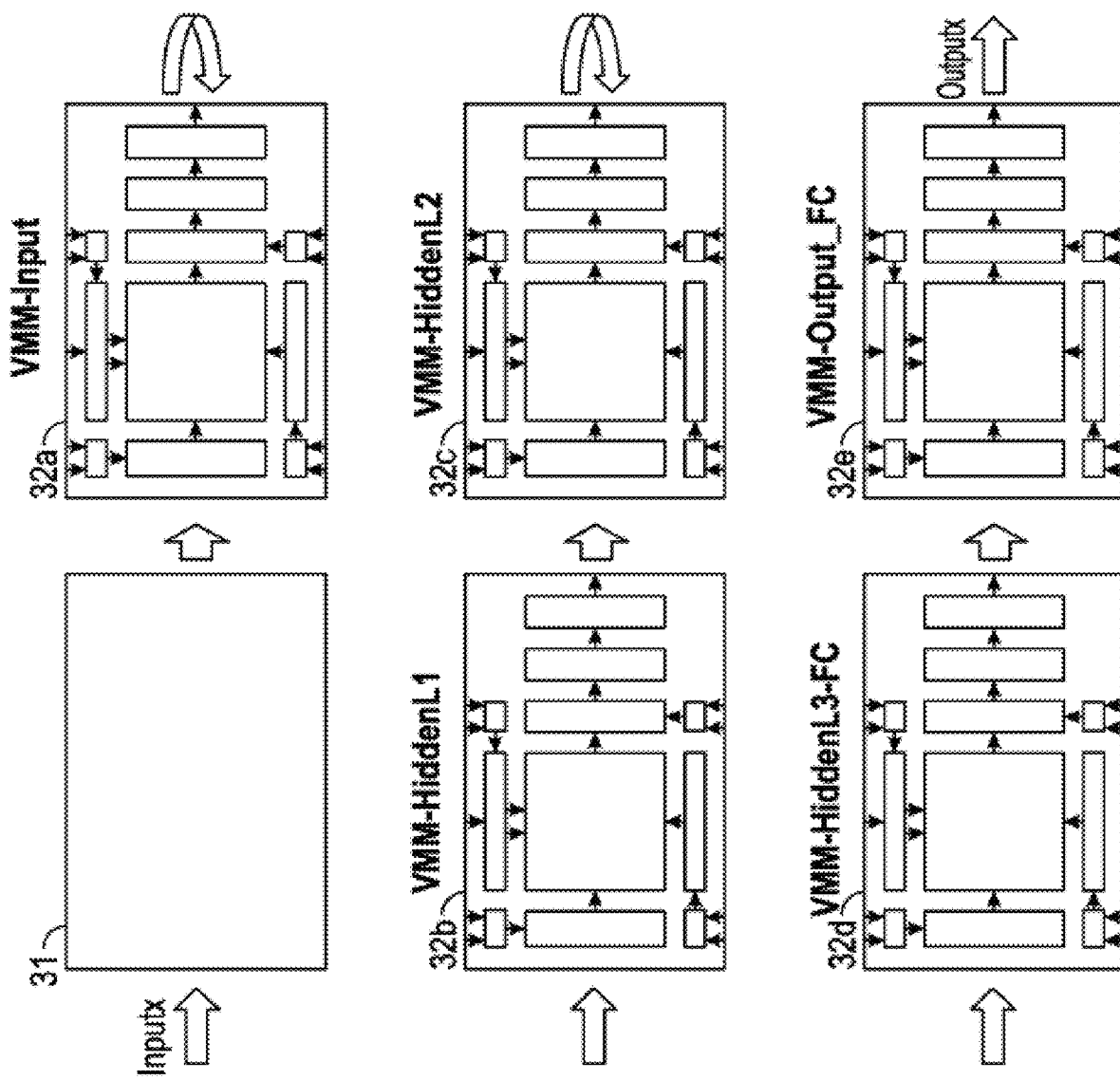
FIG. 10 is a block diagram illustrates an exemplary artificial neural network utilizing one or more a vector-by-matrix multiplication systems.

FIG. 10 is a block diagram depicting the usage of numerous layers of VMM systems 32, here labeled as VMM systems 32a, 32b, 32c, 32d, and 32e. As shown in FIG. 10, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical non-volatile memory array, or multiple VMM systems could utilize different portions of the same physical non-volatile memory array, or multiple VMM systems could utilize overlapping portions of the same physical non-volatile memory system. Each VMM system 32a, 32b, 32c, 32d, and 32e can also be time multiplexed for various portion of its array or neurons. The example shown in FIG. 10 contains five layers (32a, 32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

VMM Arrays

Figure 11:
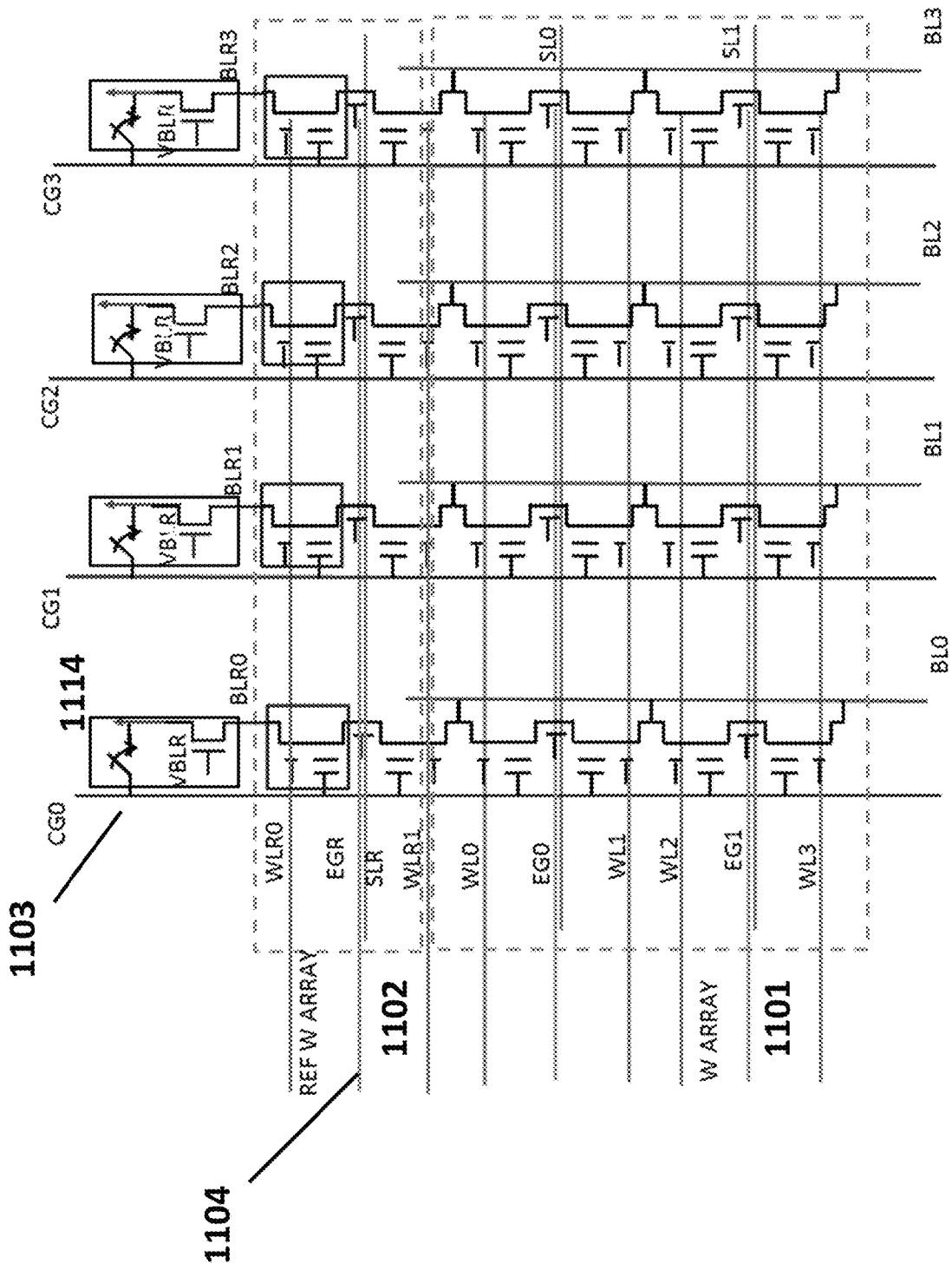
FIG. 11 depicts another embodiment of a vector-by-matrix multiplication system.

FIG. 11 depicts neuron VMM array 1100, which is particularly suited for memory cells 310 as shown in FIG. 3, and is utilized as the synapses and parts of neurons between an input layer and the next layer. VMM array 1100 comprises memory array 1101 of non-volatile memory cells and reference array 1102 (at the top of the array) of non-volatile reference memory cells. Alternatively, another reference array can be placed at the bottom.

In VMM array 1100, control gate lines, such as control gate line 1103, run in a vertical direction (hence reference array 1102 in the row direction is orthogonal to control gate line 1103), and erase gate lines, such as erase gate line 1104, run in a horizontal direction. Here, the inputs to VMM array 1100 are provided on the control gate lines (CG0, CG1, CG2, CG3), and the output of VMM array 1100 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1100, i.e. the flash memory of VMM array 1100, are preferably configured to operate in a sub-threshold region.

The non-volatile reference memory cells and the non-volatile memory cells described herein are biased in weak inversion:

$$Ids = Io * e^{(Vg-Vth)/nVt} = w * Io * e^{(Vg)/nVt},$$

where $w = e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current Ids, into an input voltage, Vg:

$$Vg = n*Vt*\log[Ids/wp*Io]$$

Here, wp is w of a reference or peripheral memory cell.

For a memory array used as a vector matrix multiplier VMM array, the output current is:

$$Iout = wa*Io*e^{(Vg)/nVt}, \text{namely}$$

$$Iout = (wa/wp)*Iin = W*Iin$$

$$W = e^{(Vthp-Vtha)/nVt}$$

$$Iin = wp*Io*e^{(Vg)/nVt}$$

Here, wa=w of each memory cell in the memory array.

A wordline or control gate can be used as the input for the memory cell for the input voltage.

Alternatively, the non-volatile memory cells of VMM arrays described herein can be configured to operate in the linear region:

$$Ids = \text{beta}*(Vgs-Vth)*Vds; \text{beta} = u*Cox*Wt/L,$$

$$W\alpha(Vgs-Vth),$$

meaning weight W in linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the flash memory cells of VMM arrays described herein can be configured to operate in the saturation region:

$$Ids=\tfrac{1}{2}*beta*(Vgs-Vth)^2; beta=u*Cox*Wt/L$$

$W\alpha(Vgs-Vth)^2$, meaning weight $W$ is proportional to $(Vgs-Vth)^2$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation).

Other embodiments for VMM array 32 of FIG. 9 are described in U.S. patent application Ser. No. 15/826,345, which is incorporated by reference herein. As described in that application, a sourceline or a bitline can be used as the neuron output (current summation output).

Figure 12:
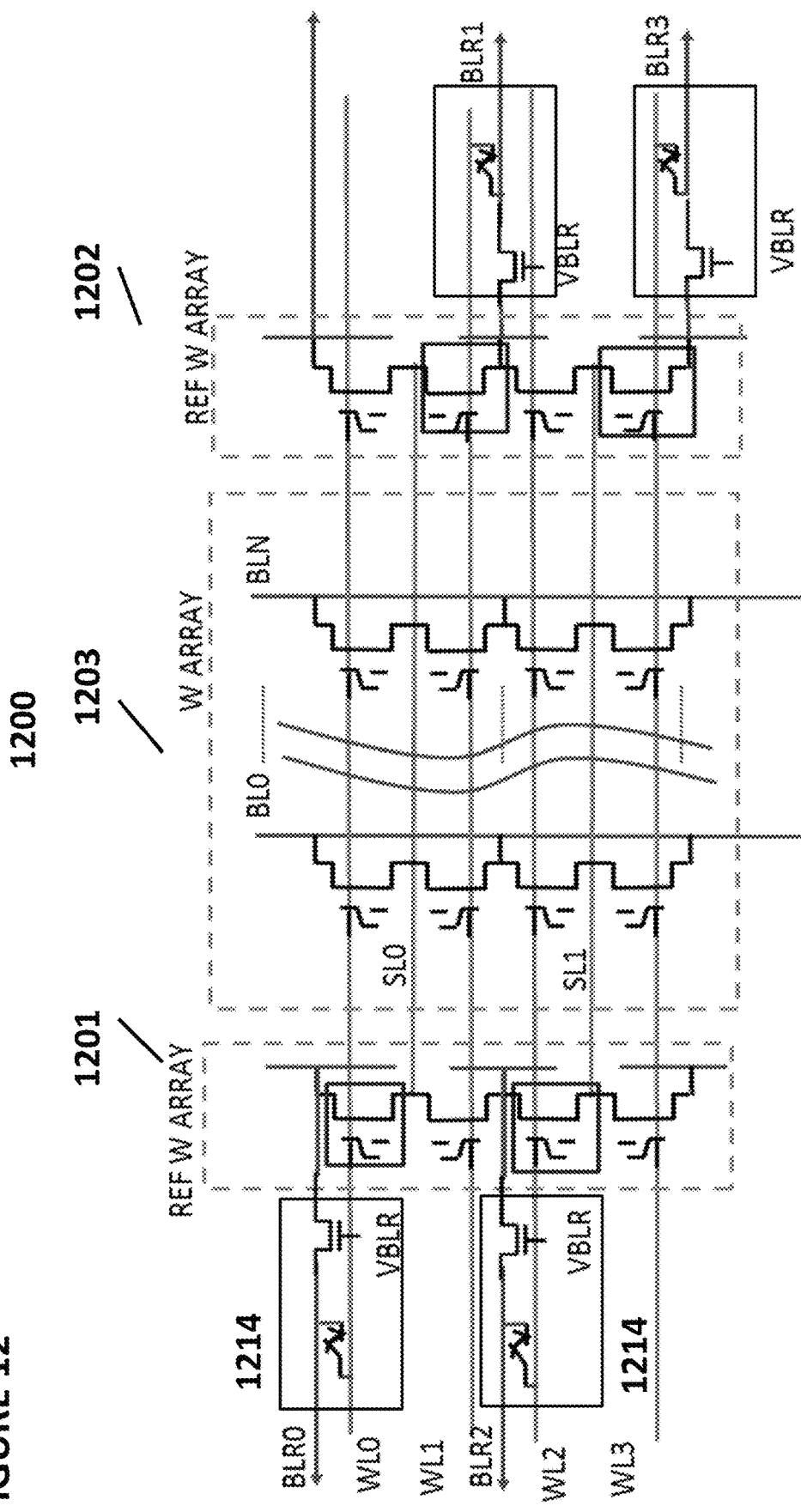
FIG. 12 depicts another embodiment of a vector-by-matrix multiplication system.

FIG. 12 depicts neuron VMM array 1200, which is particularly suited for memory cells 210 as shown in FIG. 2, and is utilized as the synapses between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1214 (only partially depicted) with current inputs flowing into them. The reference cells are tuned (e.g., programmed) to target reference levels. The target reference levels are provided by a reference mini-array matrix (not shown).

Memory array 1203 serves two purposes. First, it stores the weights that will be used by the VMM array 1200 on respective memory cells thereof. Second, memory array 1203 effectively multiplies the inputs (i.e. current inputs provided in terminals BLR0, BLR1, BLR2, and BLR3, which reference arrays 1201 and 1202 convert into the input voltages to supply to wordlines WL0, WL1, WL2, and WL3) by the weights stored in the memory array 1203 and then adds all the results (memory cell currents) to produce the output on the respective bit lines (BL0-BLN), which will be the input to the next layer or input to the final layer. By performing the multiplication and addition function, memory array 1203 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1200. The columns in the table indicate the voltages placed on word lines for selected cells, word lines for unselected cells, bit lines for selected cells, bit lines for unselected cells, source lines for selected cells, and source lines for unselected cells, where FLT indicates floating, i.e. no voltage is imposed. The rows indicate the operations of read, erase, and program.

TABLE NO. 5

| | \multicolumn{6}{c}{Operation of VMM Array 1200 of FIG. 12:} | | | | | |
|---|---|---|---|---|---|
| | WL | WL -unsel | BL | BL -unsel | SL | SL -unsel |
| Read | 0.5-3.5 V | −0.5 V/0 V | 0.1-2 V (Ineuron) | 0.6 V-2 V/FLT | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

Figure 13:
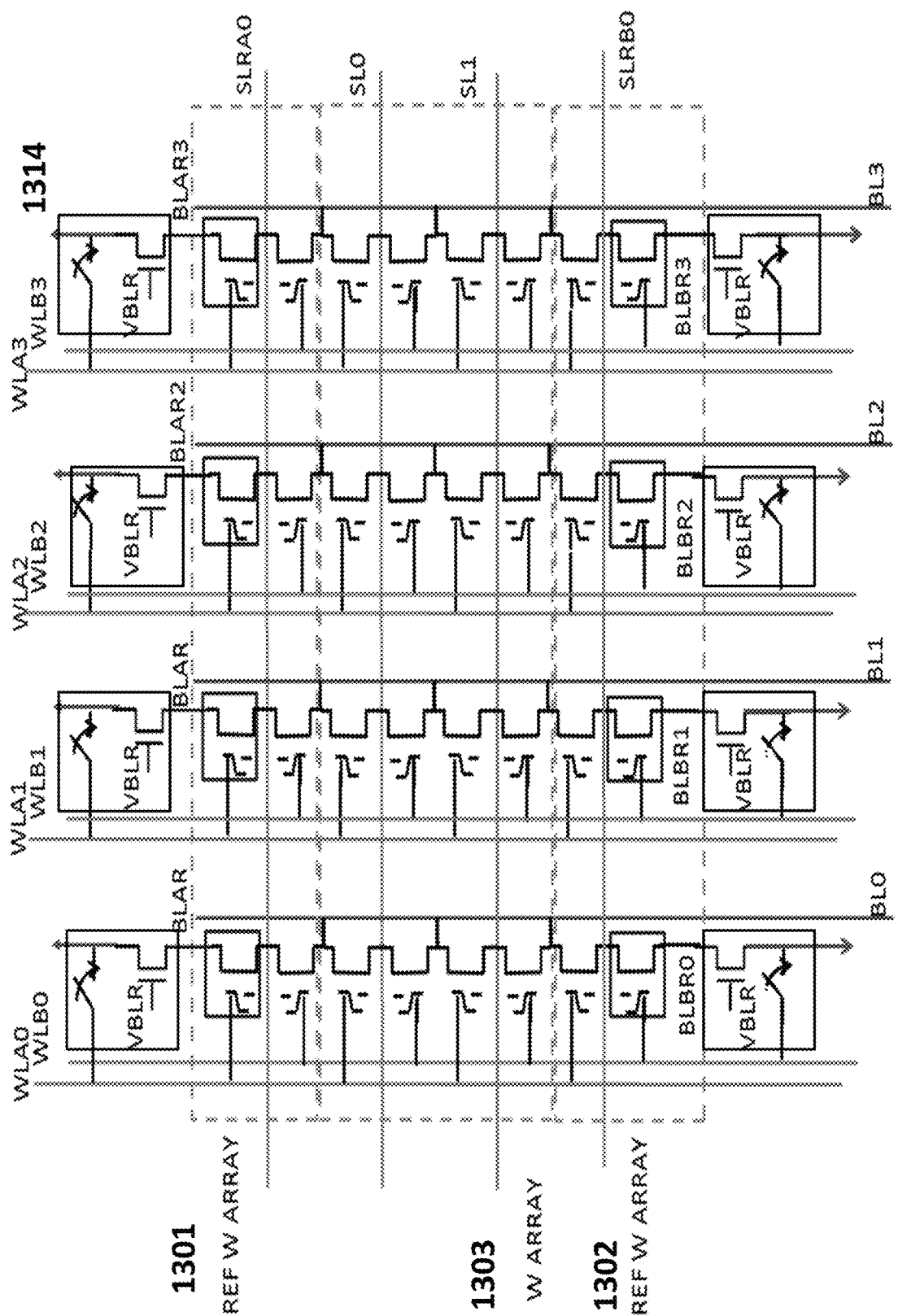
FIG. 13 depicts another embodiment of a vector-by-matrix multiplication system.

FIG. 13 depicts neuron VMM array 1300, which is particularly suited for memory cells 210 as shown in FIG. 2, and is utilized as the synapses and parts of neurons between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302 run in row direction of the VMM array 1300. VMM array is similar to VMM 1000 except that in VMM array 1300, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

Operation of VMM Array 1300 of FIG. 13

|  | WL | WL -unsel | BL | BL -unsel | SL | SL -unsel |
|---|---|---|---|---|---|---|
| Read | 0.5-3.5 V | −0.5 V/0 V | 0.1-2 V | 0.1 V-2 V/FLT | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

Figure 14:
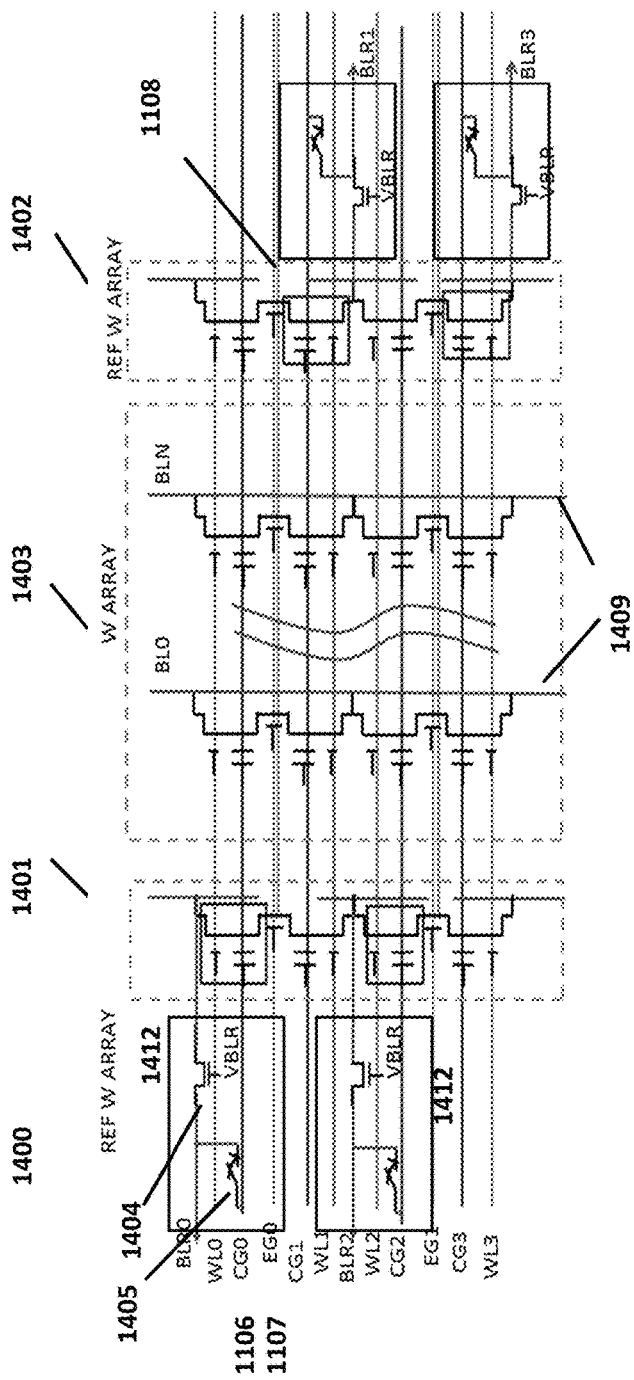
FIG. 14 depicts another embodiment of a vector-by-matrix multiplication system.

FIG. 14 depicts neuron VMM array 1400, which is particularly suited for memory cells 310 as shown in FIG. 3, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1412 (only partially shown) with current inputs flowing into them through BLR0, BLR1, BLR2, and BLR3. Multiplexors 1412 each include a respective multiplexor 1405 and a cascoding transistor 1404 to ensure a constant voltage on the bitline (such as BLR0) of each of the first and second non-volatile reference memory cells during a read operation. The reference cells are tuned to target reference levels.

Memory array 1403 serves two purposes. First, it stores the weights that will be used by the VMM array 1400. Second, memory array 1403 effectively multiplies the inputs (current inputs provided to terminals BLR0, BLR1, BLR2, and BLR3, for which reference arrays 1401 and 1402 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1400 implements uni-directional tuning for non-volatile memory cells in memory array 1403. That is, each non-volatile memory cell is erased and then partially programmed until the desired charge on the floating gate is reached. This can be performed, for example, using the precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

Operation of VMM Array 1400 of FIG. 14

|  | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 0.5-2 V | −0.5 V/0 V | 0.1-2 V (Ineuron) | 0 V/FLT | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 15:
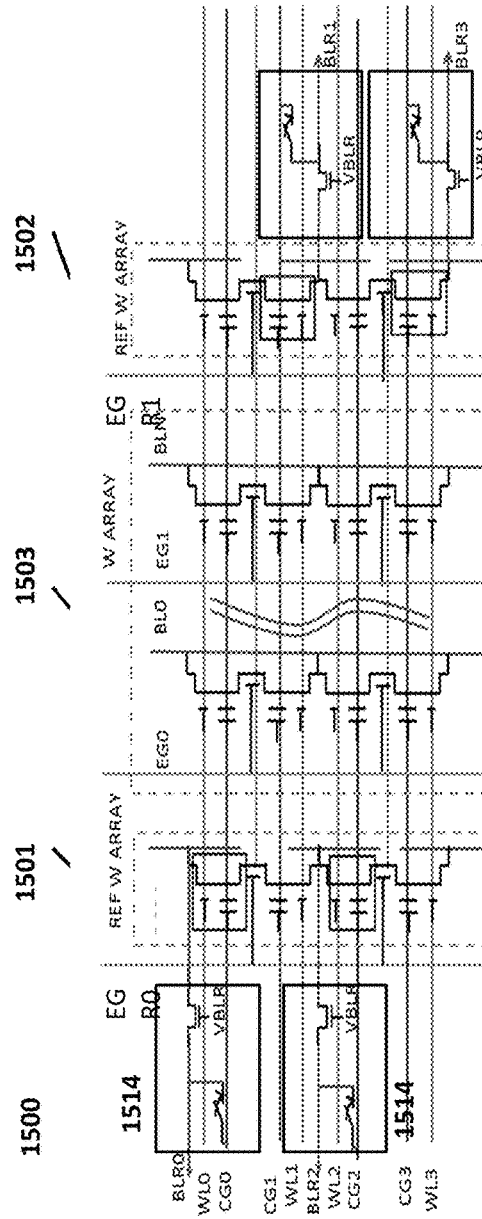
FIG. 15 depicts another embodiment of a vector-by-matrix multiplication system.

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 or first non-volatile reference memory cells, and reference array 1502 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1500 is similar to VMM array 1400, except that VMM array 1500 implements bi-directional tuning, where each individual cell can be completely erased, partially programmed, and partially erased as needed to reach the desired amount of charge on the floating gate due to the use of separate EG lines. As shown, reference arrays 1501 and 1502 convert input current in the terminal BLR0, BLR1, BLR2, and BLR3 into control gate voltages CG0, CG1, CG2, and CG3 (through the action of diode-connected reference cells through multiplexors 1514) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

an input layer and the next layer. In this example, the inputs $INPUT_0, \ldots, INPUT_n$ are received on vertical control gate lines $CG_0, \ldots, CG_N$, respectively, and the outputs $OUTPUT_1$ and $OUTPUT_2$ are generated on source lines $SL_0$ and $SL_1$.

Figure 29:
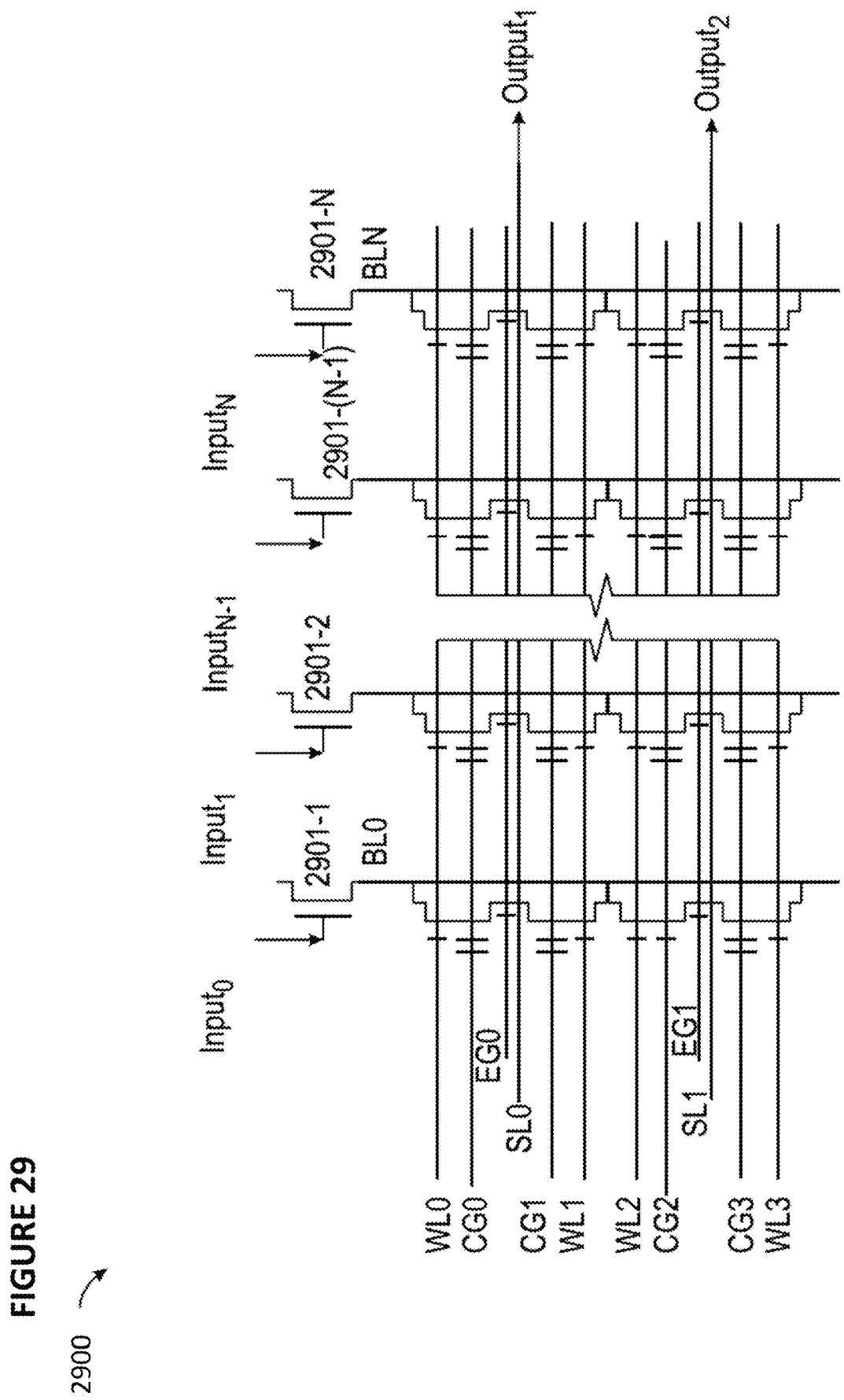
FIG. 29 depicts another embodiment of a vector-by-matrix multiplication system.

FIG. 29 depicts neuron VMM array 2900, which is particularly suited for memory cells 410 as shown in FIG. 4, and is utilized as the synapses and parts of neurons between an input layer and the next layer. In this example, the inputs $INPUT_0, \ldots, INPUT_N$ are received on the gates of bit line control gates 2901-1, 2901-2, ..., 2901-(N-1), and 2901-N, respectively, which are coupled to bit lines $BL_0, \ldots BL_N$, respectively. Exemplary outputs $OUTPUT_1$ and $OUTPUT_2$ are generated on source lines $SL_0$ and $SL_1$.

Figure 30:
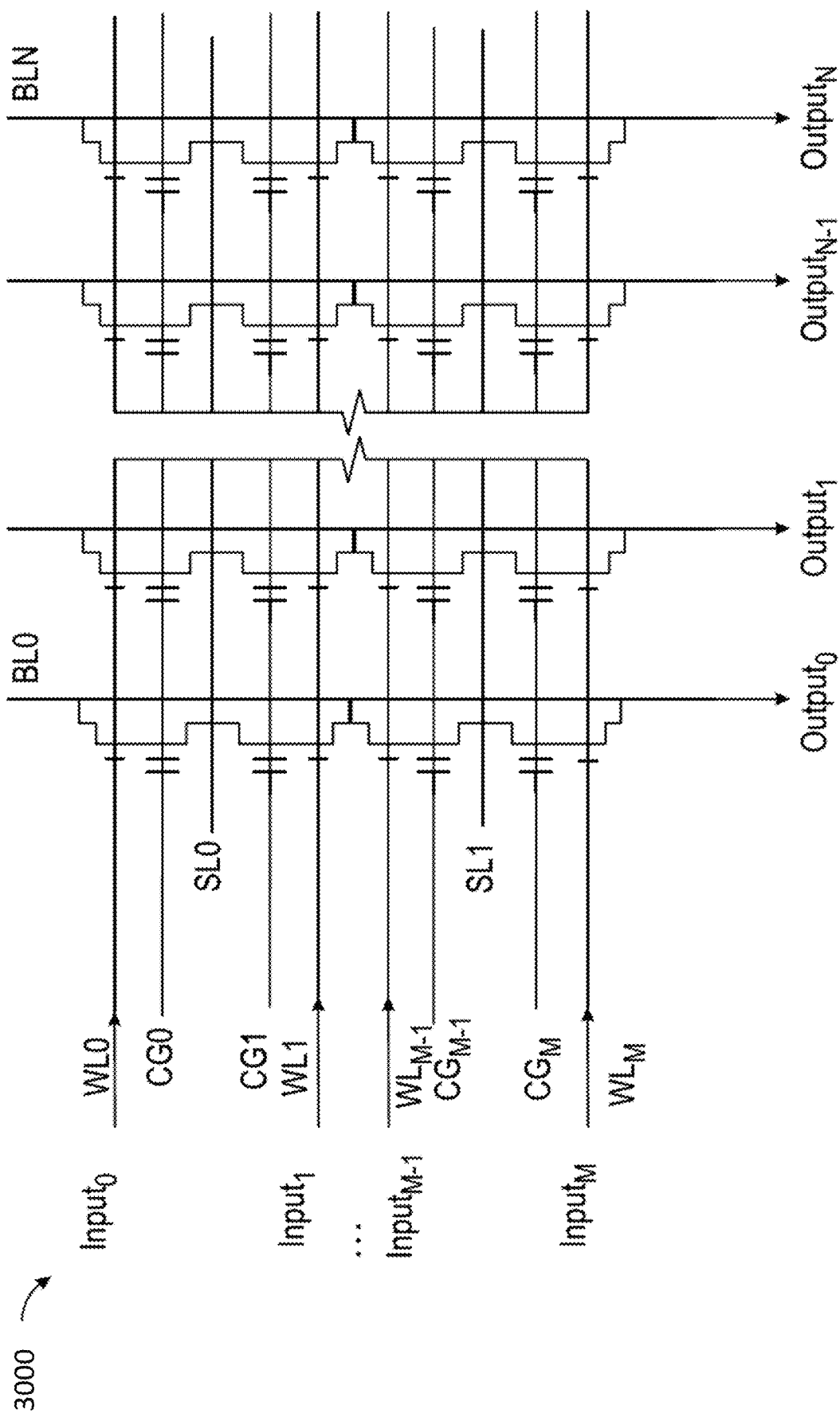
FIG. 30 depicts another embodiment of a vector-by-matrix multiplication system.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts

TABLE NO. 8

Operation of VMM Array 1500 of FIG. 15

| | WL | WL - unsel | BL | BL - unsel | CG | CG -unsel same sector | CG - unsel | EG | EG - unsel | SL | SL - unsel |
|---|---|---|---|---|---|---|---|---|---|---|---|
| Read | 1.0-2 V | −0.5 V/0 V | 0.6-2 V (Ineuron) | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 24:
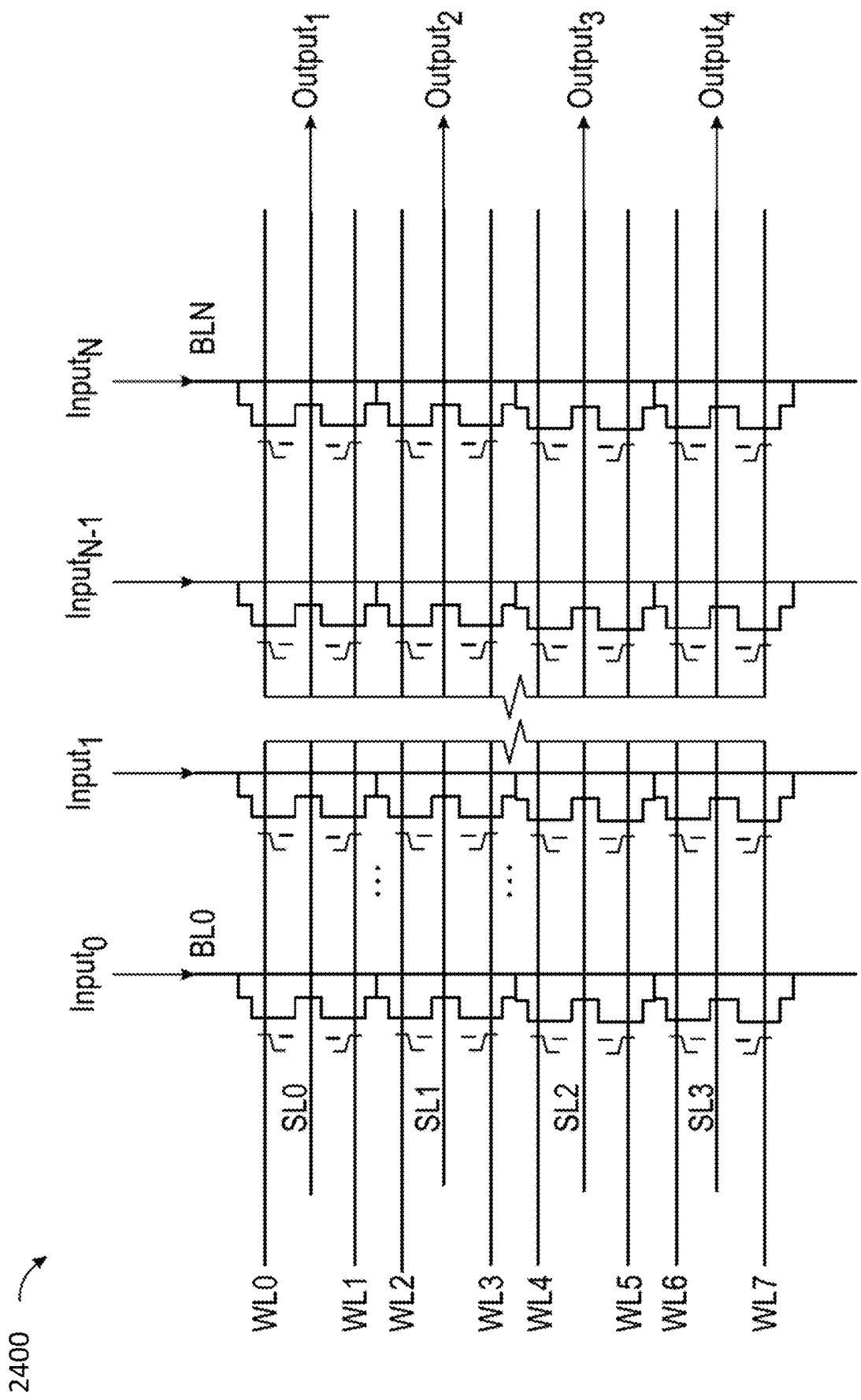
FIG. 24 depicts another embodiment of a vector-by-matrix multiplication system.

FIG. 24 depicts neuron VMM array 2400, which is particularly suited for memory cells 210 as shown in FIG. 2, and is utilized as the synapses and parts of neurons between an input layer and the next layer. In VMM array 2400, the inputs $INPUT_0, \ldots, INPUT_N$ are received on bit lines $BL_0, \ldots BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

Figure 25:
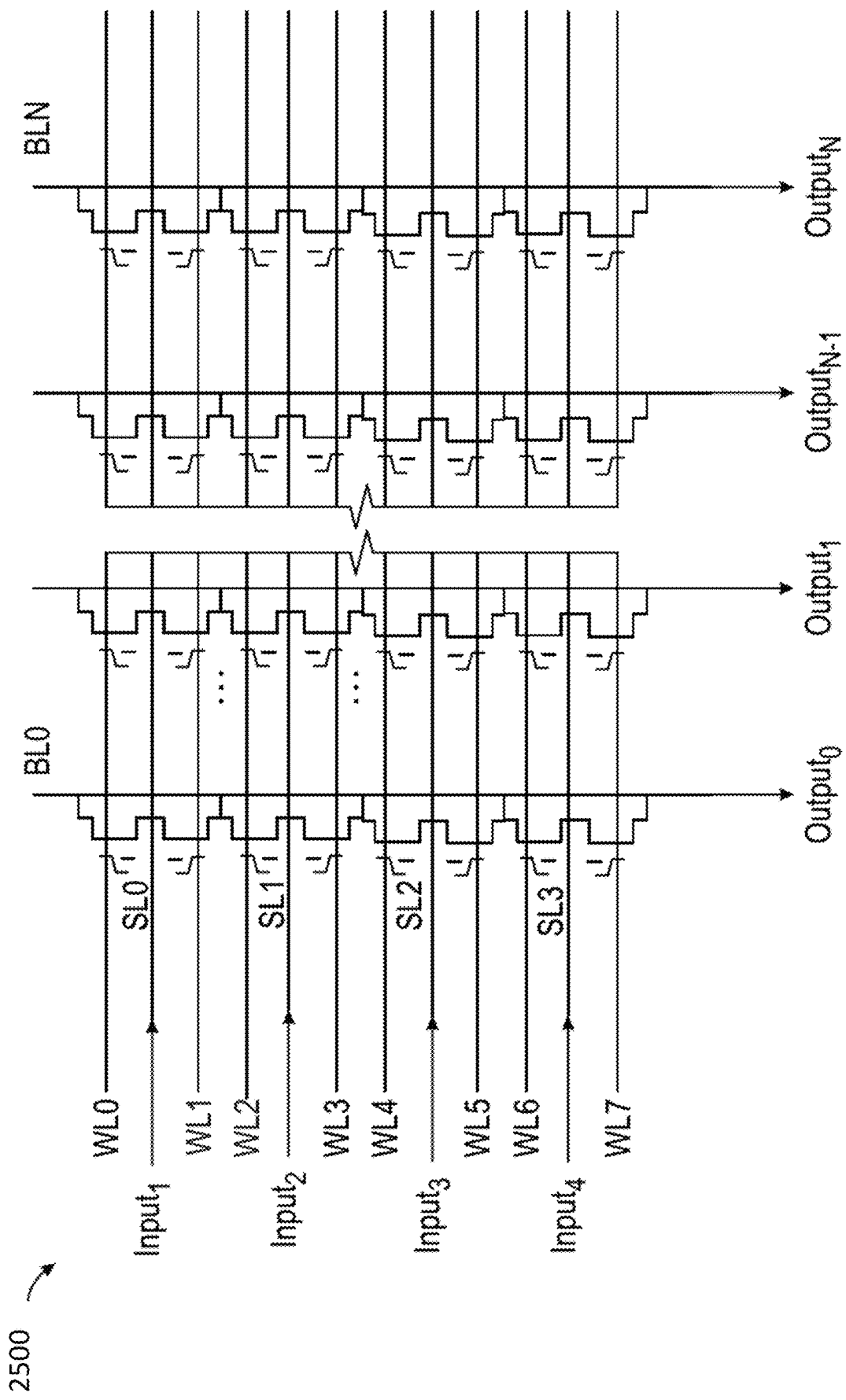
FIG. 25 depicts another embodiment of a vector-by-matrix multiplication system.

FIG. 25 depicts neuron VMM array 2500, which is particularly suited for memory cells 210 as shown in FIG. 2, and is utilized as the synapses and parts of neurons between an input layer and the next layer. In this example, the inputs $INPUT_0$, $INPUT_1$, $INPUT_2$, and $INPUT_3$ are received on source lines $SL_0$, $SL_1$, $SL_2$, and $SL_3$, respectively, and the outputs $OUTPUT_0, \ldots OUTPUT_N$ are generated on bit lines $BL_0, \ldots, BL_N$.

Figure 26:
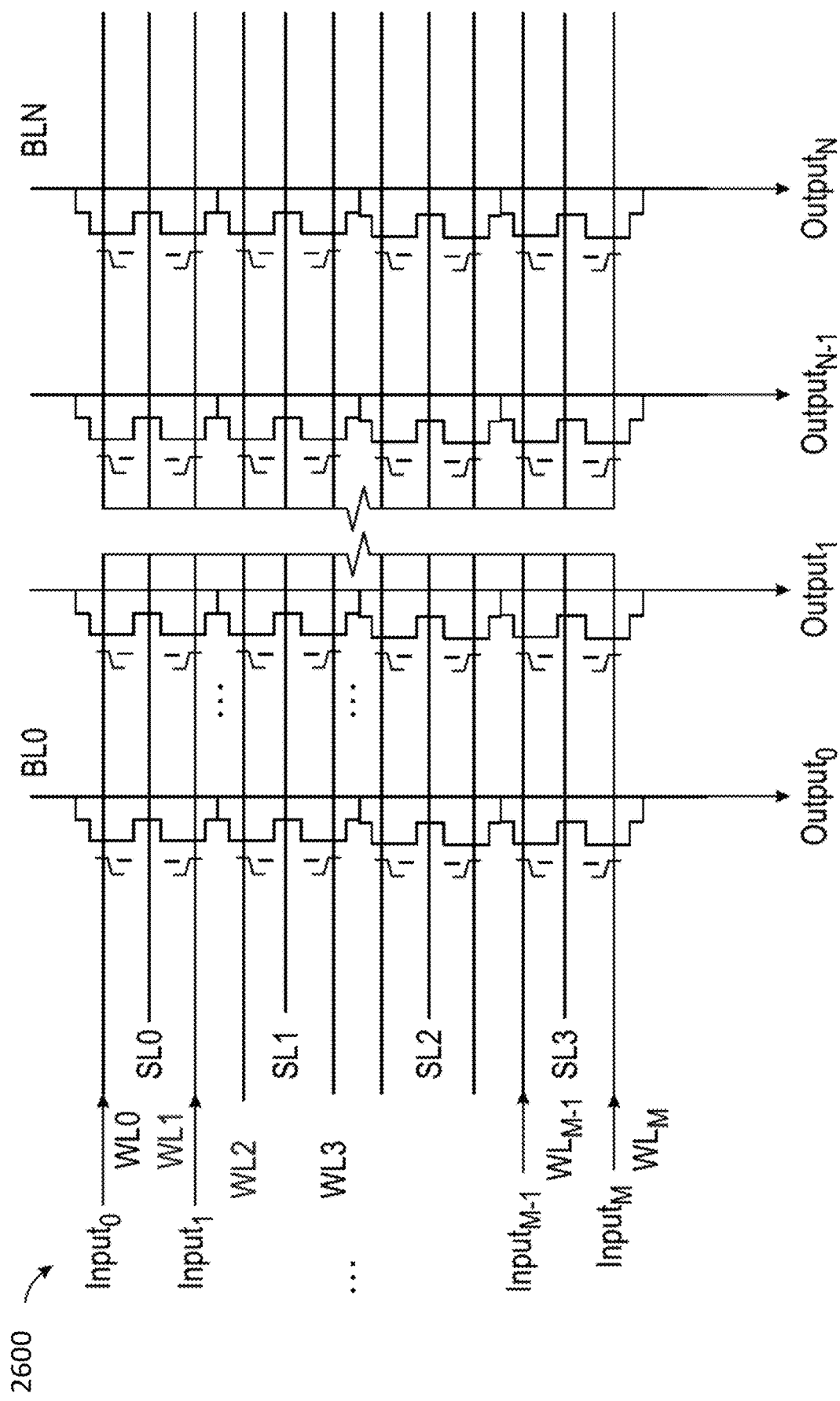
FIG. 26 depicts another embodiment of a vector-by-matrix multiplication system.

FIG. 26 depicts neuron VMM array 2600, which is particularly suited for memory cells 210 as shown in FIG. 2, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

Figure 27:
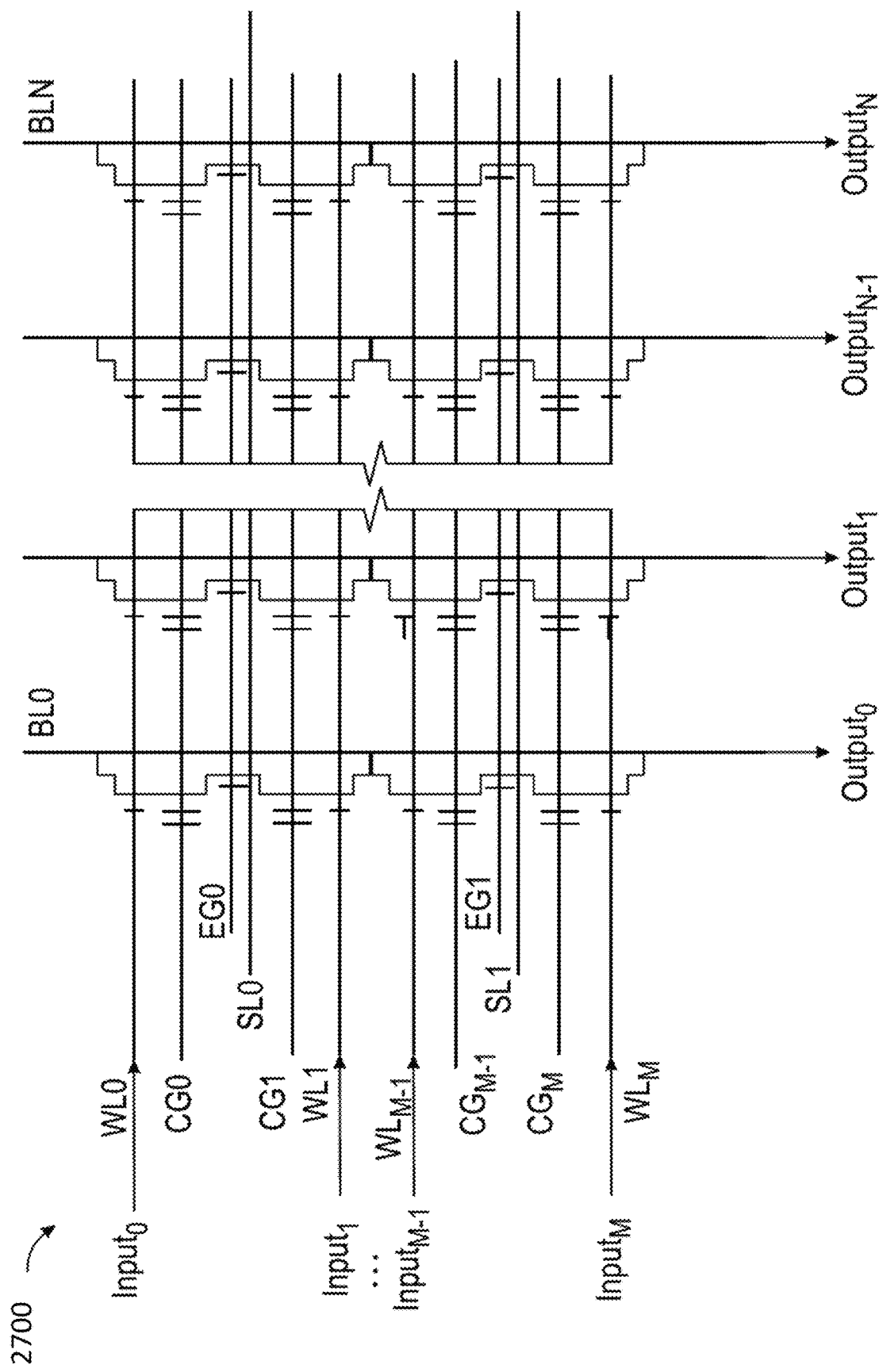
FIG. 27 depicts another embodiment of a vector-by-matrix multiplication system.

FIG. 27 depicts neuron VMM array 2700, which is particularly suited for memory cells 310 as shown in FIG. 3, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

Figure 28:
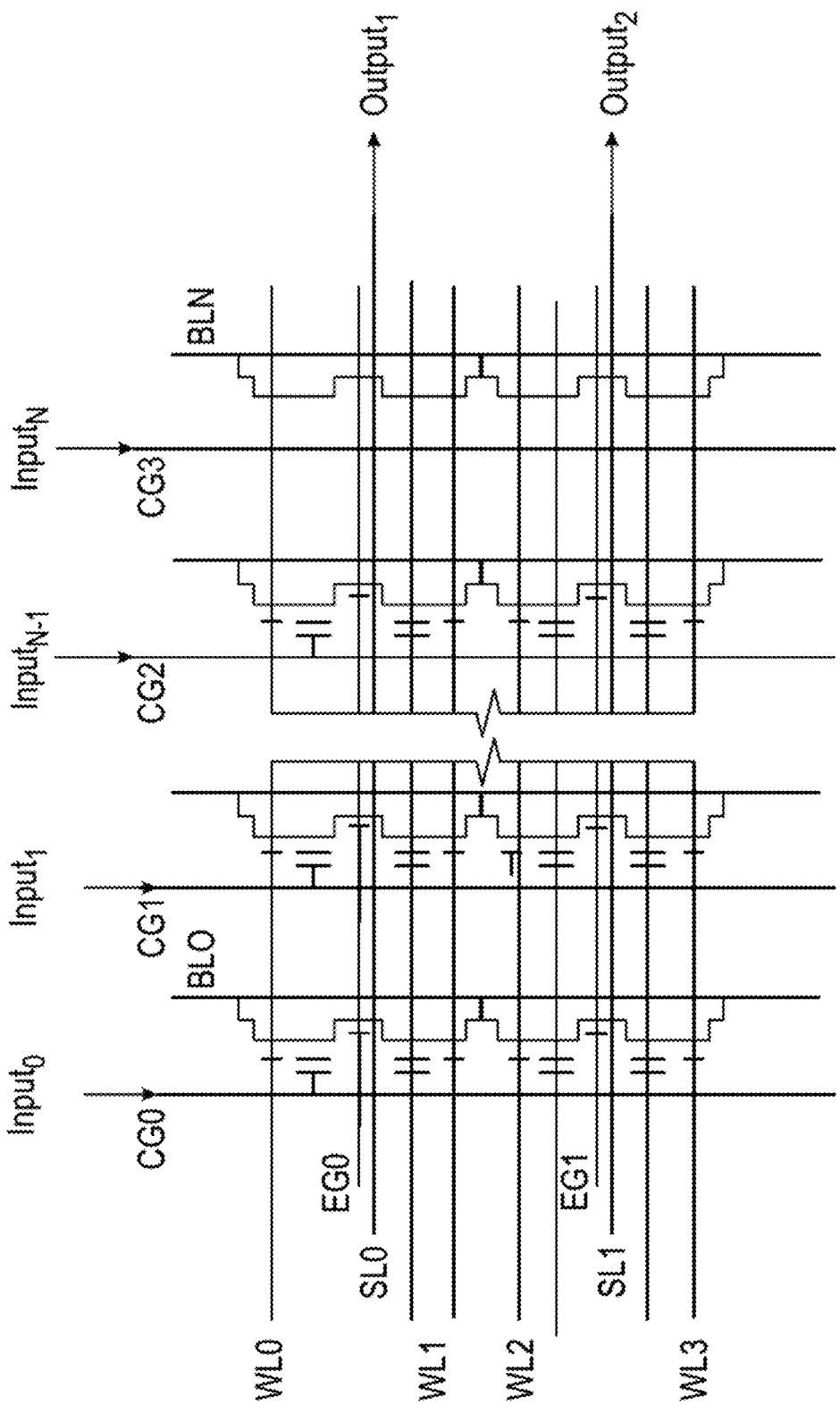
FIG. 28 depicts another embodiment of a vector-by-matrix multiplication system.

FIG. 28 depicts neuron VMM array 2800, which is particularly suited for memory cells 410 as shown in FIG. 4, and is utilized as the synapses and parts of neurons between an input layer and the next layer. In this example, the inputs $INPUT_0, \ldots, INPUT_M$ are received on word lines $WL_0, \ldots, WL_M$, and the outputs $OUTPUT_0, \ldots, OUTPUT_N$ are generated on bit lines $BL_0, \ldots, BL_N$, respectively.

Figure 31:
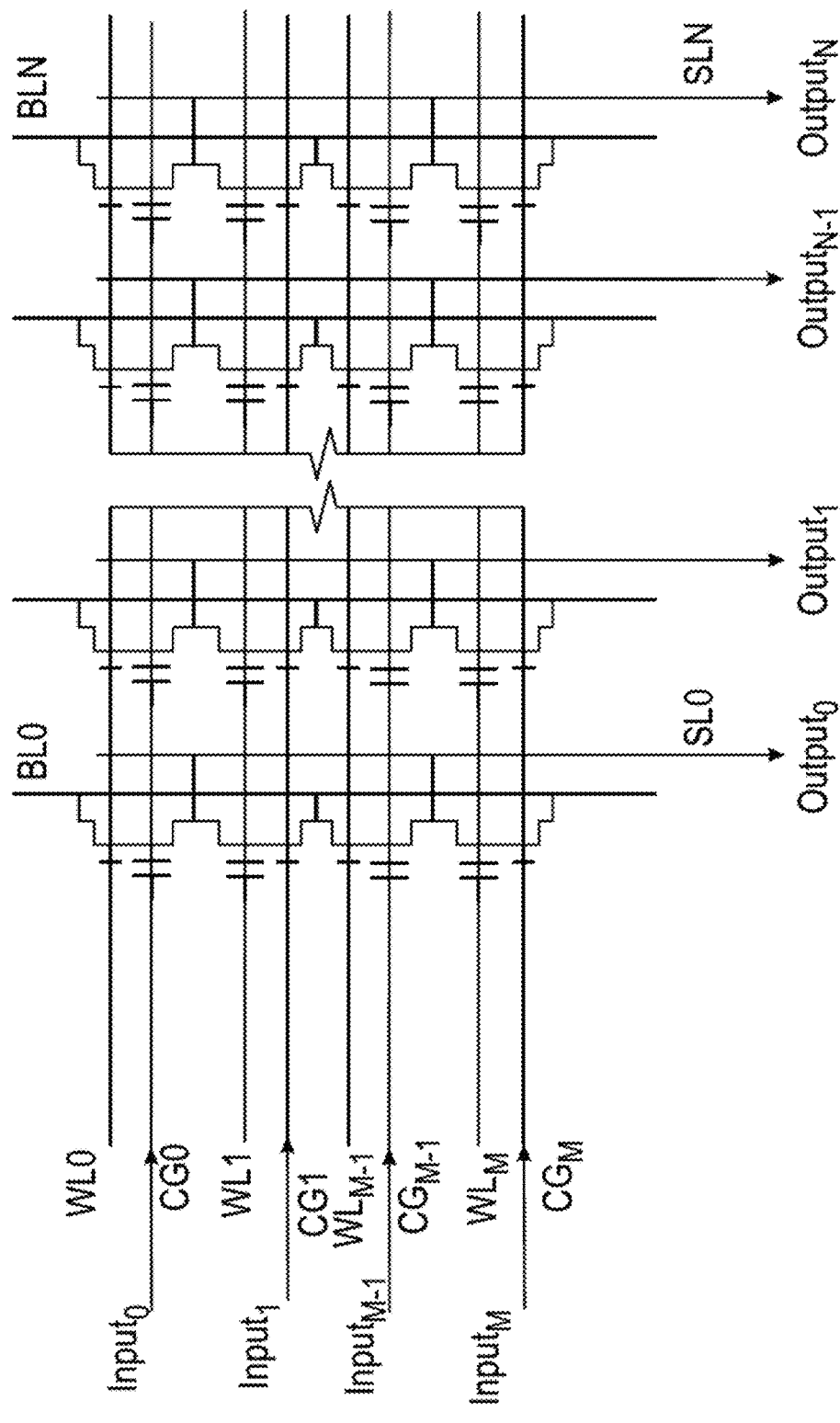
FIG. 31 depicts another embodiment of a vector-by-matrix multiplication system.

FIG. 31 depicts neuron VMM array 3100, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical source lines $SL_0, \ldots, SL_N$, respectively, where each source line $SL_i$ is coupled to the source lines of all memory cells in column i.

Figure 32:
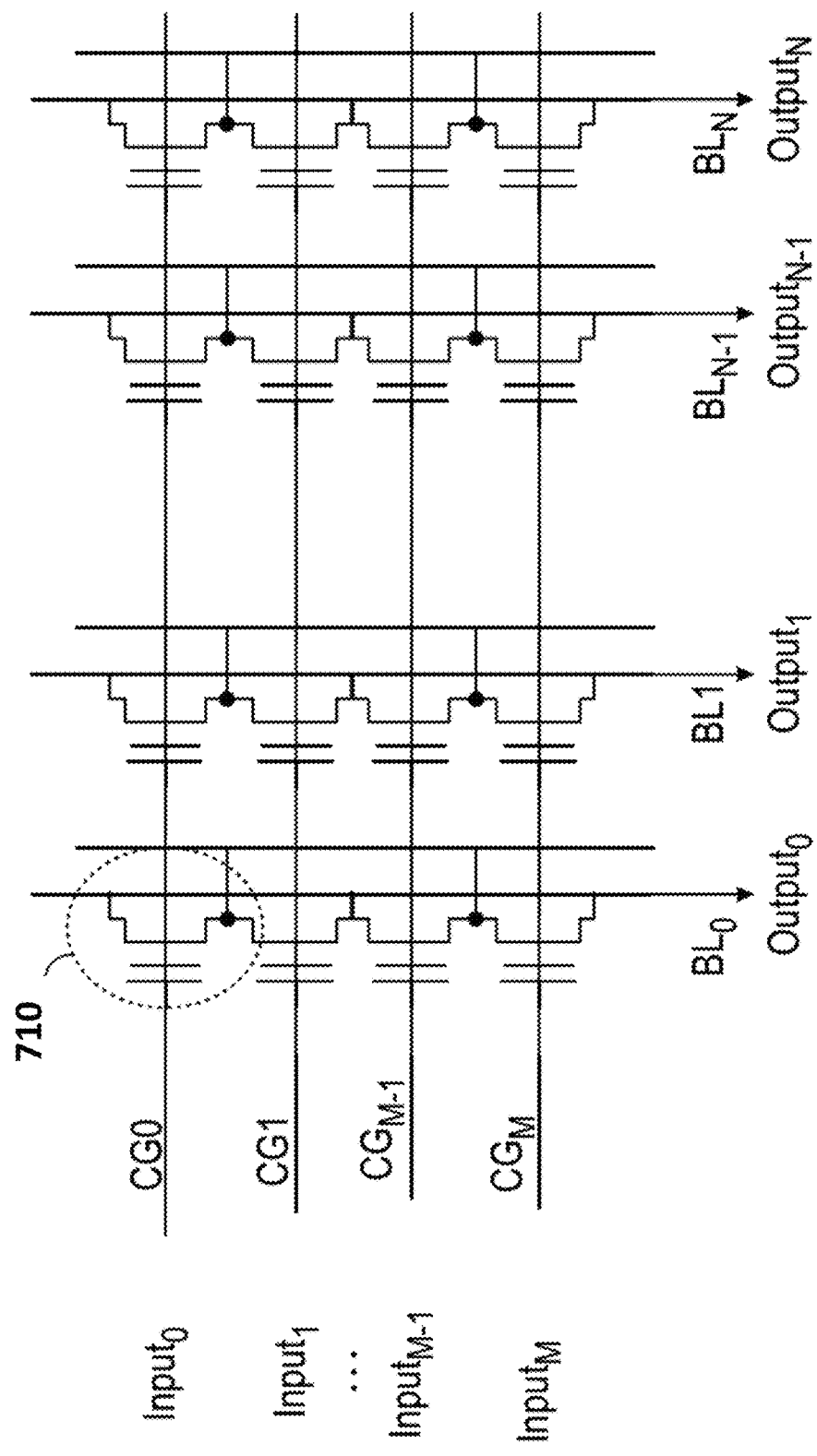
FIG. 32 depicts another embodiment of a vector-by-matrix multiplication system.

FIG. 32 depicts neuron VMM array 3200, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical bit lines $BL_0, \ldots, BL_N$, respectively, where each bit line $BL_i$ is coupled to the bit lines of all memory cells in column i.

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

Figure 16:
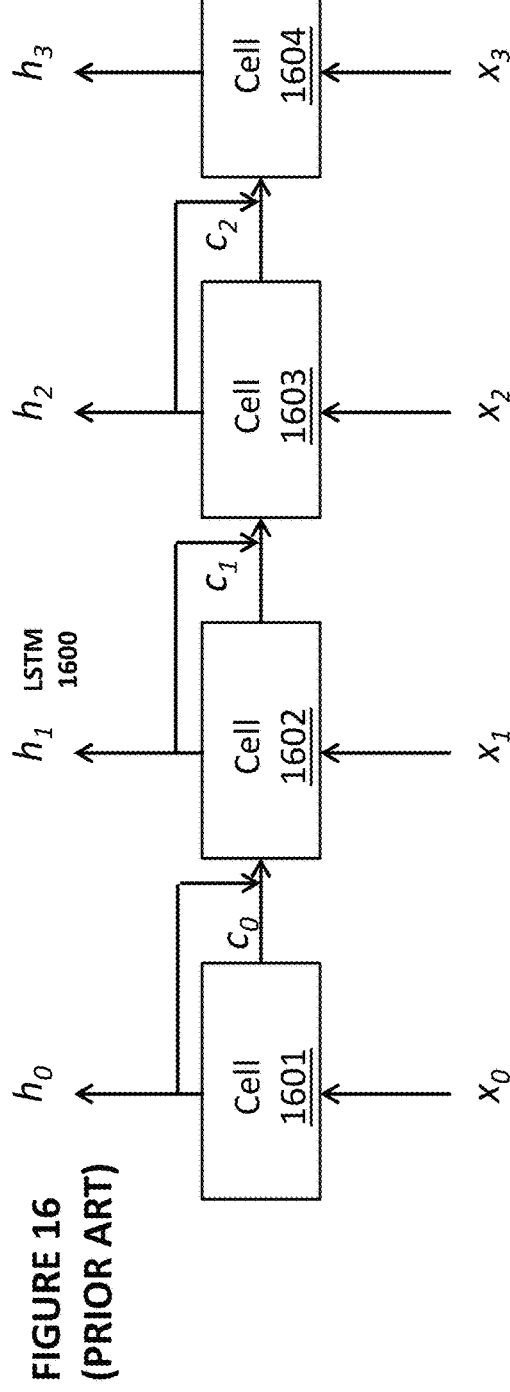
FIG. 16 depicts a prior art long short term memory system.

FIG. 16 depicts an exemplary LSTM 1600. LSTM 1600 in this example comprises cells 1601, 1602, 1603, and 1604. Cell 1601 receives input vector $x_0$ and generates output vector $h_0$ and cell state vector $c_0$. Cell 1602 receives input vector $x_1$, the output vector (hidden state) $h_0$ from cell 1601, and cell state $c_0$ from cell 1601 and generates output vector $h_1$ and cell state vector $c_1$. Cell 1603 receives input vector $x_2$, the output, vector (hidden state) $h_1$ from cell 1602, and cell state $c_1$ from cell 1602 and generates output vector $h_2$ and cell state vector $c_2$. Cell 1604 receives input vector $x_3$, the output vector (hidden state) $h_2$ from cell 1603, and cell state $c_2$ from cell 1603 and generates output vector $h_3$. Additional cells can be used, and an LSTM with four cells is merely an example.

Figure 17:
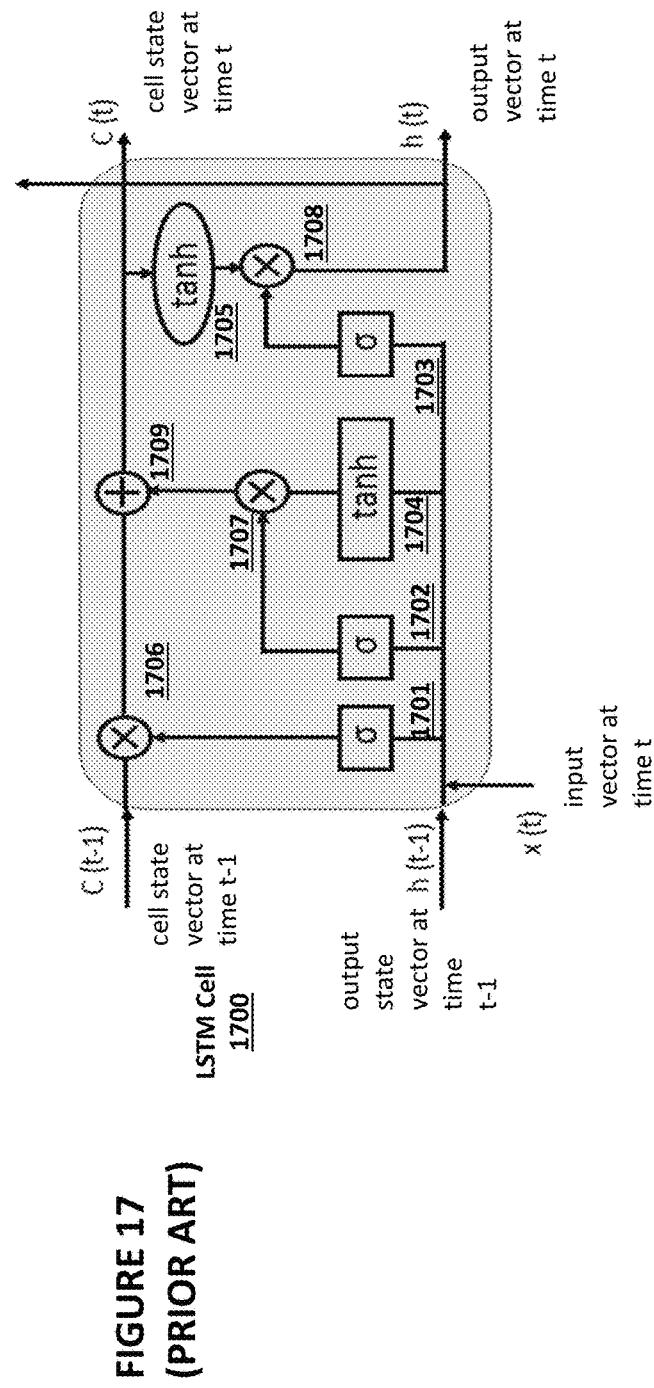
FIG. 17 depicts an exemplary cell for use in a long short term memory system.

FIG. 17 depicts an exemplary implementation of an LSTM cell 1700, which can be used for cells 1601, 1602, 1603, and 1604 in FIG. 16. LSTM cell 1700 receives input vector x(t), cell state vector c(t−1) from a preceding cell, and output vector h(t−1) from a preceding cell, and generates cell state vector c(t) and output vector h(t).

LSTM cell 1700 comprises sigmoid function devices 1701, 1702, and 1703, each of which applies a number between 0 and 1 to control how much of each component in the input vector is allowed through to the output vector. LSTM cell 1700 also comprises tan h devices 1704 and 1705 to apply a hyperbolic tangent function to an input vector, multiplier devices 1706, 1707, and 1708 to multiply two vectors together, and addition device 1709 to add two vectors together. Output vector h(t) can be provided to the next LSTM cell in the system, or it can be accessed for other purposes.

Figure 18:
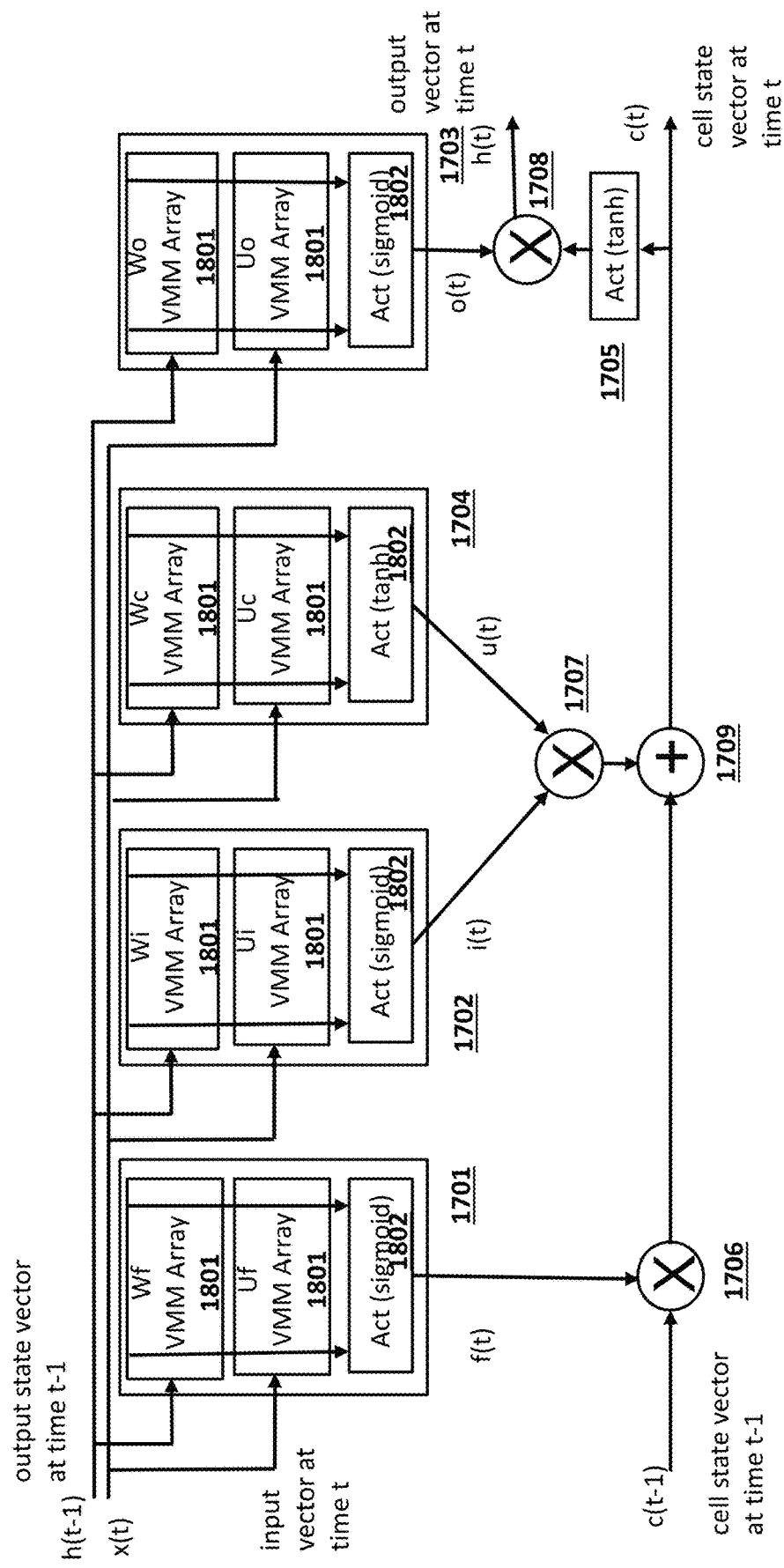
FIG. 18 depicts an embodiment of the exemplary cell of FIG. 17.

FIG. 18 depicts an LSTM cell 1800, which is an example of an implementation of LSTM cell 1700. For the reader's convenience, the same numbering from LSTM cell 1700 is used in LSTM cell 1800. Sigmoid function devices 1701, 1702, and 1703 and tan h device 1704 each comprise multiple VMM arrays 1801 and activation circuit blocks 1802. Thus, it can be seen that VMM arrays are particular useful in LSTM cells used in certain neural network systems. The multiplier devices 1706, 1707, and 1708 and the addition device 1709 are implemented in a digital manner or in an analog manner. The activation function blocks 1802 can be implemented in a digital manner or in an analog manner.

Figure 19:
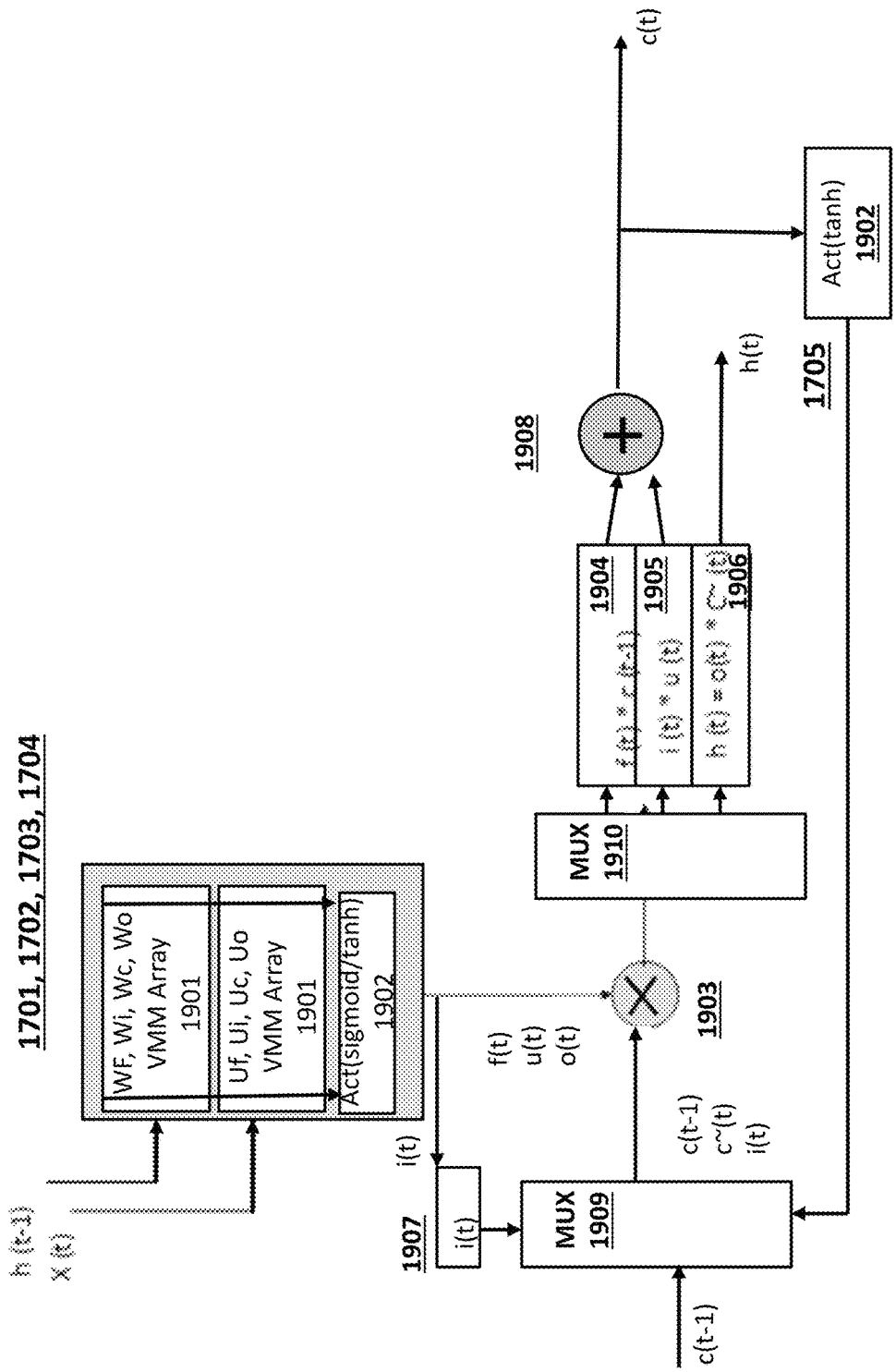
FIG. 19 depicts another embodiment of the exemplary cell of FIG. 17.

An alternative to LSTM cell 1800 (and another example of an implementation of LSTM cell 1700) is shown in FIG. 19. In FIG. 19, sigmoid function devices 1701, 1702, and 1703 and tan h device 1704 share the same physical hardware (VMM arrays 1901 and activation function block 1902) in a time-multiplexed fashion. LSTM cell 1900 also comprises multiplier device 1903 to multiply two vectors together, addition device 1908 to add two vectors together, tan h device 1705 (which comprises activation circuit block 1902), register 1907 to store the value i(t) when i(t) is output from sigmoid function block 1902, register 1904 to store the value f(t)*c(t−1) when that value is output from multiplier device 1903 through multiplexor 1910, register 1905 to store the value i(t)*u(t) when that value is output from multiplier device 1903 through multiplexor 1910, and register 1906 to store the value o(t)*c~(t) when that value is output from multiplier device 1903 through multiplexor 1910, and multiplexor 1909.

Whereas LSTM cell 1800 contains multiple sets of VMM arrays 1801 and respective activation function blocks 1802, LSTM cell 1900 contains only one set of VMM arrays 1901 and activation function block 1902, which are used to represent multiple layers in the embodiment of ISM cell 1900. LSTM cell 1900 will require less space than ISM 1800, as LSTM cell 1900 will require ¼ as much space for VMMs and activation function blocks compared to LSTM cell 1800.

It can be further appreciated that LSTM units will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

Figure 20:
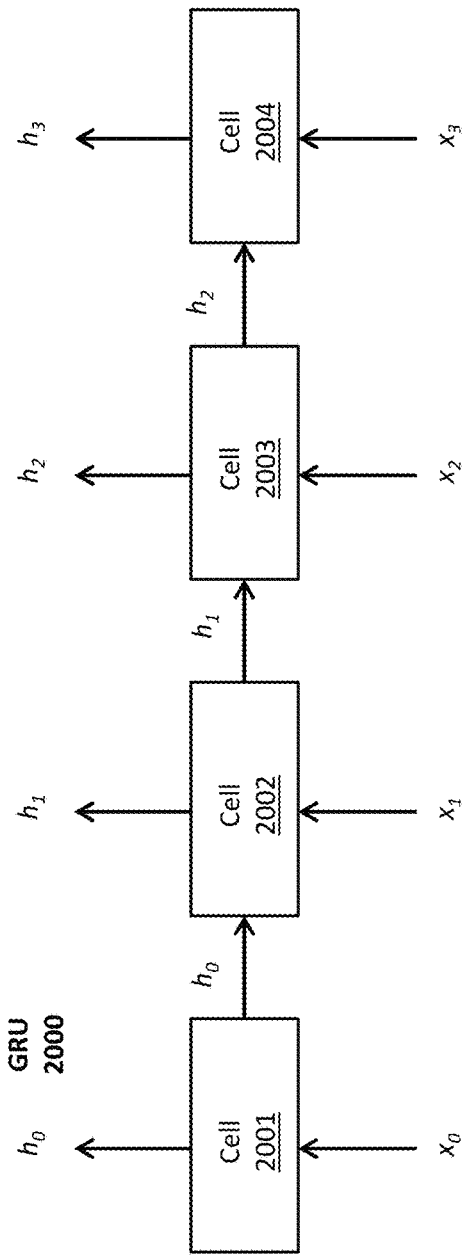
FIG. 20 depicts a prior art gated recurrent unit system.

FIG. 20 depicts an exemplary GRU 2000. GRU 2000 in this example comprises cells 2001, 2002, 2003, and 2004. Cell 2001 receives input vector $x_0$ and generates output vector $h_0$. Cell 2002 receives input vector $x_1$, the output vector $h_0$ from cell 2001 and generates output vector $h_1$. Cell 2003 receives input vector $x_2$ and the output vector (hidden state) $h_1$ from cell 2002 and generates output vector $h_2$. Cell 2004 receives input vector $x_3$ and the output vector (hidden state) $h_2$ from cell 2003 and generates output vector $h_3$. Additional cells can be used, and an GRU with four cells is merely an example.

Figure 21:
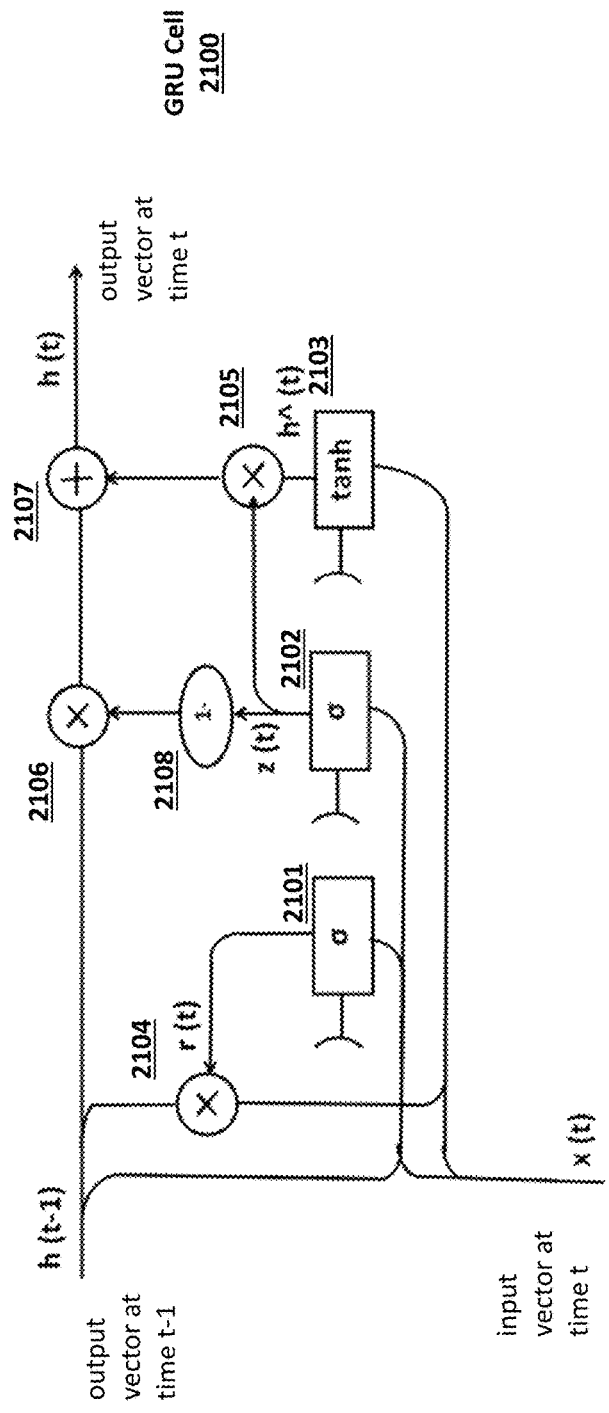
FIG. 21 depicts an exemplary cell for use in a gated recurrent unit system.

FIG. 21 depicts an exemplary implementation of a GRU cell 2100, which can be used for cells 2001, 2002, 2003, and 2004 of FIG. 20. GRU cell 2100 receives input vector x(t) and output vector h(t−1) from a preceding GRU cell and generates output vector h(t), GRU cell 2100 comprises sigmoid function devices 2101 and 2102, each of which applies a number between 0 and 1 to components from output vector h(t−1) and input vector x(t). GRU cell 2100 also comprises a tan h device 2103 to apply a hyperbolic tangent function to an input vector, a plurality of multiplier devices 2104, 2105, and 2106 to multiply two vectors together, an addition device 2107 to add two vectors together, and a complementary device 2108 to subtract an input from 1 to generate an output.

Figure 22:
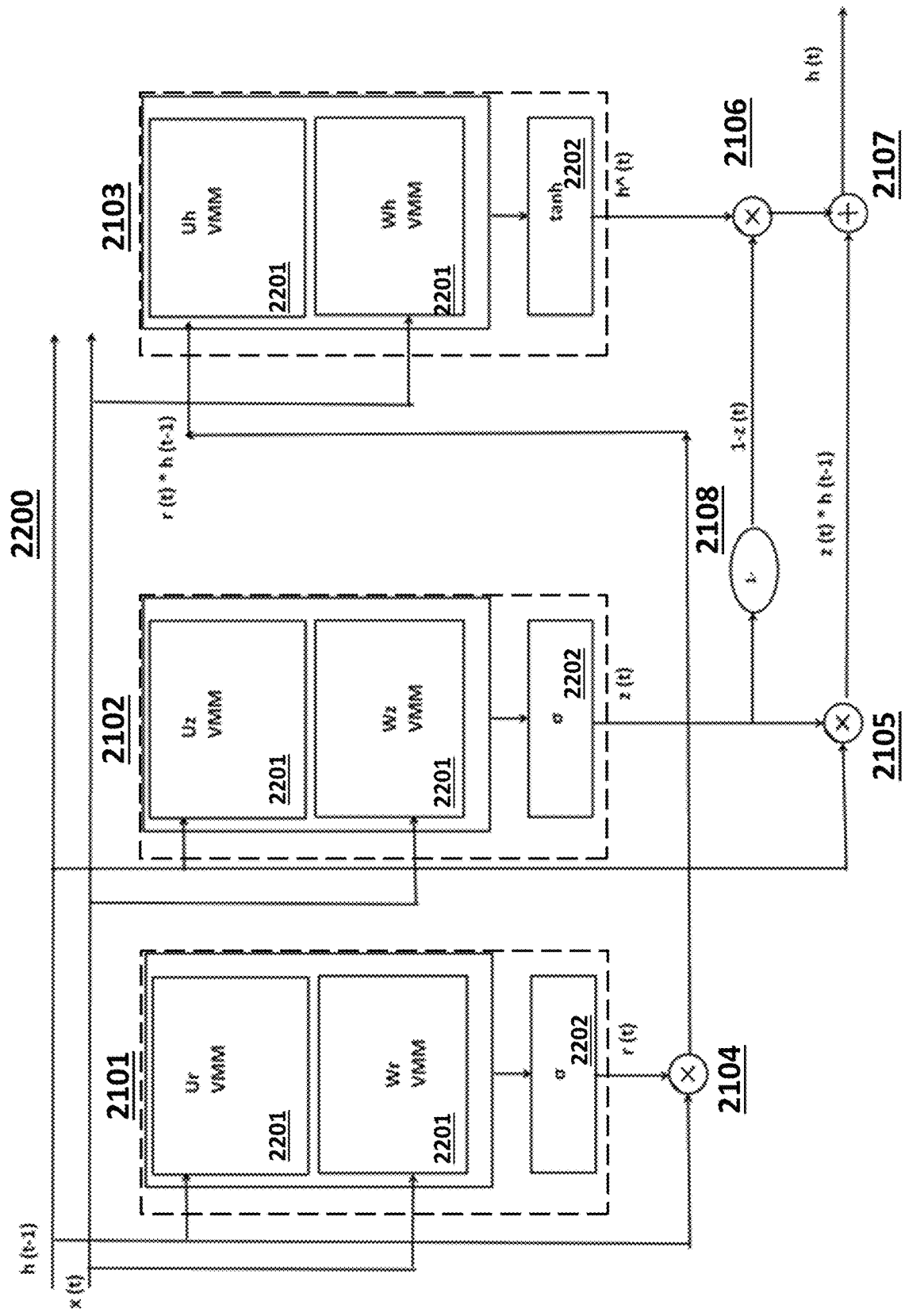
FIG. 22 depicts an embodiment of the exemplary cell of FIG. 21.

FIG. 22 depicts a GRU cell 2200, which is an example of an implementation of GRU cell 2100. For the reader's convenience, the same numbering from GRU cell 2100 is used in GRU cell 2200. As can be seen in FIG. 22, sigmoid function devices 2101 and 2102, and tan h device 2103 each comprise multiple VMM arrays 2201 and activation function blocks 2202. Thus, it can be seen that WM arrays are of particular use in GRU cells used in certain neural network systems. The multiplier devices 2104, 2105, 2106, the addition device 2107, and the complementary device 2108 are implemented in a digital manner or in an analog manner. The activation function blocks 2202 can be implemented in a digital manner or in an analog manner.

Figure 23:
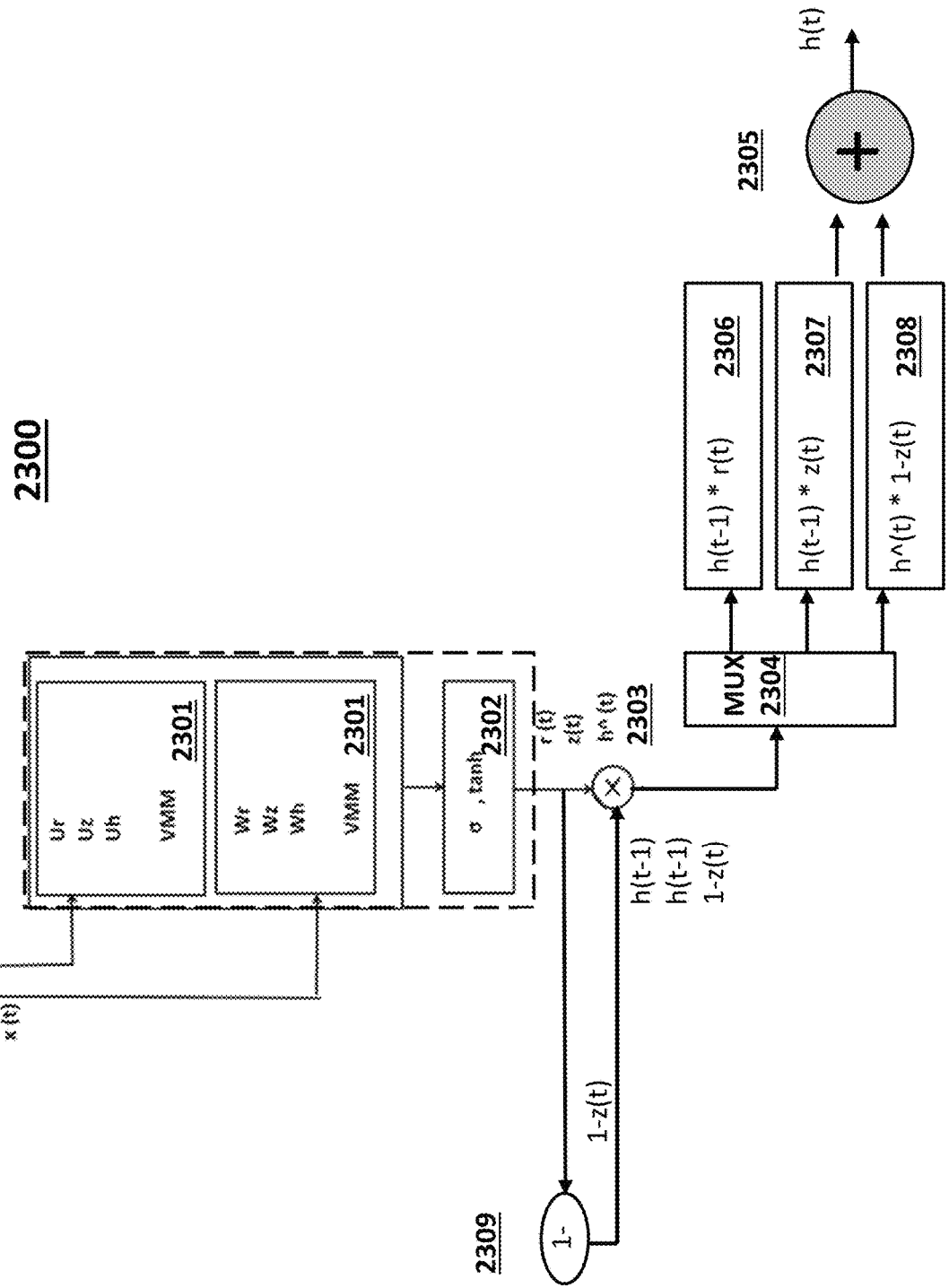
FIG. 23 depicts another embodiment of the exemplary cell of FIG. 21.

An alternative to GRU cell 2200 (and another example of an implementation of GRU cell 2300) is shown in FIG. 23. In FIG. 23, GRU cell 2300 utilizes VIM arrays 2301 and activation function block 2302, which when configured as a sigmoid function applies a number between 0 and 1 to control how much of each component in the input vector is allowed through to the output vector. In FIG. 23, sigmoid function devices 2101 and 2102 and tan h device 2103 share the same physical hardware (VMM arrays 2301 and activation function block 2302) in a time-multiplexed fashion. GRU cell 2300 also comprises multiplier device 2303 to multiply two vectors together, addition device 2305 to add two vectors together, complementary device 2309 to subtract an input from 1 to generate an output, multiplexor 2304, register 2306 to hold the value h(t−1)*r(t) when that value is output from multiplier device 2303 through multiplexor 2304, register 2307 to hold the value h(t−1)*z(t) when that value is output from multiplier device 2303 through multiplexor 2304, and register 2308 to hold the value hˆ(t)*(1−z(t)) when that value is output from multiplier device 2303 through multiplexor 2304.

Whereas GRU cell 2200 contains multiple sets of VMM arrays 2201 and activation function blocks 2202, GRU cell 2300 contains only one set of VMM arrays 2301 and activation function block 2302, which are used to represent multiple layers in the embodiment of GRU cell 2300. GRU cell 2300 will require less space than GRU cell 2200, as GRU cell 2300 will require ⅓ as much space for VMMs and activation function blocks compared to GRU cell 2200.

It can be further appreciated that GRU systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient.

The input to the VMM arrays can be an analog level, a binary level, or digital bits (in this case a DAC is needed to convert digital bits to appropriate input analog level) and the output can be an analog level, a binary level, or digital bits (in this case an output ADC is needed to convert output analog level into digital bits).

For each memory cell in a VMM array, each weight W can be implemented by a single memory cell or by a differential cell or by two blend memory cells (average of 2 cells). In the differential cell case, two memory cells are needed to implement a weight W as a differential weight (W=W+−W−). In the two blend memory cells, two memory cells are needed to implement a weight W as an average of two cells.

Decoding Systems and Physical Layout Embodiments for VMM Arrays

FIGS. 33-51 disclose various decoding systems and physical layouts for VMM arrays that can be used with any of the memory cell types described previously with respect to FIGS. 2-7, or with other non-volatile memory cells.

Figure 33:
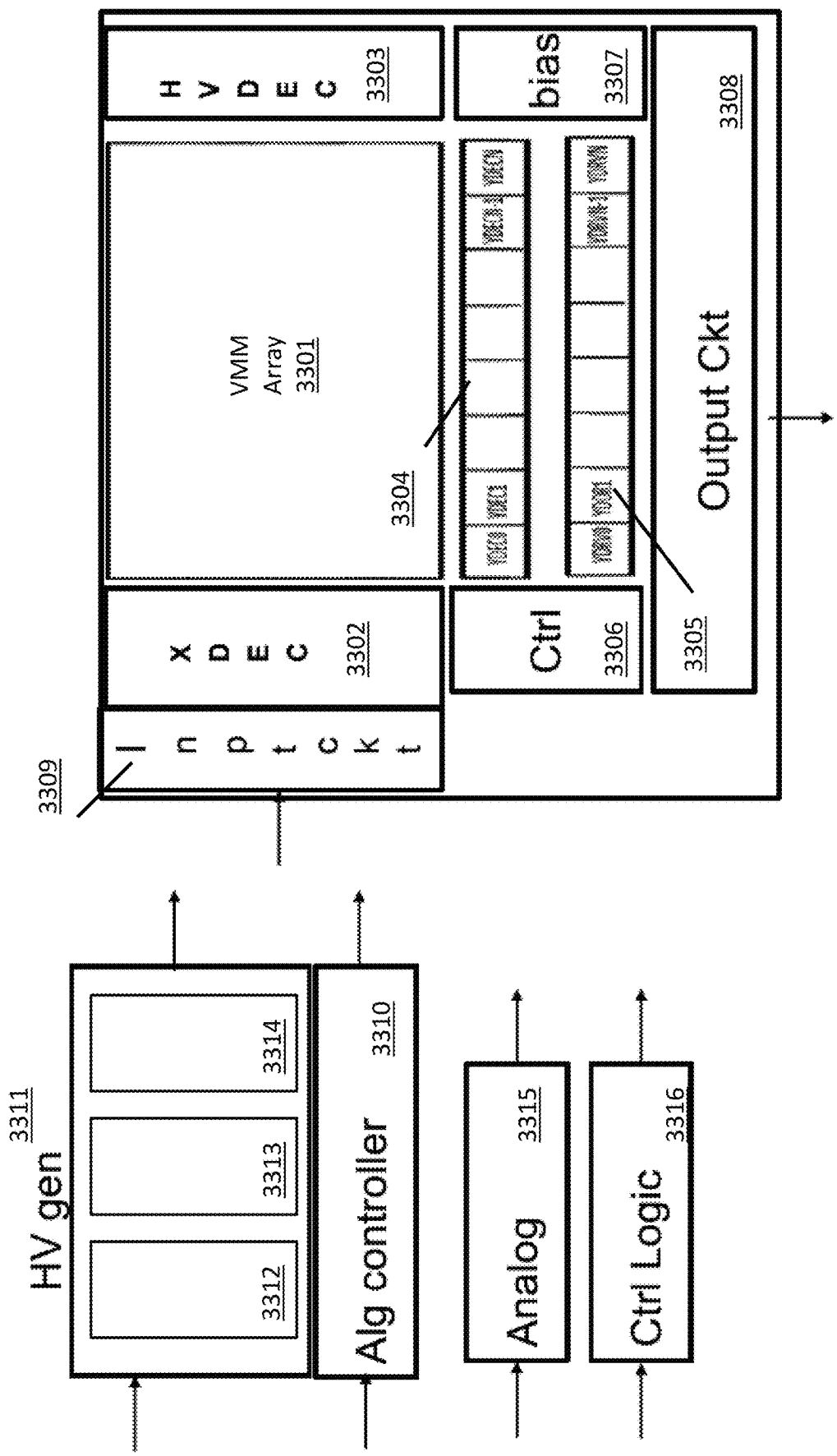
FIG. 33 depicts an exemplary block diagram of a vector-by-matrix multiplication system.

FIG. 33 depicts VMM system 3300. VMM system 3300 comprises VMM array 3301 (which can be based on any of the VMM array designs discussed previously, such as VMM array 1000, 1100, 1200, 1300, 1400, 1500, 2400, 2500, 2600, 2700, 2800, 2900, 3000, 3100, and 3200 or other VMM designs), low voltage row decoder 3302, high voltage row decoder 3303, column decoder 3304, column driver 3305, control logic 3306, bias circuit 3307, neuron output circuit block 3308, input VMM circuit block 3309, algorithm controller 3310, high voltage generator block 3311, analog circuit block 3315, and control logic 3316.

Input circuit block 3309 serves as interface from an external input to the input terminals of the memory array 3301. Input circuit block 3309 can comprise a DAC (Digital-to-Analog Converter), DPC (Digital-to-Pulse Converter), APC (Analog-to-Pulse Converter), IVC (Current-to-Voltage Converter), AAC (Analog-to-Analog Converter such as voltage to voltage scaler), or FAC (Frequency-to-Analog Converter), without limitation. Neuron output block 3308 serves as an interface from the memory array output to an external interface (not shown). Neuron output block 3308 can comprise an ADC (Analog-to-Digital Converter), APC (Analog-to-Pulse Converter), DPC (Digital-to-Pulse Converter), IVC (Current-to-Voltage Converter), or IFC (Current-to-Frequency Converter), without limitation. Neuron output block 3308 may include activation functions, normalization circuitry, and/or re-scaling circuitry, without limitation.

Low voltage row decoder 3302 provides a bias voltage for read and program operations and provides a decoding signal for high voltage row decoder 3303. High voltage row decoder 3303 provides a high voltage bias signal for program and erase operations.

Algorithm controller 3310 provides a controlling function for bit lines during program, verify, and erase operations.

High voltage generator block 3311 comprises charge pump 3312, charge pump regulator 3313, and high voltage generation circuitry 3314 that provides the multiple voltages needed for the various program, erase, program verify, and read operations.

Figure 34:
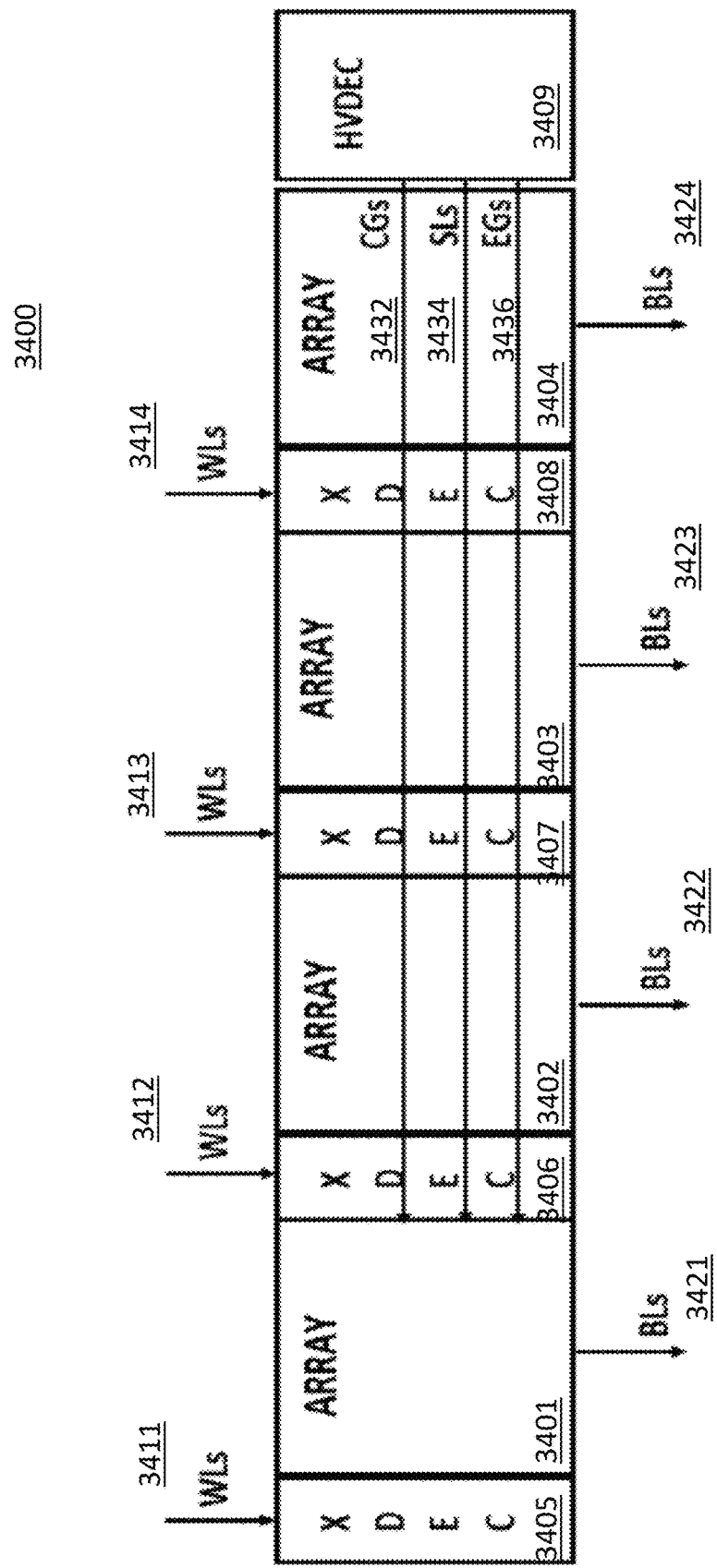
FIG. 34 depicts an exemplary decoding embodiment of a vector-by-matrix multiplication system.

FIG. 34 depicts VMM system 3400, which is particularly suited for use with memory cells of the type depicted in FIG. 4 as memory cell 410. VMM system 3400 comprises VMM arrays 3401, 3402, 3402, and 3404 (each which can be based on any of the VMM array designs discussed previously, such as VMM array 1000, 1100, 1200, 1300, 1400, 1500, 2400, 2500, 2600, 2700, 2800, 2900, 3000 and 31000, or other VMM array designs); low voltage row decoders 3405, 3406, 3407, and 3408; shared high voltage row decoder 3409; word lines or word input lines 3411, 3412, 3413, and 3414; bit lines 3421, 3422, 3423, and 3424; control gate lines 3432, source lines 3434, and erase gate lines 3434. The shared high voltage row decoder 3409 provides the control gate line 3432, source lines 3434, and erase gate lines 3434. In this arrangement, word lines 3411, 3412, 3413, and 3414 and bit lines 3421, 3422, 3423, and 3424 are parallel to one another. In one embodiment the wordlines and bitlines are arranged in the vertical direction. Control gate lines 3432, source line lines 3434, and erase gate lines 3436 are parallel to one another and are arranged in the horizontal direction, and therefore are perpendicular to word lines or word input lines 3411, 3412, 3413, and 3414 and bit lines 3421, 3422, 3423, and 3424.

Figure 35:
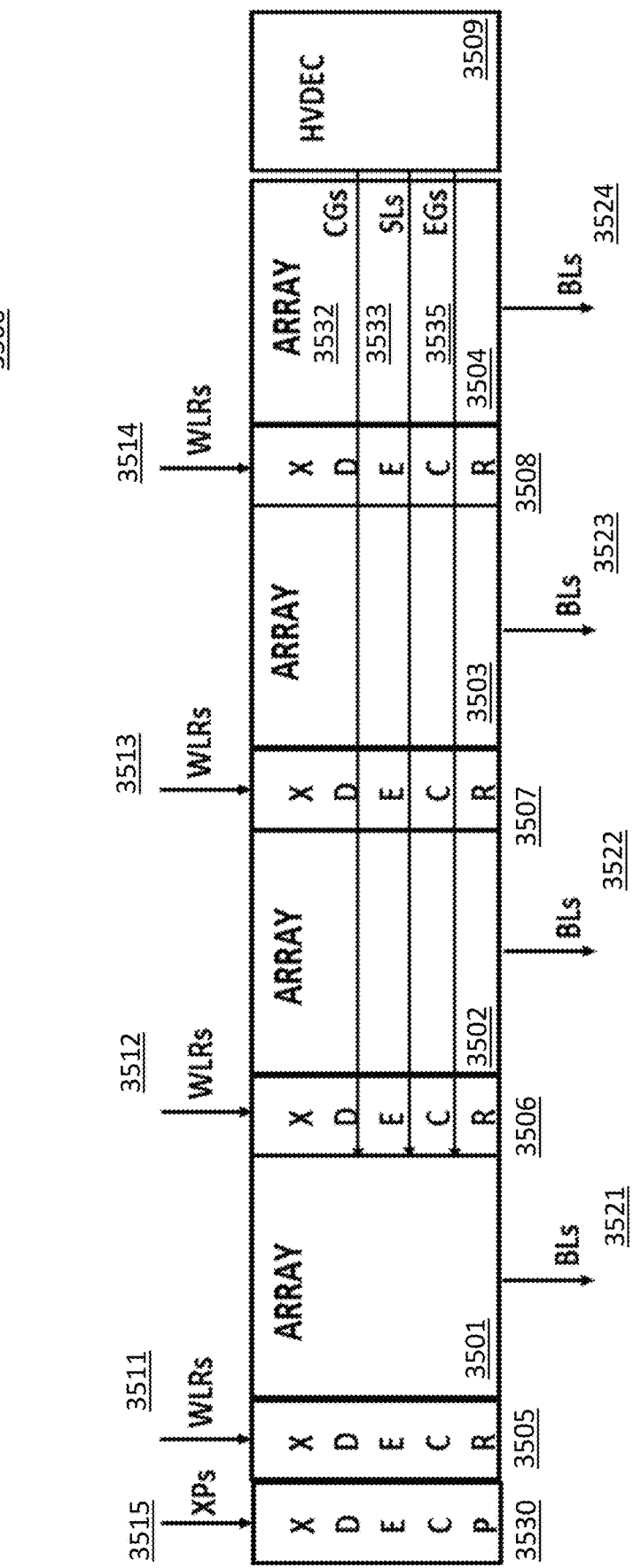
FIG. 35 depicts another exemplary decoding embodiment of a vector-by-matrix multiplication system.

In VMM system 3400, VMM arrays 3401, 3402, 3403, and 3404 share control gate lines 3432, source line lines 3434, erase gate lines 3436, and high voltage row decoder 3409. However, each of the arrays has its own low voltage row decoder, such that low voltage row decoder 3405 is used with VMM array 3401; low voltage row decoder 3406 is used with VMM array 3402; low voltage row decoder 3407 is used with VMM array 3403; and low voltage row decoder 3408 is used with VMM array 3404. Advantageous to this arrangement is the fact that word lines 3411, 3412, 3413, and 3414 are arranged in the vertical direction, such that word lines 3411 can be routed solely to VMM array 3401, word lines 3412 can be routed solely to VMM array 3402, word lines 3413 can be routed solely to VMM array 3403, and word lines 3414 can be routed solely to VMM array 3404. This would be very inefficient using a conventional layout where word lines are arranged in the horizontal direction for multiple VMM arrays sharing the same high voltage decoder and same high voltage decoding lines FIG. 35 depicts VMM system 3500, which is particularly suited for use with memory cells of the type depicted in FIG. 4 as memory cell 410. VMM system 3500 is similar to VMM system 3300 of FIG. 33 except that VMM system 3500 contains separate word lines and low voltage row decoders for read operations and programming operations.

VMM system 3500 comprises VMM arrays 3501, 3502, 3503, and 3504 (each which can be based on any of the VMM design discussed previously, such as VMM array 1000, 1100, 1200, 1300, 1400, 1500, 2400, 2500, 2600, 2700, 2800, 2900, 3000, 3100, and 3200 or other VMM array designs); low voltage read row decoders 3505, 3506, 3507, and 3508; shared low voltage program row decoder 3530; shared high voltage row decoder 3509; read word lines or word input lines 3511, 3512, 3513, and 3514; program pre-decoding row line 3515; bit lines 3521, 3522, 3523, and 3524; control gate lines 3532, source lines 3533, and erase gate lines 3535. The shared high voltage row decoder 3509 provides the control gate lines 3532, source line 3533, and erase gate lines 3535. In this layout, read word lines or word input lines 3511, 3512, 3513, and 3514, program pre-decoding row line 3515, and bit lines 3521, 3522, 3523, and 3524 are parallel to one another and are arranged in the vertical direction. Control gate lines 3532, source lines 3533, and erase gate lines 3535 are parallel to one another and are arranged in the horizontal direction, and therefore are perpendicular to read word lines or word input lines 3511, 3512, 3513, and 3514, program pre-decoding row line 3515, and bit lines 3521, 3522, 3523, and 3524. In this VMM system 3500, the low voltage program row decoder 3530 is shared across multiple VMM arrays.

In VMM system 3500, VMM arrays 3501, 3502, 3503, and 3504 share control gate lines 3532, source lines 3533, erase gate lines 3535, and high voltage row decoder 3509. However, each of the VMM arrays has its own low voltage read row decoder, such that low voltage read row decoder 3505 is used with VMM array 3501; low voltage read row decoder 3506 is used with VMM array 3502; low voltage read row decoder 3507 is used with VMM array 3503; and low voltage read row decoder 3508 is used with VMM array 3504.

Advantageous to this layout is the fact that read word lines or word input lines 3511, 3512, 3513, and 3514 are arranged in the vertical direction, such that word lines 3511 can be routed solely to VMM array 3501, word lines 3512 can be routed solely to VMM array 3502, word lines 3513 can be routed solely to VMM array 3503, and word lines 3514 can be routed solely to VMM array 3504. This would be very inefficient using a conventional layout where word lines are arranged in the horizontal direction for multiple arrays sharing the same high voltage decoder and same high voltage decoding lines. Notably, program pre-decoding row line 3515 can be connected to any of VMM arrays 3501, 3502, 3503, and 3504 through low voltage program row decoder 3530 such that cells in one or more of those VMM arrays can be programmed at a time.

Figure 36:
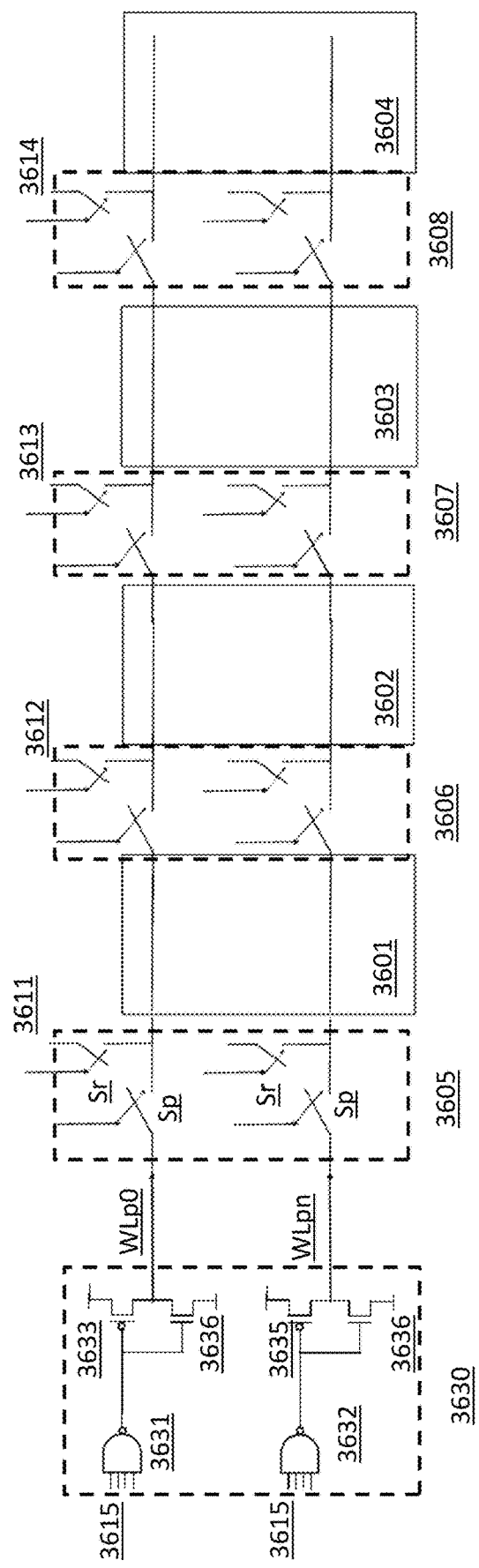
FIG. 36 depicts an exemplary row decoder.

FIG. 36 depicts additional detail regarding certain aspects of VMM system 3500, particularly, detail regarding the low voltage row decoders 3505, 3506, 3507 and 3508, exemplified as low voltage row decoder 3600. Low voltage read row decoder 3600 comprises a plurality of switches, such as the exemplary switches shown, to selectively couple word lines with rows of cells in VMM arrays 3601, 3602, 3603, and 3604, respectively. Low voltage program decoder 3630 comprises exemplary NAND gates 3631 and 3632, PMOS transistors 3633 and 3635 and NMOS transistors 3636 and 3636, configured as shown. NAND gates 3631 and 3632 receive program pre-decoding row lines XPs 3615 as inputs. During program operation, switches Sp (which can be CMOS multiplexors or another type of switch) in the low voltage read row decoders 3605, 3605, 3606, and 3608 are closed, and thus the program wordline Wlp0-n are coupled to the word-lines in the array to apply voltages for programming. During a read operation, read word lines or word input lines 3611, 3612, 3613, and 3614 are selectively coupled to apply voltages to word line terminals of rows within one or more of arrays 3601, 3602, 3603, and 3604 using the Sr switches (being closed) (which can be CMOS multiplexors or another type of switch) within low voltage read row decoders 3605, 3606, 3607, and 3608.

Figure 37:
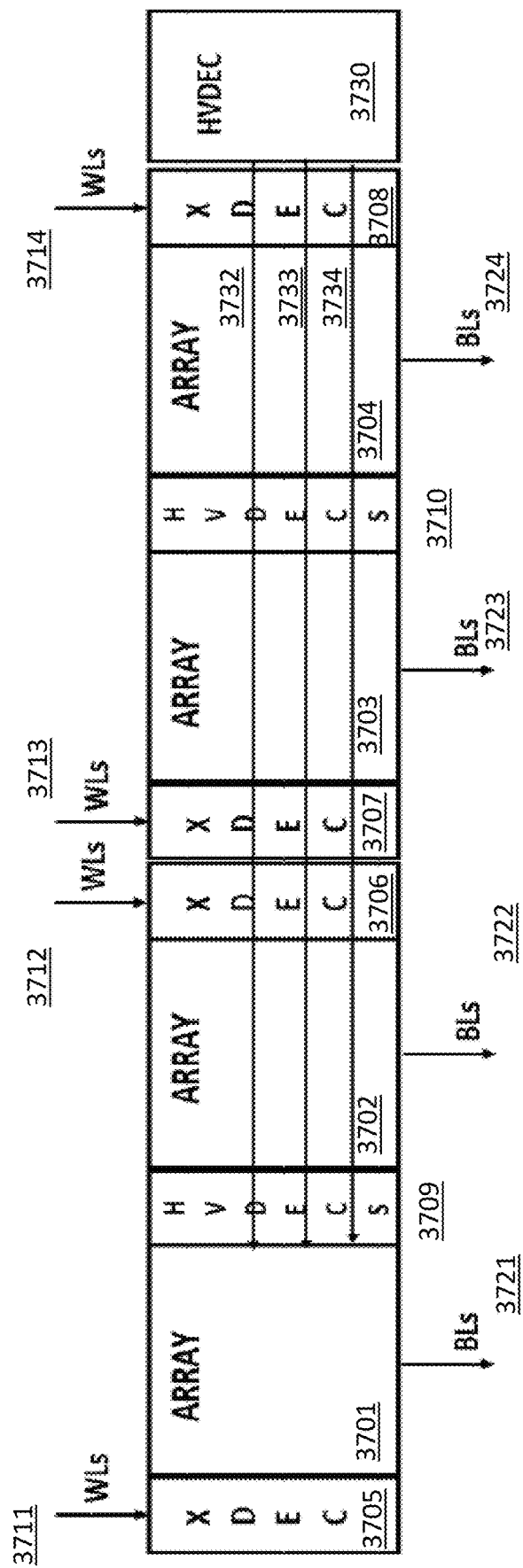
FIG. 37 depicts another exemplary decoding embodiment t of a vector-by-matrix multiplication system.

FIG. 37 depicts VMM system 3700, which is particularly suited for use with memory cells of the type depicted in FIG. 4 as memory cell 410. VMM system 3700 comprises VMM arrays 3701, 3702, 3702, and 3704 (each which can be based on any of the VMM design discussed previously, such as VMM array 1000, 1100, 1200, 1300, 1400, 1500, 2400, 2500, 2600, 2700, 2800, 2900, 3000 and 3100, or other VMM array designs); low voltage row decoders 3705, 3706, 3707, and 3708; local high voltage row decoders 3709 and 3710; global high voltage row decoder 3730; word lines 3711, 3712, 3713, and 3714; bit lines 3721, 3722, 3723, and 3724; high voltage and/or low voltage (HV/LV) pre-decoding lines 3732, source lines 3733, and erase gate lines 3734. The shared global high voltage row decoder 3730 provides the HV/LV pre-decoding lines 3732, source line lines 3733, and erase gate lines 3734. In this layout, word-lines 3711, 3712, 3713, and 3714 and bit lines 3721, 3722, 3723, and 3724 are parallel to one another and are arranged in the vertical direction. HV/LV pre-decoding lines 3732, source line lines 3733, and erase gate lines 3734 are parallel to one another and are arranged in the horizontal direction, and therefore are perpendicular to word lines 3711, 3712, 3713, and 3714 and bit lines 3721, 3722, 3723, and 3724. The HV/LV pre-decoding lines 3732 are input to the local high voltage decoders 3709 and 3710. The local high voltage decoders 3709 outputs the local control gate lines for the VMM array 3701 and 3702. The local high voltage decoders 3710 outputs the local control gate lines for the VMM array 3703 and 3704. In another embodiment, the local high voltage decoders 3709 and 3710 can provide the local source lines for the VMM array 3701/3702 and VMM array 3703/3704 respectively. In another embodiment, the local high voltage decoders 3709 and 3710 can provide the local erase gate lines for the VMM array 3701/3702 and VMM array 3703/3704 respectively.

Here, local high voltage row decoder 3709 is shared by VMM arrays 3701 and 3702 and local high voltage row decoder 3710 is shared by VMM arrays 3703 and 3704. Global high voltage decoder 3730 routes high voltage and low voltage pre-decoding signals to a local high voltage row decoder, such as local high voltage row decoders 3709 and 3710. Thus, the high voltage decoding function is split between global high voltage row decoder 3730 and the local high voltage decoders such as local high voltage decoders 3709 and 3710.

In VMM system 3700, VMM arrays 3701, 3702, 3703, and 3704 share HV/LV pre-decoding lines 3732, source lines 3733, erase gate lines 3734, and global high voltage row decoder 3730. However, each of the VMM arrays has its own low voltage row decoder, such that low voltage row decoder 3705 is used with VMM array 3701; low voltage row decoder 3706 is used with VMM array 3702; low voltage row decoder 3707 is used with VMM array 3703; and low voltage row decoder 3708 is used with VMM array 3704. Advantageous to this layout is the fact that word lines 3711, 3712, 3713, and 3714 are arranged in the vertical direction, such that word lines 3711 can be routed solely to VMM array 3701, word lines 3712 can be routed solely to VMM array 3702, word lines 3713 can be routed solely to VMM array 3703, and word lines 3714 can be routed solely to VMM array 3704. This would be very inefficient using a conventional layout where word lines are arranged in the horizontal direction for multiple arrays sharing a single high voltage decoder.

Figure 38:
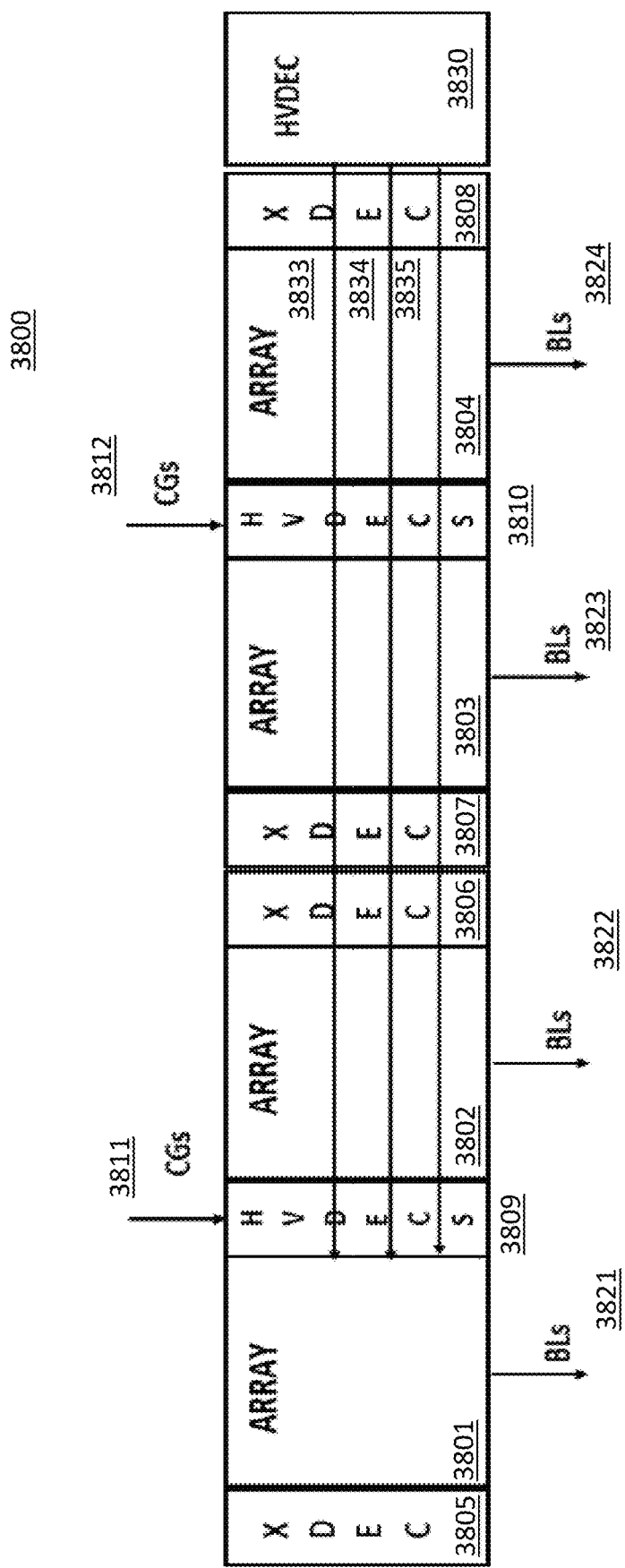
FIG. 38 depicts another exemplary decoding embodiment of a vector-by-matrix multiplication system.

FIG. 38 depicts VMM system 3800, which is particularly suited for use with memory cells of the type depicted in FIG. 4 as memory cell 410. VMM system 3800 comprises VMM arrays 3801, 3802, 3802, and 3804 (each which can be based on any of the VMM design discussed previously, such as VMM array 1000, 1100, 1200, 1300, 1400, 1500, 2400, 2500, 2600, 2700, 2800, 2900, 3000, 3100, and 3200 or other VMM array designs); low voltage row decoders 3805, 3806, 3807, and 3808; local high voltage row decoders 3809 and 3810; global high voltage row decoder 3830; bit lines 3821, 3822, 3823, and 3824; control gate lines or control gate input lines 3811 and 3812, HV/LV pre-decoding lines 3833, source lines 3834, and erase gate lines 3835. The shared global high voltage row decoder 3830 provides the HV/LV pre-decoding line 3833, source line lines 3834, and erase gate lines 3835. The local high voltage decoders 3809 and 3810 couples the control gate input CGs 3811 and 3812 to local control gates of the VMM arrays 3801, 3802 and 3803, 3804 respectively. The low voltage row decoders 3805, 3806, 3807 and 3808 provide local (horizontal) word-lines to the arrays 3801, 3802, 3803, 3804 respectively. In this layout, control gate lines 3811 and 3812 and bit lines 3821, 3822, 3823, and 3824 are parallel to one another and are arranged in the vertical direction. Source lines 3834 and erase gate lines 3835 are parallel to one another and are arranged in the horizontal direction, and therefore are perpendicular to control gate lines 3811 and 3812 and bit lines 3821, 3822, 3823, and 3824.

As in VMM system 3700 of FIG. 37, local high voltage row decoder 3809 is shared by VMM arrays 3801 and 3802 and local high voltage row decoder 3810 is shared by VMM arrays 3803 and 3804. Global high voltage decoder 3830 routes signals to a local high voltage row decoder, such as local high voltage row decoders 3809 and 3810. Thus, the high voltage decoding function is split between global high voltage row decoder 3830 and the local high voltage decoders such as local high voltage decoders 3809 and 3810 (that can provide local source line lines and/or local erase gate lines).

In VMM system 3800, VMM arrays 3801, 3802, 3803, and 3804 share HV/LV pre-decoding lines 3833, source line lines 3834, erase gate lines 3835, and global high voltage row decoder 3830. However, each of the VMM arrays has its own low voltage row decoder, such that low voltage row decoder 3805 is used with VMM array 3801; low voltage row decoder 3806 is used with VMM array 3802; low voltage row decoder 3807 is used with VMM array 3803; and low voltage row decoder 3808 is used with VMM array 3804. Advantageous to this layout is the fact that control gate lines 3811 and 3812, which may be read lines or input lines, are arranged in the vertical direction, such that control gate lines 3811 can be routed solely to VMM arrays 3801 and 3802 and control gate lines 3812 can be routed solely to VMM arrays 3803 and 3804. This would not be possible using a conventional layout where word lines are arranged in the horizontal direction.

Figure 39:
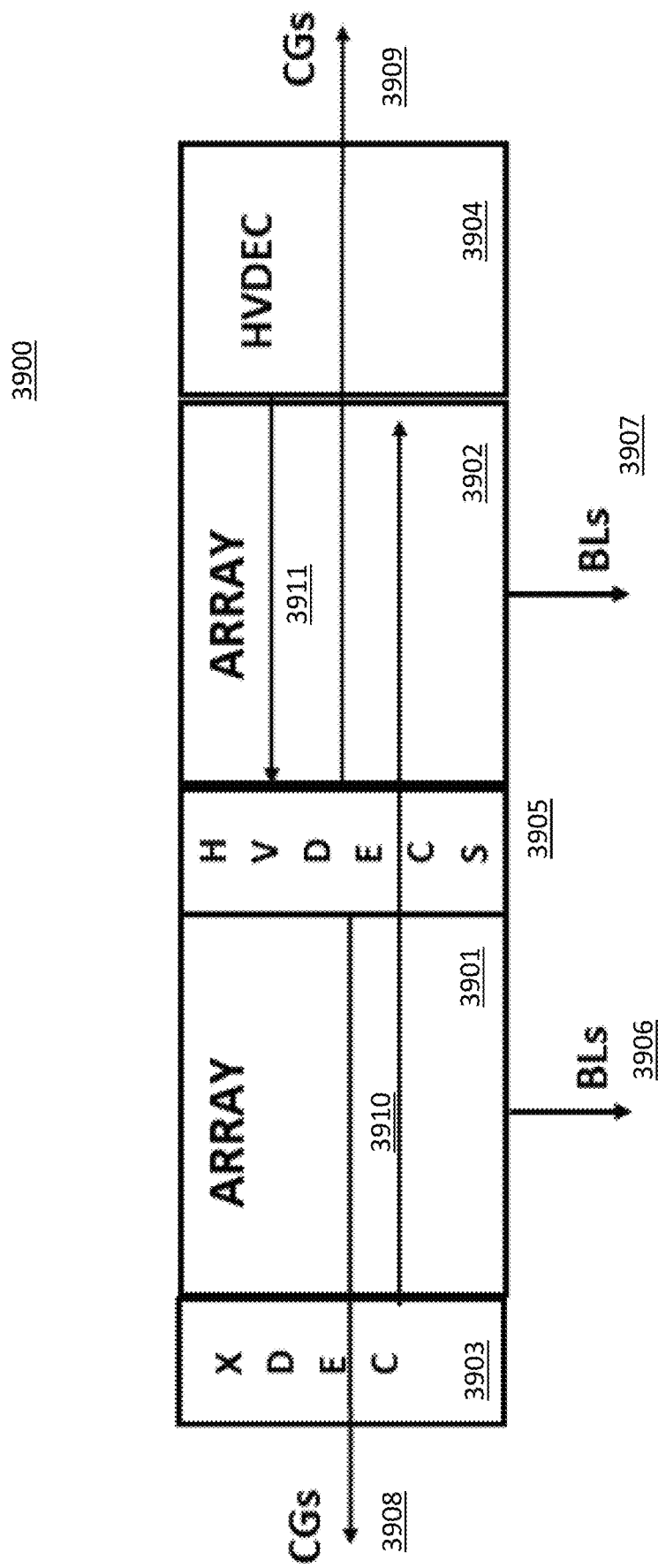
FIG. 39 depicts another exemplary decoding embodiment of a vector-by-matrix multiplication system.

FIG. 39 depicts VMM system 3900, which is particularly suited for use with memory cells of the type depicted in FIG. 3 as memory cell 310, FIG. 4 as memory cell 410, FIG. 5 as memory cell 510, or FIG. 7 as memory cell 710. VMM system 3900 comprises VMM arrays 3901 and 3902 (each which can be based on any of the VMM design discussed previously, such as VMM array 1000, 1100, 1200, 1300, 1400, 1500, 2400, 2500, 2600, 2700, 2800, 2900, 3000, 3100, and 3200 or other VMM array designs); low voltage row decoders 3903 (used with arrays 3901 and 3902); local high voltage row decoder 3905, global high voltage row decoder 3904; control gate lines 3908 and 3909; and bit lines 3906 and 3907. In this layout, control gate lines 3908 are used solely by VMM array 3901, and control gate lines 3909 are used solely by VMM array 3902. Low voltage row decoding line 3910 is used as decoding input to the global high voltage row decoder 3904. Global high voltage row decoding line 3911 is used as decoding input to the local high voltage decoder 3905.

Local high voltage row decoder 3905 is shared by VMM arrays 3901 and 3902. Global high voltage decoder 3904 routes signals to a local high voltage row decoder of multiple VMM systems, such as local high voltage row decoder 3905 of VMM system 3900. Thus, the high voltage decoding function is split between global high voltage row decoder 3904 and the local high voltage decoders such as local high voltage decoder 3905 as described above.

In VMM system 3900, VMM arrays 3901 and 3902 share word lines (not shown), source gate lines if present (not shown), erase gate lines if present (not shown), and global high voltage row decoder 3904. Here, VMM arrays 3901 and 3902 share low voltage row decoder 3903. Advantageous to this layout is the fact that VMM arrays 3901 and 3902 do not share control gate lines, which enable each array to be independently accessed using control gate lines 3908 and 3909, respectively.

Figure 51:
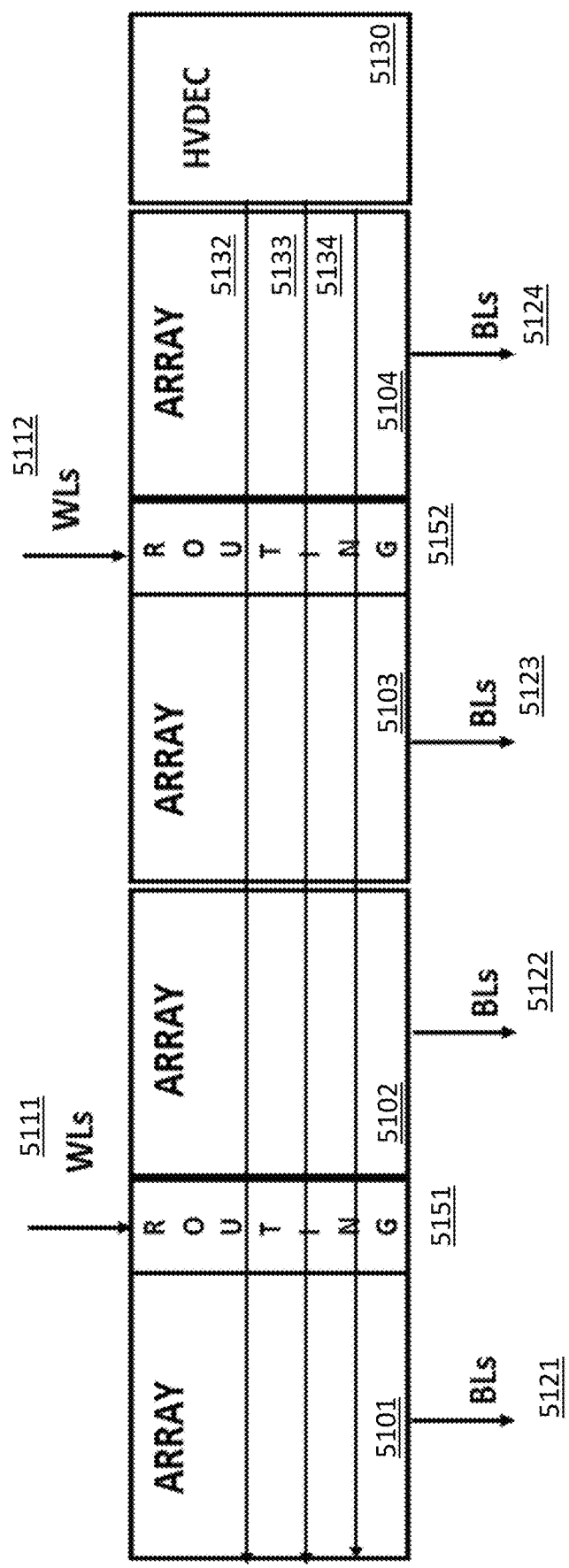
FIG. 51 depicts another exemplary decoding embodiment of a vector-by-matrix multiplication system.

FIG. 51 depicts VMM system 5100, which is particularly suited for use with memory cells of the type depicted in FIG. 4 as memory cell 410. VMM system 5100 comprises VMM arrays 5101, 5102, 5103, and 5104 (each which can be based on any of the VMM array designs discussed previously, such as VMM array 1000, 1100, 1200, 1300, 1400, 1510, 2400, 2510, 2600, 2700, 2800, 2900, 3000, 3100, and 3200 or other VMM array designs); high voltage decoder 5130; routing blocks 5151 and 5152; input word lines 5111 and 5112, bit lines 5121, 5122, 5123, and 5124; control gate lines 5132, source lines 5133, and erase gate lines 5134. The high voltage decoder 5130 provides control gate lines 5132, source lines 5133, and erase gate lines 5134. The routing blocks 5151, 5152 is where the input wordlines 5111 and 5112, respectively, which are received vertically, are routed to horizontal-running wordlines of VMM arrays 5101-5104. Alternatively, the routing blocks 5151, 5152 may route the control gate input lines 5132 which are received vertically to horizontal-running control gate lines 5132 of the VMM arrays.

Figure 40:
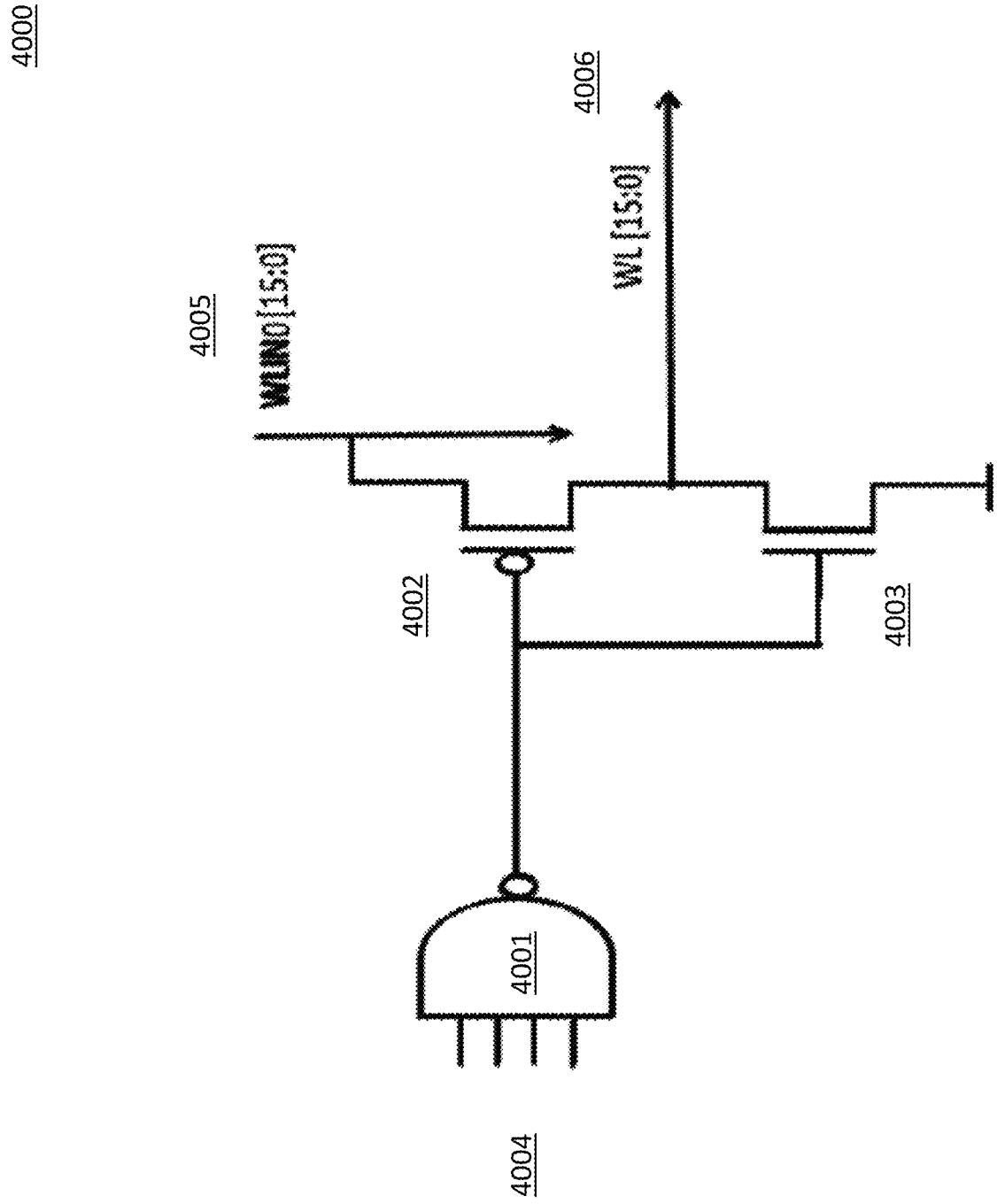
FIG. 40 depicts an embodiment of a low voltage row decoder.

FIG. 40 depicts low voltage row decoder 4000, which comprises NAND gate 4001, PMOS transistor 4002, and NMOS transistor 4003. NAND gate 4001 receives row address signals 4004. PMOS transistor 4002 is coupled to vertical wordline inputs 4005. The output is on horizontal word lines 4006, which is one of many word lines, which couple to respective VMM arrays. In this example, there are 16 word lines total, and there will therefore be 16 instantiations of row decoder 4000, each outputting one of the 16 word lines. Thus, based on the received row address signal, one word line, such as word line 4006, will output a respective signal, such as a voltage, and the other word lines will be set to ground.

Figure 41:
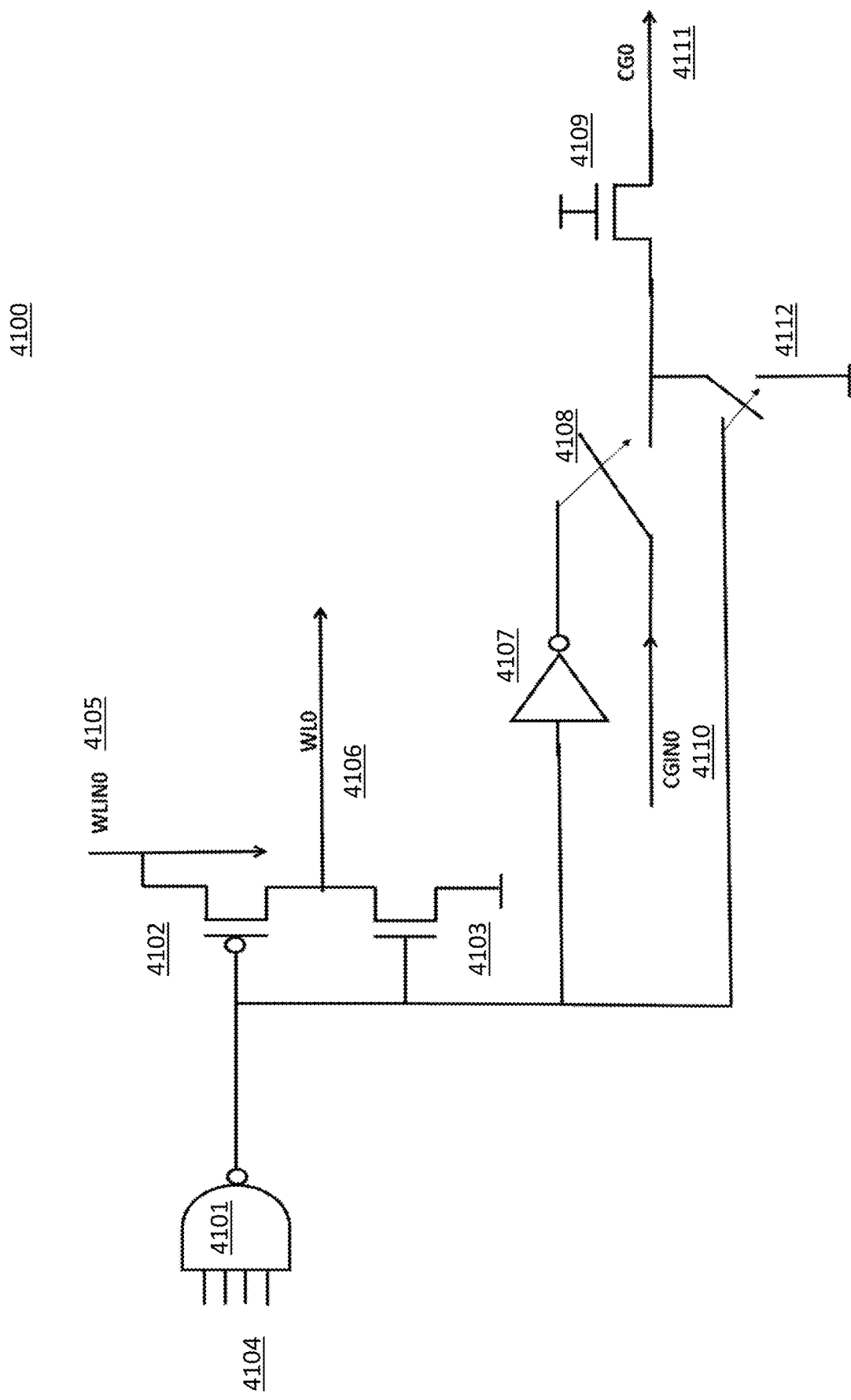
FIG. 41 depicts an embodiment of a combined low voltage row decoder and control gate decoder.

FIG. 41 depicts combined co-select/deselect word line and control gate decoder 4100, which comprises a low voltage row decoder as in FIG. 40, here comprising NAND gate 4101, PMOS transistor 4102, NMOS transistor 4103, row address signals 4104, vertical input wordline lines 4105, and horizontal word output line 4106 which couples to wordlines of VMM arrays. Combined word line and control gate decoder 4100 further comprises inverter 4107, switches 4108 and 4112, and isolation transistor 4109, and receives control gate input 4110 CGIN0 and outputs control gate line 4111 CG0. The wordline output 4106 WL0 and control gate output CG0 4111 are selected or de-selected at the same times by decoding logic (not shown) controlling NAND gate 4101.

Figure 42:
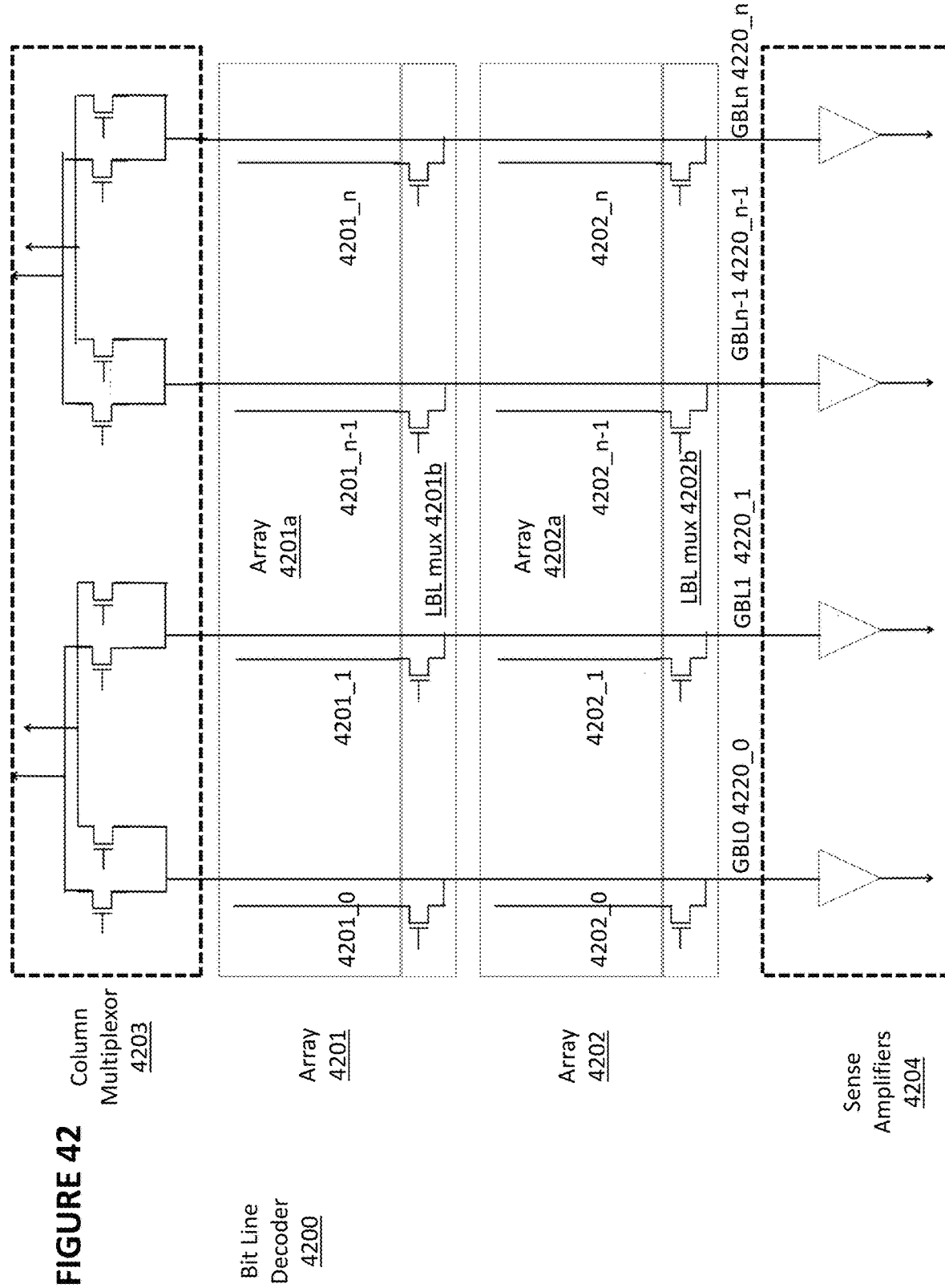
FIG. 42 depicts an embodiment of a bit line decoder.

FIG. 42 depicts bit line decoder 4200, which operates on VMM arrays 4201 and 4202. Bit line decoder 4200 comprises column multiplexor 4203 (for selecting one or more bit lines for program and verify, where a verify operation is used to confirm the cell current reaches a certain target during a tuning operation (program or erase operation), and sense amplifiers 4204 (for performing a read operation on one or more bit lines). As shown, local bitline mux 4201b and 4202b muxes local array bitlines to global bitlines 4220x to be coupled to the column multiplexor 4203. The sense amplifier comprises an ADC or other device. Thus, the bit line decoder 4200 is shared across multiple arrays.

Figure 43:
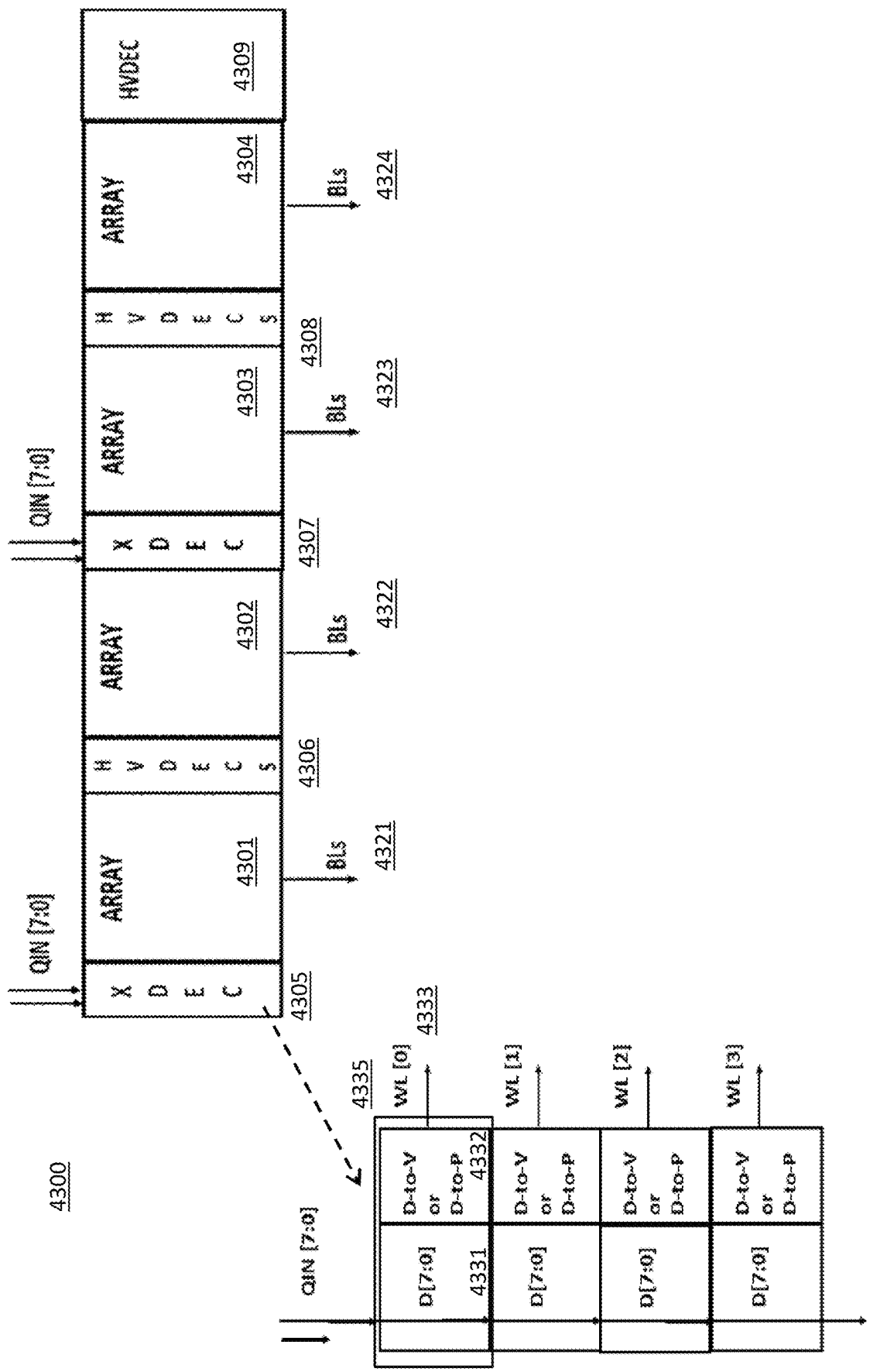
FIG. 43 depicts a vector-by-matrix multiplication system and an input block.

FIG. 43 depicts VMM system 4300, which comprises VMM arrays 4301, 4302, 4303, and 4304; low voltage row decoders 4305 and 4307; local high voltage row decoders 4306 and 4308, global high voltage row decoder 4309, digital bus inputs QIN[7:0] 4311 and 4312 (which here are inputs to a VMM array), and bit lines 4321, 4322, 4323, and 4324. Each low voltage row decoder, such as low voltage row decoder 4305, comprises a circuit block row decoder 4335 for each word line, such as exemplary data input block 4331 (which might consist of 8 latches or registers) and block 4332 (which might comprise data-to-voltage converter circuits or data-to-pulse converter circuits), which outputs signal 4333 on a word line. Thus, the input to this low voltage row decoder is a digital bus QIN [7:0] with appropriate control logic. For each circuit block row decoder 4335, the digital input QIN [7:0] 4311 and 4312 are latched appropriately such as by synchronous clocking means and method (such as by a serial to parallel clocking interface).

Figure 44:
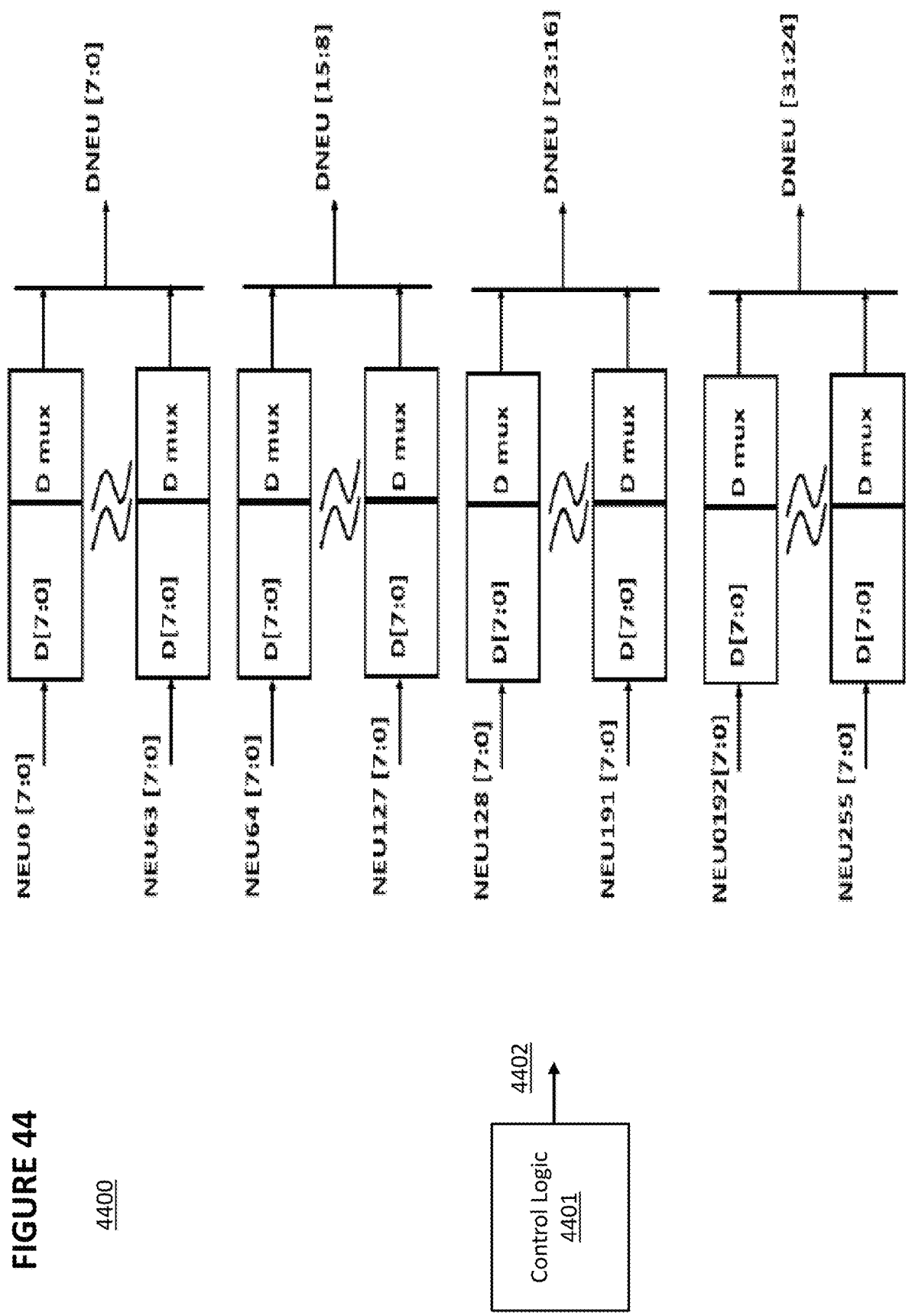
FIG. 44 depicts a multiplexor for receiving outputs from an array and providing inputs in multiplexed fashion to one or more arrays.

FIG. 44 depicts a neural network array input-output bus multiplexor 4400, which receives outputs from a VMM array (such as from an ADC) and provides those outputs in groups in multiplexed fashion to the input blocks of other VMM arrays (such as DAC or DPC). In the example shown, the inputs to input-output bus multiplexor 4400 comprise 2048 bits (256 sets, NEU0 . . . NEU255, of 8 bits each) and input-output bus multiplexor 4400 provides those bits in 64 different groups of 32 bits per group, where it multiplexes between the different groups, such as by using time-division multiplexing (where it provides 1 group of 32 bits at any given time). Control logic 4401 generates control signals 4402 to controls input-output bus multiplexor 4400.

Figure 45B:
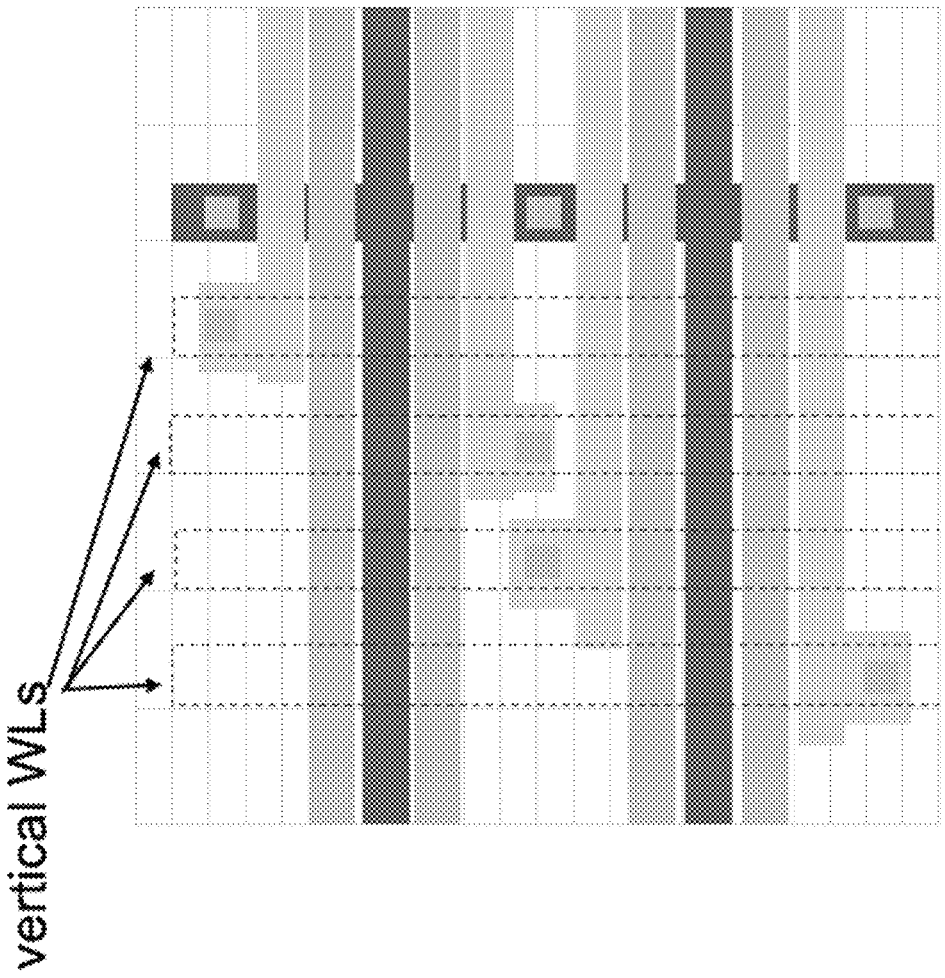
FIGS. 45A and 45B depict exemplary layouts of a vector-by-matrix multiplication system.
Figure 45A:
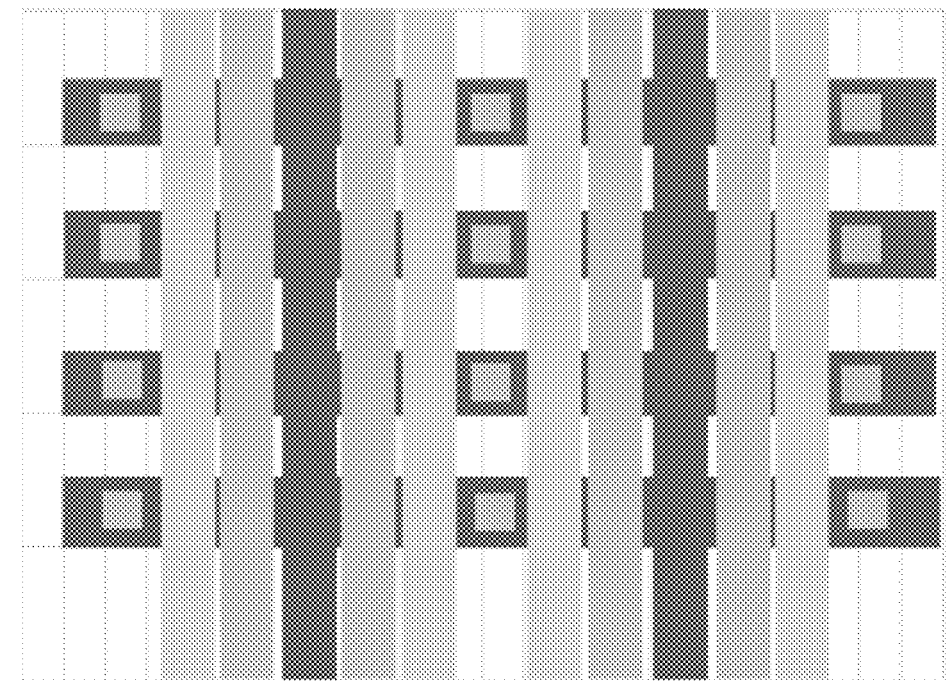

FIGS. 45A and 45B depict exemplary layouts of VMM arrays where the word lines are laid out in a horizontal manner (FIG. 45A) versus in a vertical manner (FIG. 45B, such as in FIG. 34 or 35).

Figure 46:
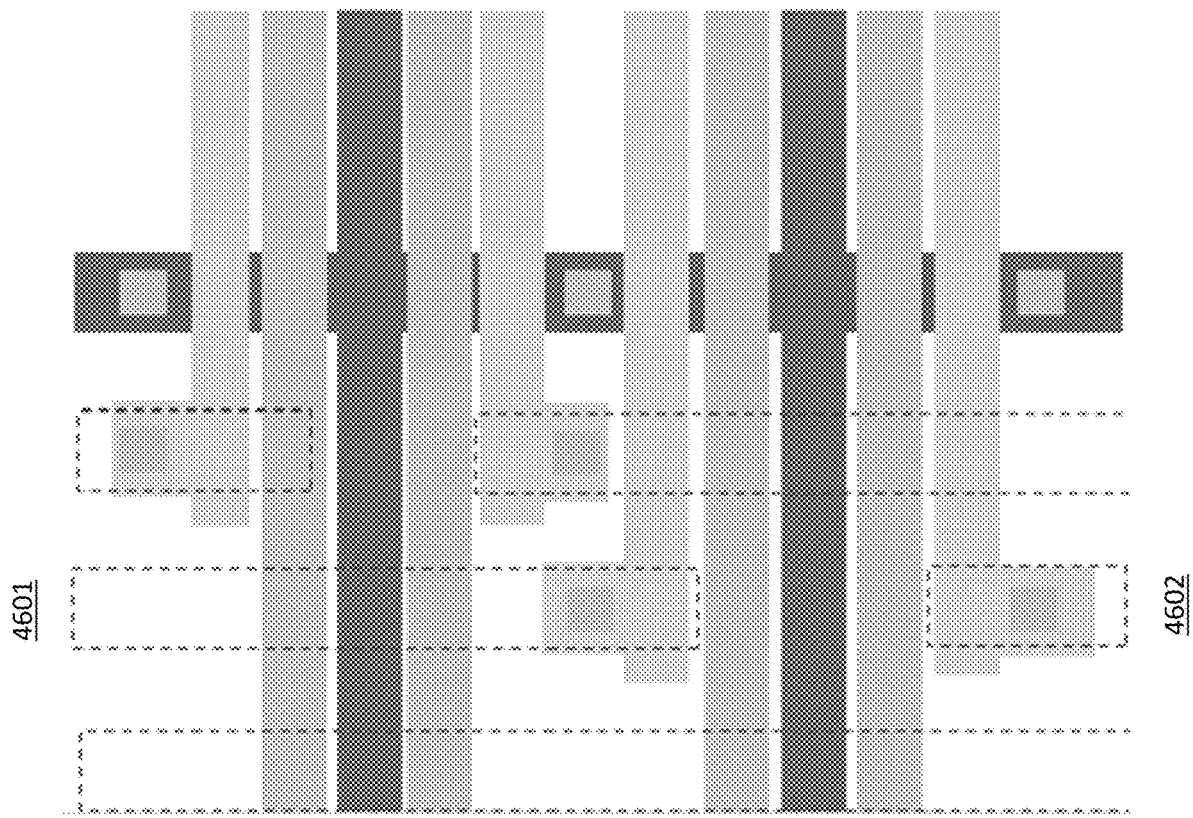
FIG. 46 depicts an exemplary layout of a vector-by-matrix multiplication system.

FIG. 46 depicts an exemplary layout of VMM array where the word lines are laid out in a vertical manner (such as in FIG. 34 or 35). However, in this layout, two word lines (such as word lines 4601 and 4602) can occupy the same column, but access different rows in the array (due to the gap between them).

Figure 47:
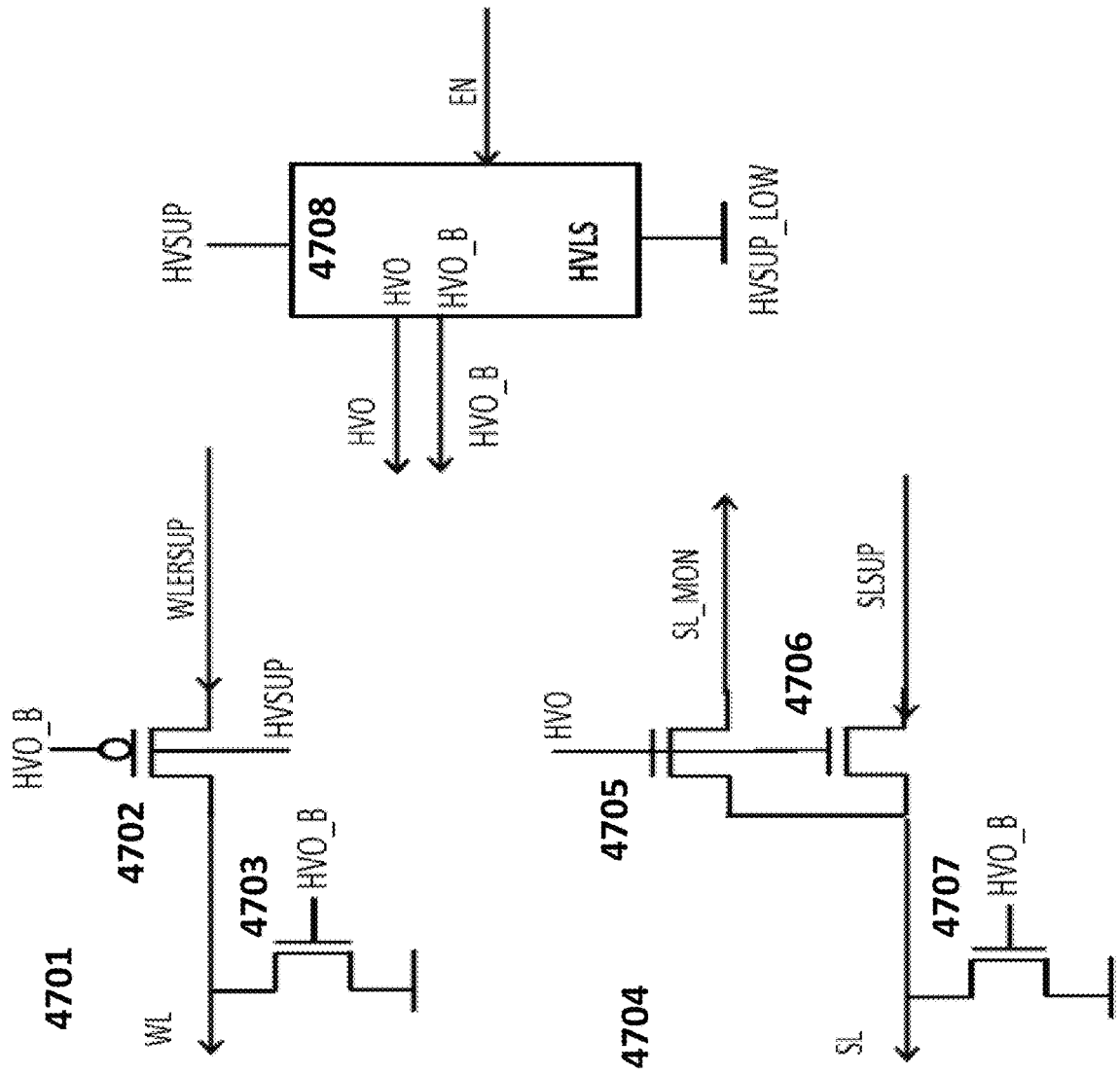
FIG. 47 depicts a word line decoder circuit, a source line decoder circuit, and a high voltage level shifter for use with a vector multiplier matrix.

FIG. 47 depicts WM high voltage decode circuits, comprising word line decoder circuit 4701, source line decoder circuit 4704, and high voltage level shifter 4708, which are appropriate for use with memory cells of the type shown in FIG. 2.

Word line decoder circuit 4701 comprises PMOS select transistor 4702 (controlled by signal HVO_B) and NMOS de-select transistor 4703 (controlled by signal HVO_B) configured as shown.

Source line decoder circuit 4704 comprises NMOS monitor transistors 4705 (controlled by signal HVO), driving transistor 4706 (controlled by signal HVO), and de-select transistor 4707 (controlled by signal HVO_B), configured as shown.

High voltage level shifter 4708 receives enable signal EN and outputs high voltage signal HV and its complement HVO_B.

Figure 48:
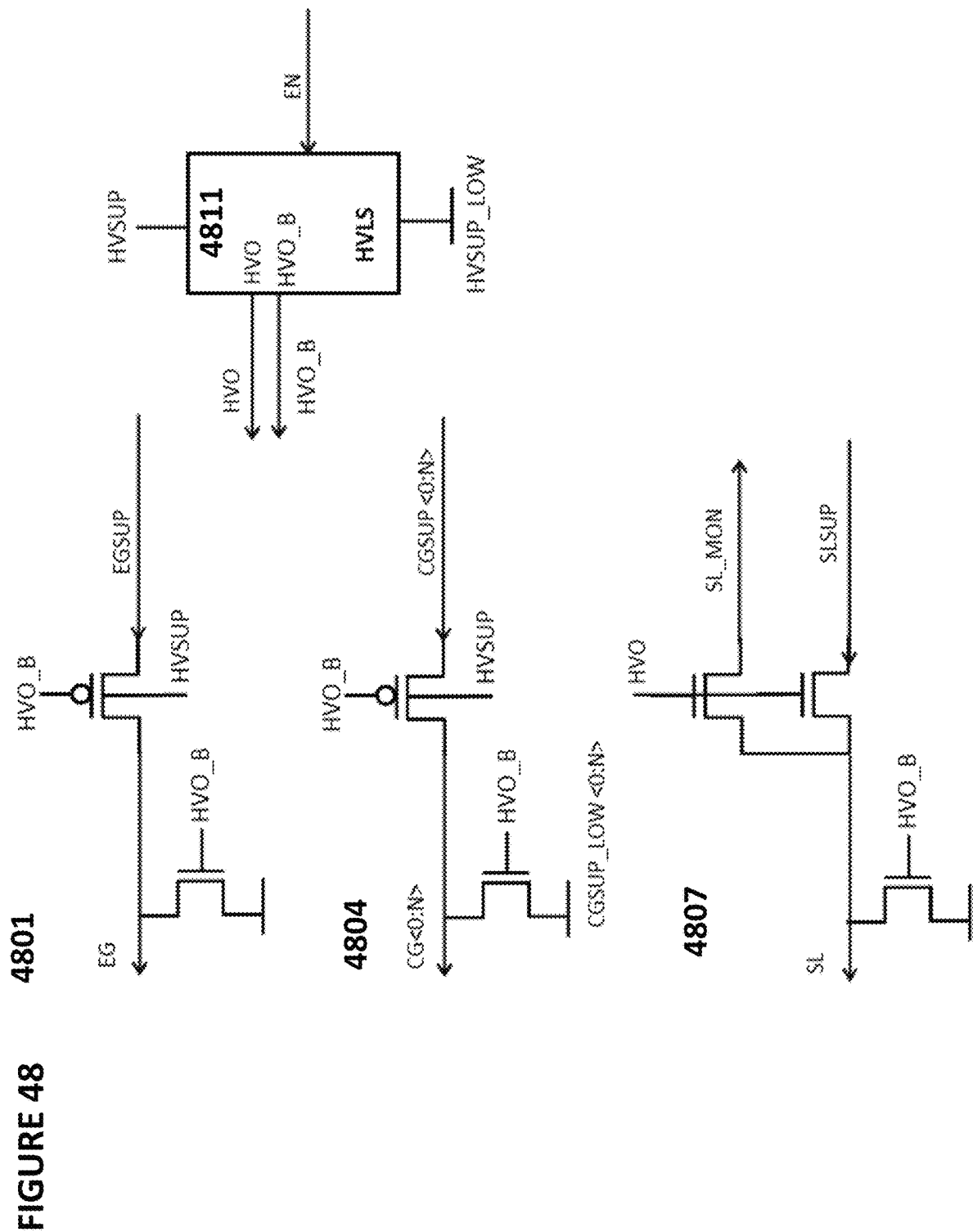
FIG. 48 depicts an erase gate decoder circuit, a control gate decoder circuit, a source line decoder circuit, and a high voltage level shifter for use with a vector multiplier matrix.

FIG. 48 depicts VMM high voltage decode circuits, comprising erase gate decoder circuit 4801, control gate decoder circuit 4804, source line decoder circuit 4807, and high voltage level shifter 4811, which are appropriate for use with memory cells of the type shown in FIG. 3.

Erase gate decoder circuit 4801 and control gate decoder circuit 4804 use the same design as word line decoder circuit 4701 in FIG. 47.

Source line decoder circuit 4807 uses the same design as source line decoder circuit 4704 in FIG. 47.

High voltage level shifter 4811 uses the same design as high voltage level shifter 4708 in FIG. 47.

Figure 49:
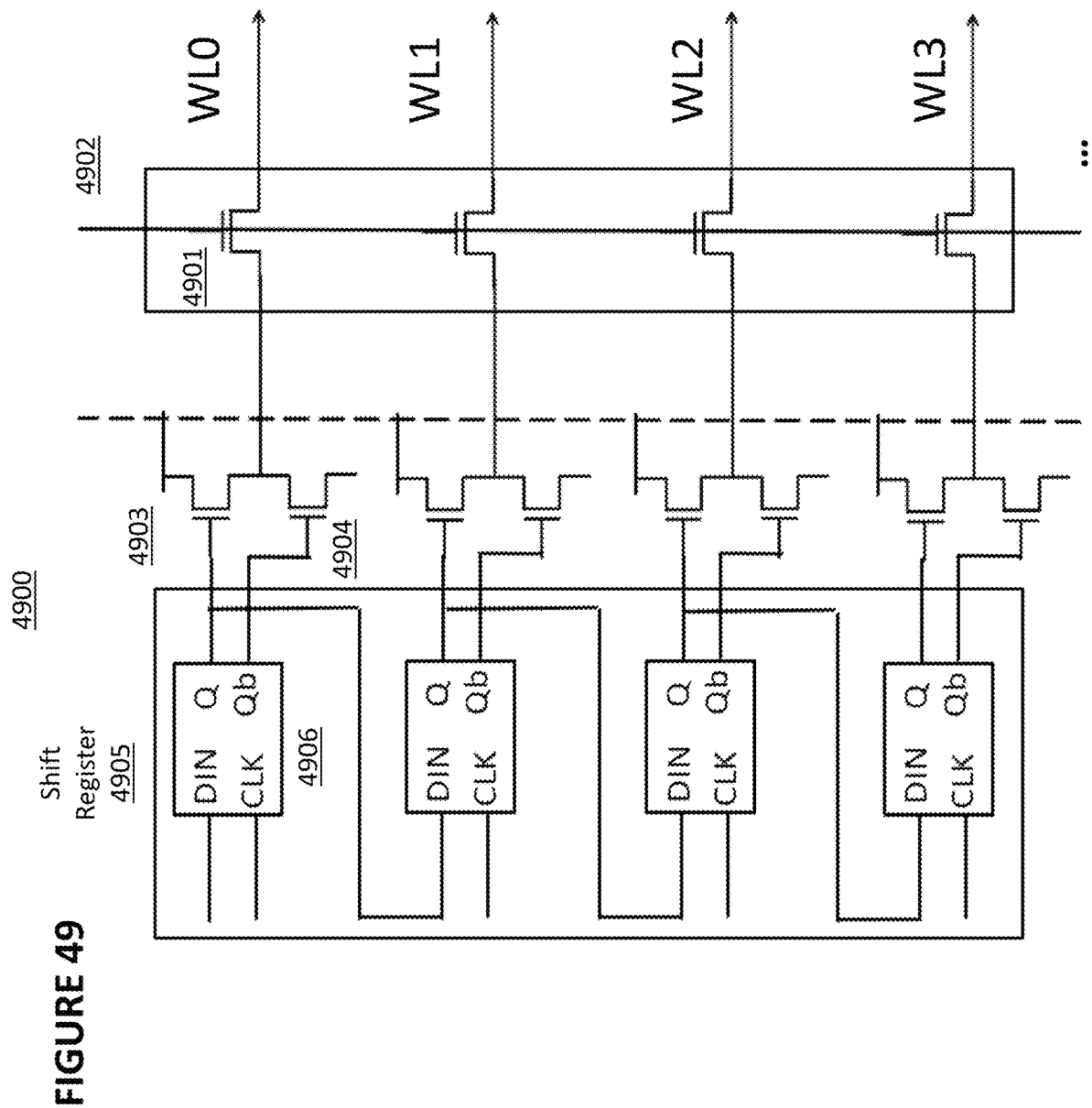
FIG. 49 depicts another embodiment of a word line driver for use with a vector multiplier matrix.

FIG. 49 depicts word line driver 4900. Word line driver 4900 selects a word line (such as exemplary word lines WL0, WL1, WL2, and WL3 shown here) and provides a bias voltage to that word line. Each word line is attached to a select isolation transistor, such as select transistor 4901, that is controlled by control line 4902. The select transistors, such as select transistor 4901, isolate the high voltage used during an erase operation (e.g., 8-12V) from word line decoding transistors, which can be implemented with TO transistors that operate at a low voltage (e.g., 1.8V, 3.3V). Here, during any operation, control line 4902 is activated and all select transistors similar to select transistor 4901 are turned on. Exemplary bias transistor 4903 (part of a wordline decoding circuit) selectively couples a word line to a first bias voltage (such as 3V) and exemplary bias transistor 4904 (part of the wordline decoding circuit) selectively couples a word line to a second bias voltage (lower than the first bias voltage, including ground, a bias in between ground and the first bias voltage, or a negative voltage bias to reduce leakage from un-used memory rows). During an ANN (analog neural network) read operation, all used word lines will be selected and tied to the first bias voltage. All un-used wordlines are tied to the second bias voltage. During other operations such as program operation, only one word line will be selected and the other word lines will be tied to the second bias voltage, which can be a negative bias (e.g., −0.3 to −0.5V or more) to reduce array leakage.

Bias transistors 4903 and 4904 are coupled to the outputs of stage 4906 of shift register 4905. Shift register 4905 enables each row to be controlled independently, in accordance with the input data pattern (which is loaded in the beginning of an ANN operation)

Figure 50:
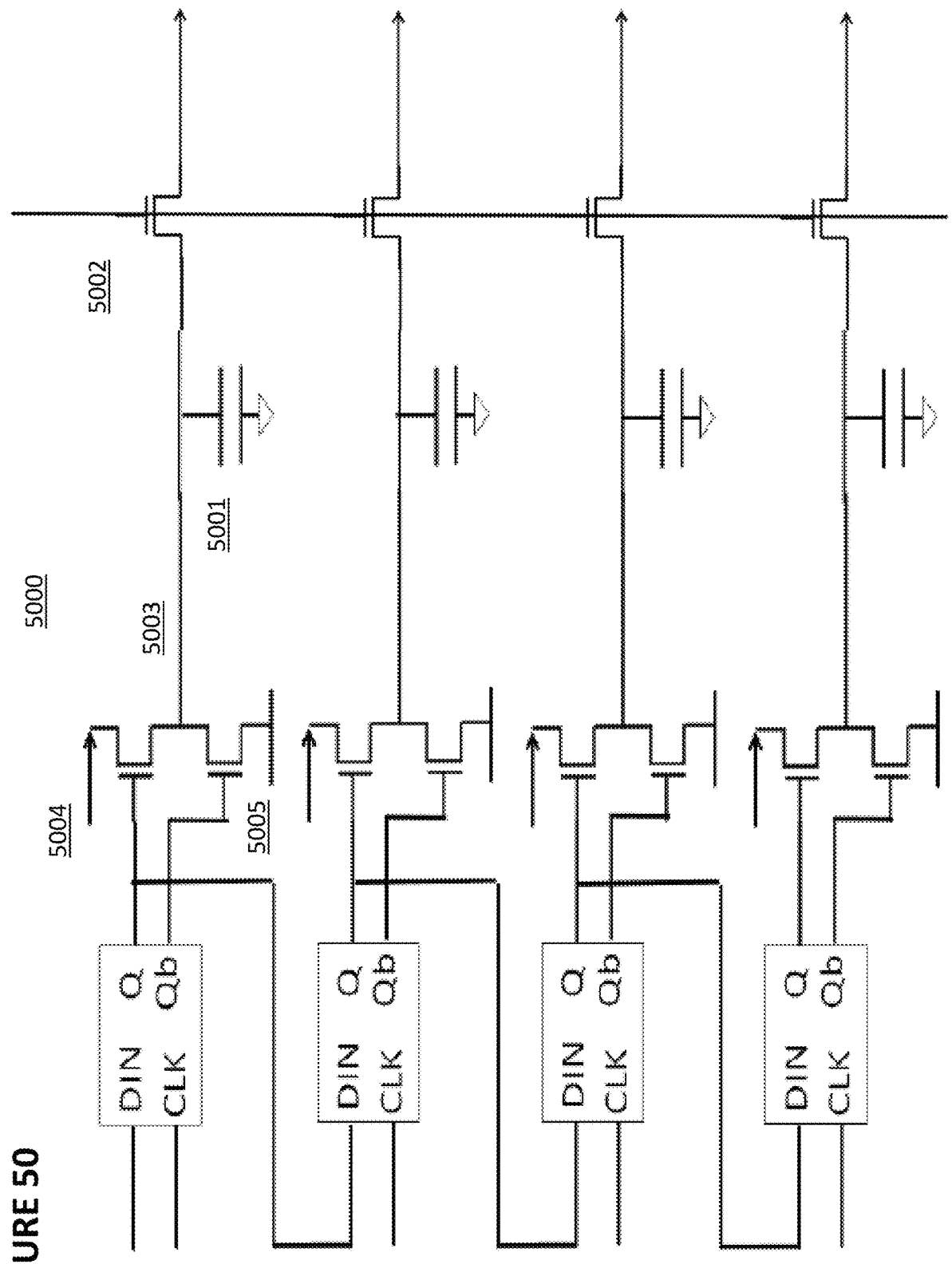
FIG. 50 depicts another embodiment of a word line driver for use with a vector multiplier matrix.

FIG. 50 depicts word line driver 5000. Word line driver 5000 is similar to word line driver 4900, except that each select transistor is further coupled to a capacitor, such as capacitor 5001. Capacitor 5001 can provide a pre-charge or bias to the word line at the beginning of an operation, enabled by transistor 5002 to sample the voltage on line 5003. Capacitor 5001 acts to sample and hold (S/H) the input voltage for each wordline. Transistors 5004 and 5005 are off during the ANN operation (array current summer and activation function) of the VMM array, meaning that the voltage on the S/H capacitor 5001 will serve as a (floating)

voltage source for the respective wordline. Alternatively, capacitor 5001 can be provided by the word line (or as a control gate capacitance if the input is on a control gate) capacitance from the VMM array.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A system comprising:
   a plurality of vector-by-matrix multiplication arrays in an analog neural memory system, respective ones of the plurality of vector-by-matrix multiplication comprising an array of non-volatile memory cells organized into rows and columns, wherein the plurality of vector-by-matrix multiplication arrays share control gate lines and source lines;
   a shared high voltage row decoder coupled to the control gate lines and the source lines of the plurality of vector-by-matrix multiplication arrays to apply a first set of voltages to control gate terminals, source line terminals, and erase gate terminals of one or more selected rows in the plurality of vector-by-matrix multiplication arrays during a program operation;
   a plurality of read row decoders, each read row decoder coupled to read word lines and word line terminals of one of the arrays in the plurality of vector-by-matrix multiplication arrays but not the other arrays in the plurality of vector-by-matrix multiplication arrays to apply a second voltage lower than each of the first set of voltages to word line terminals of one or more selected rows in the one of the arrays during a read operation; and
   a shared program row decoder coupled to all of the arrays in the plurality of vector-by-matrix multiplication arrays to apply a third voltage lower than each of the first set of voltages to word line terminals of one or more selected rows in one or more of the vector-by-matrix multiplication arrays during a program operation;
   wherein the read word lines are perpendicular to the control gate lines and the source lines.

2. The system of claim 1, wherein the non-volatile memory cells are split-gate flash memory cells.

3. The system of claim 1, wherein the non-volatile memory cells are stacked-gate flash memory cells.

4. A method comprising:
   applying, by a shared program row decoder coupled to a plurality of vector-by-matrix multiplication arrays of non-volatile memory cells that share control gate lines, erase gate lines, and source lines, a first voltage during a program operation to word lines coupled to one or more selected rows in one or more of the plurality of vector-by-matrix multiplication arrays;
   applying, by a shared high voltage row decoder to the control gate lines, erase gate lines, and source lines of the plurality of vector-by-matrix multiplication arrays of non-volatile memory cells, a set of voltages during a program operation to one or more selected rows in one or more of the plurality of vector-by-matrix multiplication arrays; and
   applying, by a read row decoder, a second voltage received from read word lines to word lines coupled to one or more selected rows of non-volatile memory cells in one of the arrays in the plurality of vector-by-matrix multiplication arrays but not the other arrays in the plurality of vector-by-matrix multiplication arrays during a read operation;
   wherein the read word lines are perpendicular to the control gate lines and the source lines; and
   wherein each voltage in the set of voltages is larger than the first voltage and the second voltage.

5. The method of claim 4, wherein the non-volatile memory cells are split-gate flash memory cells.

6. The method of claim 4, wherein the non-volatile memory cells are stacked-gate flash memory cells.

* * * * *